(12) United States Patent
Mitani et al.

(10) Patent No.: US 6,897,744 B2
(45) Date of Patent: *May 24, 2005

(54) LONGITUDINALLY-COUPLED MULTI-MODE PIEZOELECTRIC BULK WAVE FILTER AND ELECTRONIC COMPONENT

(75) Inventors: Akihiro Mitani, Toyama-ken (JP); Toshio Nishimura, Shiga-ken (JP); Hiroaki Kaida, Moriyama (JP); Jiro Inoue, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 150 days.

This patent is subject to a terminal disclaimer.

(21) Appl. No.: 10/436,066

(22) Filed: May 13, 2003

(65) Prior Publication Data

US 2003/0218520 A1 Nov. 27, 2003

(30) Foreign Application Priority Data

| May 21, 2002 | (JP) | ................................. 2002-146478 |
| May 24, 2002 | (JP) | ................................. 2002-150814 |
| May 24, 2002 | (JP) | ................................. 2002-150815 |

(51) Int. Cl.[7] ........................ H03H 9/58; H01L 41/107
(52) U.S. Cl. ...................... 333/189; 333/191; 310/328; 310/366
(58) Field of Search ............................. 333/189, 191, 333/186, 361, 365, 366; 310/366, 328

(56) References Cited

U.S. PATENT DOCUMENTS 5,608,362 A * 3/1997 Nishimura et al. ......... 333/191
5,757,106 A * 5/1998 Sato et al. .................. 310/359
6,201,337 B1 * 3/2001 Kaida et al. ................ 310/321
6,784,763 B2 * 8/2004 Nishimura et al. ......... 333/189

FOREIGN PATENT DOCUMENTS

JP          AA 5-327401          12/1993

* cited by examiner

*Primary Examiner*—Dinh T. Le
(74) *Attorney, Agent, or Firm*—Keating & Bennett

(57) ABSTRACT

A longitudinally-coupled multi-mode piezoelectric bulk wave filter using the piezoelectric longitudinal effect includes a plurality of excitation electrodes extending substantially parallel to each other, a laminated piezoelectric body including a plurality of piezoelectric layers arranged between the excitation electrodes and polarized in a predetermined direction, an input electrode and output electrode disposed on a first side surface of the laminated piezoelectric body, and a ground electrode disposed on a second side surface of the laminated piezoelectric body. When an input signal is applied between the input electrode and the ground electrode, vibration modes of different orders of harmonic waves are excited and coupled so that an output signal is output between the output terminal and the ground terminal. Let T represent the dimension of the width between the opposed first and second side surfaces of the laminated piezoelectric body and D represent the distance between the adjacent excitation electrodes, and T/D is equal to or smaller than about 0.9. As a result, a longitudinally-coupled multi-mode piezoelectric bulk wave filter presenting a large out-of-band attenuation is provided.

20 Claims, 47 Drawing Sheets

LONGITUDINALLY-COUPLED MULTI-MODE PIEZOELECTRIC BULK WAVE FILTER AND ELECTRONIC COMPONENT

BACKGROUND OF THE INVENTION

1. Field of the Invention

The present invention relates to a piezoelectric bulk wave filter known as a bandpass filter, for example. More specifically, the present invention relates to a longitudinally-coupled multi-mode piezoelectric bulk wave filter, and an electronic component including such a piezoelectric bulk wave filter using vibrations of different orders based on the piezoelectric longitudinal effect.

2. Description of the Related Art

A variety of piezoelectric bulk wave filters are used as band filters. Dual-mode piezoelectric bulk wave filters are mainly used within a frequency range of several MHz to tens of MHz, because of the ease of miniaturization and low cost.

A dual-mode piezoelectric bulk wave filter is disclosed in Japanese Unexamined Patent Application Publication No. 5-327401.

FIG. 20 is a cross-sectional view of a conventional dual-mode piezoelectric bulk wave filter using a thickness longitudinal vibration.

A piezoelectric bulk wave filter 201 includes a piezoelectric substrate 202 that is polarized in the direction of thickness. A pair of excitation electrodes 203 and 204 is disposed on the top surface of the piezoelectric substrate 202. A common excitation electrode 205 is opposed to the excitation electrodes 203 and 204 with the piezoelectric substrate 202 sandwiched therebetween.

During use, an input signal is applied between one excitation electrode 203 and the common excitation electrode 205 to excite the piezoelectric substrate 202. When the piezoelectric substrate 202 is excited, a symmetrical mode shown in FIG. 21A and an anti-symmetrical mode shown in FIG. 21B are generated. The two modes are coupled, forming a filter bandwidth. An output is picked up between the excitation electrode 204 and the ground electrode 205.

Also known in addition to the dual-mode piezoelectric bulk wave filter using the thickness longitudinal mode is another dual-mode piezoelectric bulk wave filter which includes the piezoelectric substrate 202, polarized in a direction parallel to the top surface, and utilizing a shear vibration mode.

The degree of coupling between the symmetrical mode and anti-symmetrical mode in the conventional piezoelectric bulk wave filter 201 depends on the spacing between the excitation electrodes 203 and 204. The spacing determines a frequency difference between the symmetrical mode and anti-symmetrical mode, thereby determining a passband.

Specifically, to produce a wide band filter, the spacing between the excitation electrodes 203 and 204 must be narrowed to increase the degree of coupling between the two modes, and to increase the frequency between the two modes.

The excitation electrodes 203 and 204 are typically produced using a method of screen printing electrically conductive paste. The screen printing technique is subject to limitations in the ability to narrow the spacing between the excitation electrodes 203 and 204. If the excitation electrodes 203 and 204 are produced using a photolithographic technique, the spacing between the excitation electrodes 203 and 204 is narrowed, but the costs involved increase.

Even if the spacing between the excitation electrodes 203 and 204 is narrowed, a capacitance between the input and output increases in the piezoelectric bulk wave filter 201, leading to a smaller attenuation.

SUMMARY OF THE INVENTION

In order to overcome the problems described above, preferred embodiments of the present invention provide a multi-mode piezoelectric bulk wave filter, and electronic component including the multi-mode piezoelectric bulk wave filter which is free from the problems of the conventional art, has a wide bandwidth, presents a large attenuation, is easy to miniaturize, and is manufactured at low costs.

According to a preferred embodiment of the present invention, a longitudinally-coupled multi-mode piezoelectric bulk wave filter includes at least four excitation electrodes extending substantially parallel to each other, a laminated piezoelectric body including a plurality of piezoelectric layers arranged between the excitation electrodes and polarized in a direction that is substantially perpendicular to or substantially parallel to the excitation electrodes, the laminated piezoelectric body having first and second end surfaces facing in a direction that is substantially perpendicular to the plurality of the piezoelectric layers and first through fourth side surfaces connecting the first and second end surfaces, an input electrode disposed on the first side surface of the laminated piezoelectric body closer to the first end surface, an output electrode disposed on the first side surface of the laminated piezoelectric body closer to the second end surface, and a ground electrode disposed on the second side surface of the laminated piezoelectric body opposite from the first side surface. The plurality of excitation electrodes include a first group which is connected to the input electrode, a second group which is connected to the output electrode, and a third group which is connected to the ground electrode. When an input signal is applied between the input electrode and the ground electrode, vibration modes of different orders are excited and coupled so that an output signal is output between the output terminal and the ground terminal. The ratio T/D is equal to or smaller than about 0.9 where T represents the dimension of the width between the opposed first and second side surfaces of the laminated piezoelectric body and D represents the distance between the adjacent excitation electrodes.

Preferably, W/D is equal to or smaller than about 0.9 where W represents the dimension of the width between the third and fourth side surfaces of the laminated piezoelectric body. In this arrangement, width spurious vibrations are effectively controlled, and excellent filter characteristics result.

Preferably, the dimension W falls within a range of about 1.7n−0.7<W/D<about 1.7n+0.7 where n is a positive integer.

The multi-mode piezoelectric bulk wave filter according to the preferred embodiment of the present invention described above is not limited to a particular vibration mode. The multi-mode piezoelectric bulk wave filter may use a harmonic wave of a length vibration mode based on the piezoelectric longitudinal effect, or a harmonic wave of a thickness longitudinal vibration mode based on the piezoelectric longitudinal effect.

Preferably, the longitudinally-coupled multi-mode piezoelectric bulk wave filter includes reflective layers, respectively attached to the first and second end surfaces of the laminated piezoelectric body, and preferably made of a material having a second acoustic impedance $Z_2$ lower than an acoustic impedance $Z_1$ of a piezoelectric material of the laminated piezoelectric body, and support members, respectively attached to the surfaces of the reflective layers opposite from the surfaces thereof connected to the first and second end surfaces of the laminated piezoelectric body, and fabricated of a material having a third acoustic impedance $Z_3$ higher than the second acoustic impedance $Z_2$. In this arrangement, a vibration is reflected from the boundary between the reflective layer and the support member. The support member thus mechanically supports the laminated piezoelectric body without affecting the vibration characteristics of the laminated piezoelectric body.

According to another preferred embodiment of the present invention, an electronic component includes a casing substrate, a longitudinally-coupled multi-mode piezoelectric bulk wave filter according to the preferred embodiment described above mounted on the casing substrate, and a cap member secured to the casing substrate in such a manner that the cap covers the piezoelectric bulk wave filter. The present invention thus provides an electronic component in a package including a longitudinally-coupled multi-mode piezoelectric bulk wave filter presenting a wide bandwidth and large attenuation.

According to another preferred embodiment of the present invention, a longitudinally-coupled multi-mode piezoelectric bulk wave filter includes a piezoelectric body having opposed first and second end surfaces, and four side surfaces connecting the first and second end surfaces, a plurality of excitation electrodes arranged in the piezoelectric body and being laminated with each other with piezoelectric layers interposed therebetween, an input electrode disposed on an external surface of the laminated piezoelectric body closer to the first end surface, an output electrode disposed on the external surface of the laminated piezoelectric body closer to the second end surface, and a ground electrode disposed on the external surface of the laminated piezoelectric body. The plurality of excitation electrodes include a first group which is electrically connected to the input electrode, a second group which is electrically connected to the output electrode, and a third group which is electrically connected to the ground electrode. Each first group excitation electrode and each third group excitation electrode are alternately arranged in the direction of lamination of the laminated piezoelectric body, and each second excitation electrode and each third excitation electrode are alternately arranged in the direction of lamination of the laminated piezoelectric body. When an input signal is applied between the input electrode and the ground electrode, first through third modes are excited. The first through third modes respectively having the (N−1)-th, N-th, and (N+1)-th orders (N is an integer equal to or larger than 3) are coupled, and the resulting output signal is output between the output electrode and the ground electrode.

Preferably, relationships of $Fa(N-1) \geq Fr(N)$ and $Fa(N) \geq Fr(N+1)$ is satisfied where $Fa(N-1)$ represents an antiresonance frequency of the first mode, $Fr(N)$ and $Fa(N)$ respectively represent a resonance frequency and an antiresonance frequency of the second mode, and $Fr(N+1)$ represents a resonance frequency of the third mode. As will be discussed later, filter characteristics having a wide band in a range of approximately 1 MHz to approximately 100 MHz and high attenuation are obtained.

Preferably, $N \geq -0.524 k_{33} + 42.7$ is satisfied where N is an order of harmonic mode and $k_{33}$ represents an electromechanical coefficient of the piezoelectric longitudinal effect. The first through third modes are reliably coupled, thereby presenting a wide band width and high attenuation. The order N of harmonic waves may be determined using the above equation in accordance with the electromechanical coefficient $k_{33}$ of the piezoelectric longitudinal effect. In other words, if the electromechanical coefficient $k_{33}$ is known, the orders of harmonic waves of the first and third modes to be used are easily determined.

Preferably, an order of harmonic mode N satisfies $N \geq -1.73 S_{33}^E + 33.3$ where $S_{33}^E$ represents an elastic compliance of the laminated piezoelectric body in the direction of polarization thereof. In this case as well, the first through third modes are reliably coupled, thereby presenting a wide band width and high attenuation. The order of harmonic waves may be determined using the above equation in accordance with an elastic compliance $S_{33}^E$ of the laminated piezoelectric body. The orders N of harmonic waves for a triple-mode filter are easily determined.

Preferred embodiments of the present invention preferably use a variety of vibration modes based on the piezoelectric longitudinal effect. The harmonic waves used in preferred embodiments of the present invention include, but are not limited to, those in a length vibration mode and those in a thickness longitudinal vibration.

Preferably, the longitudinally-coupled multi-mode piezoelectric bulk wave filter further includes reflective layers which are respectively attached to the first and second end surfaces, and support members which are respectively attached to the reflective layers, wherein the reflective layers have an acoustic impedance $Z_2$ lower than each of an acoustic impedance $Z_1$ of the laminated piezoelectric body and an acoustic impedance $Z_3$ of the support members. In this arrangement, a vibration transferred to the reflective layer from the laminated piezoelectric body is reflected from the boundary between the reflective layer and the support member. The support member thus mechanically supports the laminated piezoelectric body without affecting the vibration characteristics of the laminated piezoelectric body.

In another preferred embodiment of the present invention, an electronic component includes a casing substrate, the longitudinally-coupled multi-mode piezoelectric bulk wave filter according one of the above-described preferred embodiments of the present invention mounted on the casing substrate, and a cap member secured to the casing substrate in such a manner that the cap covers the piezoelectric bulk wave filter. The present preferred embodiment of the present invention thus provides an electronic component in a package including a longitudinally-coupled multi-mode piezoelectric bulk wave filter presenting a wide bandwidth and large attenuation.

In another preferred embodiment of the present invention, a longitudinally-coupled multi-mode piezoelectric bulk wave filter includes a piezoelectric body having opposed first and second end surfaces, and four side surfaces connecting the first and second end surfaces, a plurality of excitation electrodes arranged in the piezoelectric body and being laminated with each other with piezoelectric layers interposed therebetween, an input electrode disposed on the first side surface of the laminated piezoelectric body closer to the first end surface, an output electrode disposed on the first side surface of the laminated piezoelectric body closer to the second end surface, and a ground electrode disposed on the second side surface of the laminated piezoelectric body opposed to the first side surface. The plurality of excitation electrodes include a first group which is electrically connected to the input electrode, a second group which is electrically connected to the output electrode, and a third group which is electrically connected to the ground electrode. Each first group excitation electrode and each third group excitation electrode are alternately arranged in a direction extending between the first and second end surfaces, and each second excitation electrode and each third excitation electrode are alternately arranged in a direction extending between the first and second end surfaces. When an input signal is input between the input electrode and the ground electrode, vibration modes of different orders of harmonic waves are excited and coupled so that an output signal is output between the output terminal and the ground terminal. A ratio of G/D is not smaller than approximately 2 where G represents the distance between each of the ends of the first and second group excitation electrodes and the first side surface and the distance between each of the ends of the third group excitation electrodes and the first side surface, and D represents the thickness of the piezoelectric layer between adjacent excitation electrodes.

Preferably, G/W is equal to or smaller than about 0.4 where W represents the dimension of the width between the first and second side surfaces of the laminated piezoelectric body.

The present preferred embodiment of the present invention preferably uses a variety of vibration modes based on the piezoelectric longitudinal effect. The harmonic waves used in the present preferred embodiment of the present invention include, but are not limited to, those in a length vibration mode and those in a thickness longitudinal vibration.

Preferably, the longitudinally-coupled multi-mode piezoelectric bulk wave filter further includes reflective layers which are respectively attached to the first and second end surfaces, and support members which are respectively attached to the reflective layers, wherein the reflective layers have an acoustic impedance $Z_2$ lower than an acoustic impedance $Z_1$ of the laminated piezoelectric body and an acoustic impedance $Z_3$ of the support members. In this arrangement, a vibration transferred to the reflective layer from the laminated piezoelectric body is reflected from the boundary between the reflective layer and the support member. The support member thus mechanically supports the laminated piezoelectric body without affecting the vibration characteristics of the laminated piezoelectric body.

In yet another preferred embodiment of the present invention, an electronic component includes a casing substrate, the longitudinally-coupled multi-mode piezoelectric bulk wave filter mounted on the casing substrate according to one of the preferred embodiments described above, and a cap member secured to the casing substrate in such a manner that the cap covers the piezoelectric bulk wave filter. The present preferred embodiment of the present invention thus provides an electronic component in a package including the longitudinally-coupled multi-mode piezoelectric bulk wave filter presenting a wide bandwidth and large attenuation.

Other features, elements, characteristics and advantages of the present invention will become more apparent from the following detailed description of the present invention with reference to preferred embodiments thereof with reference to the attached drawings.

DETAILED DESCRIPTION OF PREFERRED EMBODIMENTS

Preferred embodiments of the present invention will now be discussed with reference to the drawings.

Figure 1A:
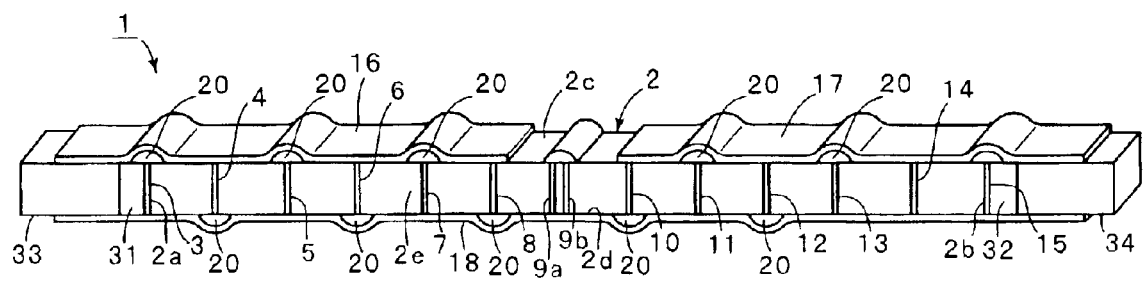
FIGS. 1A and 1B are respectively a perspective view and a cross-sectional view of a multi-mode piezoelectric bulk wave filter in accordance with a first preferred embodiment of the present invention.
Figure 1B:
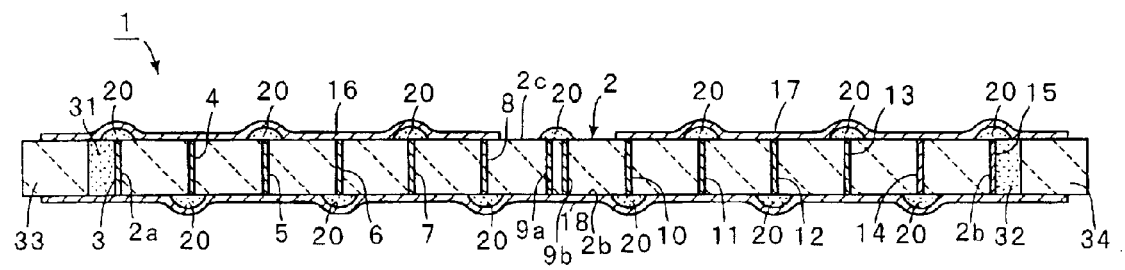

FIGS. 1A and 1B are respectively a perspective view and a cross-sectional view of a triple-mode piezoelectric bulk wave filter 1 in accordance with a first preferred embodiment of the present invention.

The piezoelectric bulk wave filter 1 includes a bar-like piezoelectric body 2 having a substantially rectangular shape in cross section. The piezoelectric bulk wave filter 1 is preferably a triple-mode piezoelectric bulk wave filter using a length vibration mode traveling in the direction of length of the piezoelectric body 2.

The piezoelectric body 2 is preferably made of a lead-zirconate-titanate (PZT) ceramic, and the acoustic impedance $Z_1$ thereof is, for example, approximately $3.4 \times 10^7$ (kg/m²S).

The piezoelectric body 2 has first and second opposed end surfaces 2a and 2b. Reflective layers 31 and 32 are respectively attached to the first and second end surfaces 2a and 2b, and support members 33 and 34 are then respectively attached to the reflective layers 31 and 32. The reflective layers 31 and 32 and support members 33 and 34 preferably have substantially the same shape in cross section as the piezoelectric body 2.

The construction and operation of the reflective layers 31 and 32 and support members 33 and 34 will be discussed later.

Excitation electrodes 3 and 15 are arranged to cover the end surfaces 2a and 2b. The piezoelectric body 2 is distributed in the direction of length thereof, and includes a plurality of excitation electrodes 4–14 extending in the direction of width of the piezoelectric body 2.

The excitation electrodes 3–15 are arranged substantially parallel to each other, and piezoelectric layers, having the same thickness, are interposed between the excitation electrodes 3, . . . , and 9a and 9b, . . . and 15.

Each piezoelectric layer between any two adjacent ones of the excitation electrodes 3–15 in the piezoelectric body 2 is polarized in a direction that is substantially perpendicular to the excitation electrodes 3–15.

The excitation electrodes 3–15 are produced together with the piezoelectric ceramic forming the piezoelectric body 2 preferably using a ceramic lamination and integral firing technique. Another technique may be used to produce the piezoelectric body 2 and excitation electrodes 3–15. The excitation electrodes 3 and 15 may be formed on the end surfaces 2a and 2b, respectively, after the piezoelectric body 2 is produced using the ceramic lamination and integral firing technique.

The piezoelectric body 2 has four side surfaces connecting the end surfaces 2a and 2b. Specifically, the piezoelectric body 2 has a top surface 2c defining a first side surface, a bottom surface 2d defining a second side surface, and two opposed side surfaces 2e defining third and fourth side surfaces (the fourth side surface not shown). An input electrode 16 is disposed on the top surface 2c closer to the end surface 2a, and an output electrode 17 is disposed on the top surface 2c closer to the end surface 2b. A ground electrode 18 is disposed on the bottom surface 2d. The input electrode 16 extends beyond the end surface 2a and reflective layer 31, reaching the support member 33. The output electrode 17 extends beyond the end surface 2b and reflective layer 32, reaching the support member 34.

The input electrode 16, output electrode 17, and ground electrode 18 may be fabricated of the same metal as the excitation electrode 3–15, for example, may be fabricated of copper, nickel, or silver, or other suitable material.

Insulating materials 20 are deposited on the top surface 2c of the piezoelectric body 2 to be in contact with the top ends of the excitation electrodes 3, 5, 7, 9a, 9b, 11, 13, and 15. The excitation electrodes 3, 5, 7, 9a, 9b, 11, 13, and 15 are electrically insulated from the input electrode 16 and output electrode 17. The excitation electrodes 3, 5, 7, 9a, 9b, 11, 13, and 15 are respectively electrically connected to the ground electrode 18.

Insulating materials 20 are also deposited on the bottom surface 2d of the piezoelectric body 2 to be in contact with the bottom ends of the excitation electrodes 4, 6, 8, 10, 12, and 14. The excitation electrodes 4, 6, 8, 10, 12, and 14 are electrically insulated from the ground electrode 18. The excitation electrodes 4, 6, and 8 are respectively electrically connected to the input electrode 16, and the excitation electrodes 10, 12, and 14 are respectively electrically connected to the output electrode 17.

The excitation electrodes 3, 5, 7, 9a, 9b, 11, 13, and 15 constitute a third group of the excitation electrodes in the present preferred embodiment of the present invention. The excitation electrodes 4, 6, and 8 arranged closer to the end surface 2a constitute a first group, and the excitation electrodes 10, 12, and 14 arranged closer to the end surface 2b constitute a second group.

The excitation electrodes 3, 5, 7, 9a, 9b, 11, 13, and 15 in the third group are respectively electrically connected to the ground electrode 18. The excitation electrodes 4, 6, and 8 in the first group are respectively electrically connected to the input electrode 16, and the excitation electrodes 10, 12, and 14 in the second group are respectively electrically connected to the output electrode 17.

In the first preferred embodiment, each of the excitation electrodes 3–15 extends over the full cross section of the piezoelectric body 2. It is also acceptable that each of the excitation electrodes 3–15 extends over a portion of the cross section of the piezoelectric body 2.

The insulating materials 20 are not limited to any particular material. The insulating materials 20 may be an insulating resin or an insulating adhesive agent, or other suitable material.

The reflective layers 31 and 32, preferably made of an epoxy resin, have an acoustic impedance $Z_2$ of, for example, approximately $1.87 \times 10^6$ (kg/m$^2$S). The support members 33 and 34, fabricated of a ceramic, have an acoustic impedance $Z_3$ of, for example, approximately $3.4 \times 10^7$ (kg/m$^2$S).

The materials of the reflective layers 31 and 32, and support members 33 and 34 are not limited to the ones discussed above as long as the acoustic impedance $Z_2$ is lower than each of the acoustic impedances $Z_1$ and $Z_3$.

Figure 2:
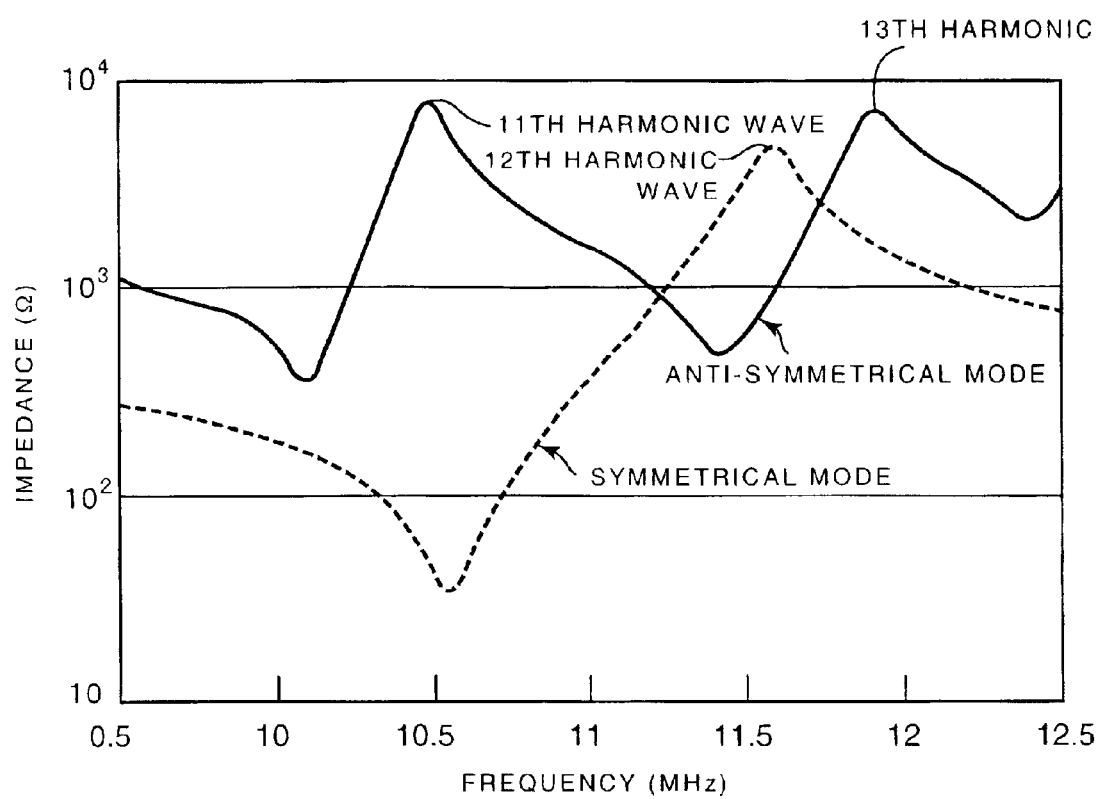
FIG. 2 shows a symmetrical mode and anti-symmetrical mode excited in the multi-mode piezoelectric bulk wave filter of the first preferred embodiment.

The multi-mode piezoelectric bulk wave filter 1 of the first preferred embodiment is discussed below. FIG. 2 shows a symmetrical mode (S mode) in a broken line and anti-symmetrical mode (A mode) in a solid line, excited in the multi-mode piezoelectric bulk wave filter 1. In the piezoelectric bulk wave filter 1, the height T of the piezoelectric body 2 between the top surface 2c and bottom surface 2d is preferably about 120 $\mu$m, the thickness of each piezoelectric layer between any two adjacent excitation electrodes is about 150 $\mu$m, and the width dimension W of the piezoelectric body 2, i.e., the width dimension perpendicular to the length of the piezoelectric body 2 and parallel to the top surface 2c and bottom surface 2d, is preferably about 300 $\mu$m. A 12th harmonic wave is strongly excited in the symmetrical mode, and 11th and 13th harmonic waves are strongly excited in the anti-symmetrical mode.

When the multi-mode piezoelectric bulk wave filter 1 according to the first preferred embodiment is actually operated, the symmetrical mode and anti-symmetrical mode are coupled, thereby resulting filter characteristics of the multi-mode piezoelectric bulk wave filter 1. The filter characteristics of the multi-mode piezoelectric bulk wave filter 1 are shown in FIG. 3.

As shown, a solid line represents attenuation versus frequency characteristics and a broken line represents group delay time versus frequency characteristics of the multi-mode piezoelectric bulk wave filter 1.

Referring to FIG. 2, responses on the 11th through 13th harmonic waves are close to each other. Filter characteristics having the 11th harmonic resonance frequency and 13th harmonic anti-resonance frequency as attenuation poles are thus obtained as shown in FIG. 3.

Figure 3:
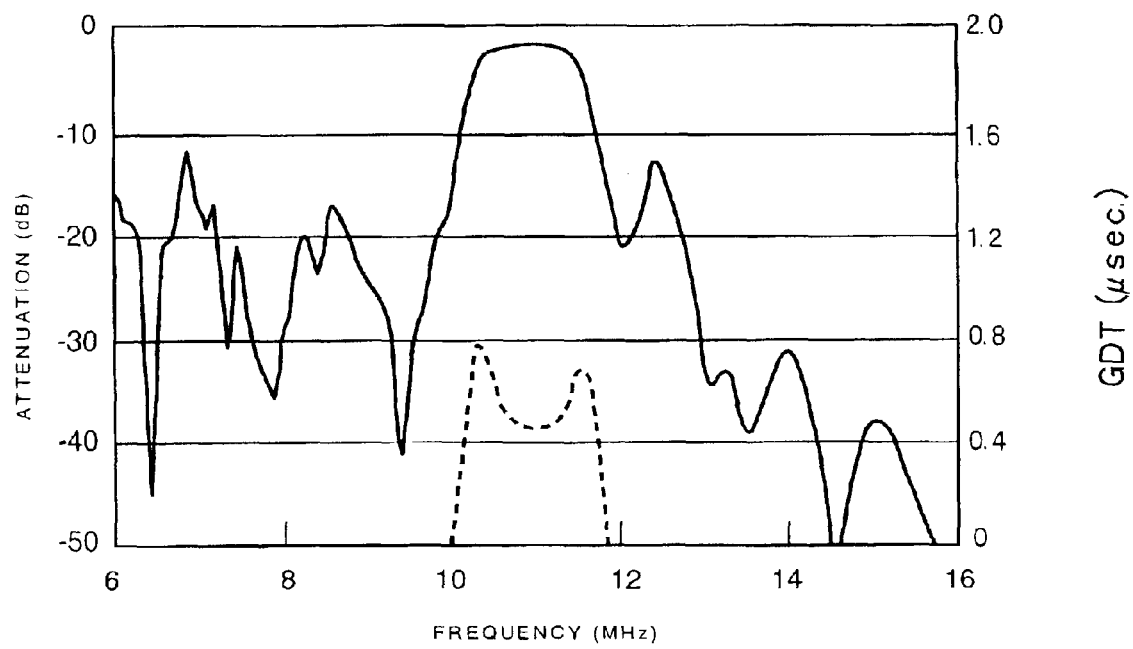
FIG. 3 shows attenuation versus frequency characteristics and group delay time versus frequency characteristics of the multi-mode piezoelectric bulk wave filter of the first preferred embodiment of the present invention.

As shown in FIG. 3, the first preferred embodiment results in filter characteristics having a bandwidth of about 2 Hz with the center frequency thereof at about 11 MHz.

Figure 20:
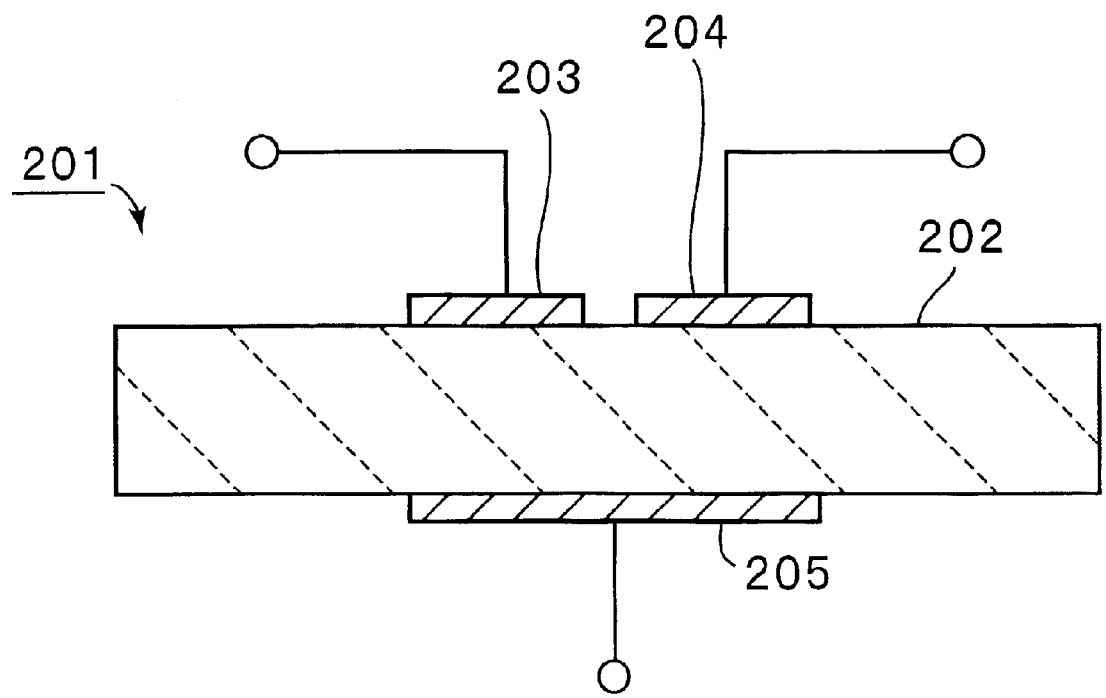
FIG. 20 is a cross-sectional view of a conventional dual-mode piezoelectric bulk wave filter using the thickness longitudinal mode.
Figure 21A:
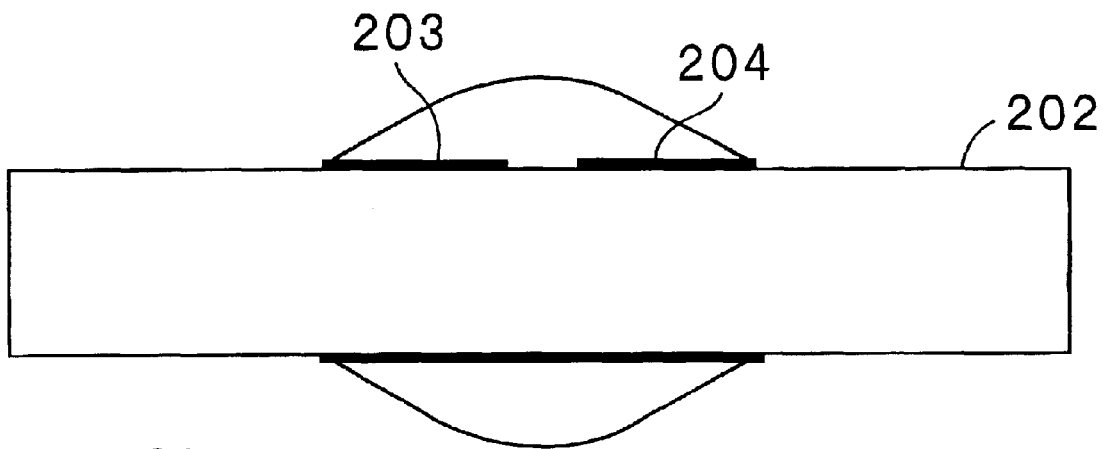
FIGS. 21A and 21B respectively diagrammatically show a symmetrical mode and anti-symmetrical mode of the conventional dual-mode piezoelectric bulk wave filter of FIG. 20.
Figure 21B:
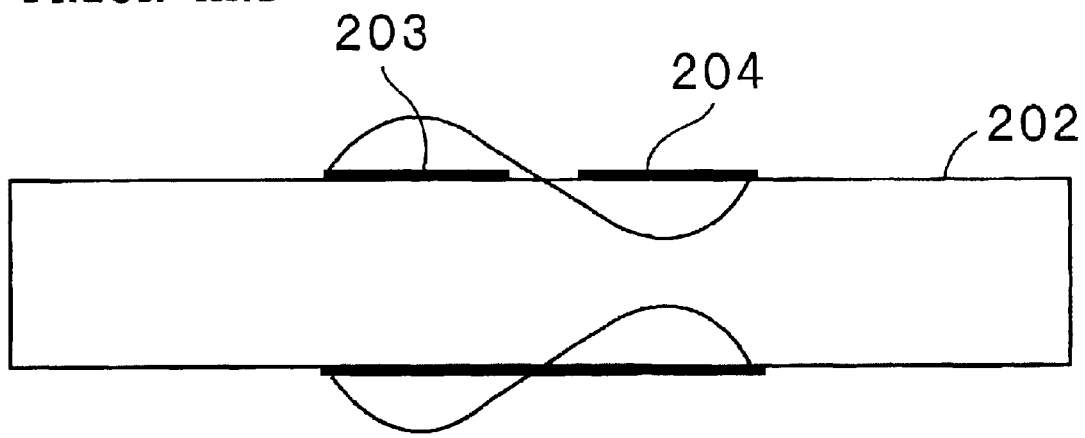

In a conventional dual-mode piezoelectric bulk wave filter 201 (see FIG. 20), a frequency difference between a symmetrical mode and anti-symmetrical mode depends on the spacing between excitation electrodes 203 and 204 formed on one surface of a piezoelectric substrate 202. In contrast, the frequency difference between the 11th harmonic wave and 12th harmonic wave and the frequency difference between the 12th harmonic wave and 13th harmonic wave are respectively depends on the ratio of orders of harmonic waves, and are independent of the spacing between the excitation electrodes. To achieve a desired bandwidth, the orders of harmonic corresponding to the bandwidth are simply selected.

In the first preferred embodiment, 12 piezoelectric layers, each sandwiched between excitation electrodes connected to different potentials, are provided, and the 11th through 13th harmonic waves are efficiently excited. By changing the number of piezoelectric layers, three different orders of harmonic waves are excited. The triple-mode piezoelectric bulk wave filter is thus constructed.

Generally speaking, a triple-mode piezoelectric bulk wave filter is constructed using an N-th harmonic wave (N is an integer equal to or greater than 3), (N−1)-th harmonic wave, and (N+1)-th harmonic wave. A piezoelectric bulk wave filter with various bandwidths may be provided by selecting the order N.

In conventional dual-mode piezoelectric bulk wave filters, precision of the excitation electrodes 203 and 204 must be increased to achieve a wide band. In the first preferred embodiment, a desired bandwidth or a wide bandwidth is easily achieved without implementing unnecessarily high precision in the excitation electrodes 3–15.

Attenuation in the piezoelectric bulk wave filter 1 depends on a ratio of a capacitance $C_{I-G}$ between the input electrode 16 and ground electrode 18 to a capacitance $C_{I-O}$ between the input electrode 16 and output electrode 17. The larger the ratio $C_{I-G}/C_{I-O}$, i.e., the smaller the capacitance $C_{I-O}$, the attenuation becomes greater. Since the excitation electrodes 9a and 9b connected to the ground electrode 18 are present between the excitation electrodes 3, 5, and 7 connected to the input electrode 16, and the excitation electrodes 10, 12, and 14 connected to the output electrode 17 in the first preferred embodiment, the capacitance $C_{I-O}$ is small. The out-of-band attenuation is thus increased. The attenuation is large compared with the conventional piezoelectric bulk wave filter 201.

The piezoelectric layers, each sandwiched between excitation electrodes connected to different potentials, preferably have the same thickness. However, it is not a requirement that the thicknesses of the piezoelectric are uniform in the filter. By making the thicknesses different, the excitation efficiency of the orders of the modes in use is increased, and the excitation efficiency of the orders of the modes becoming spurious is decreased.

Since the reflective layers 31 and 32 are respectively attached to the two end surfaces of the piezoelectric body 2 and the support members 33 and 34 are respectively attached to the reflective layers 31 and 32 in the piezoelectric bulk wave filter 1 of the first preferred embodiment, the piezoelectric bulk wave filter 1 is mechanically supported at the support members 33 and 34 thereof.

The reflective layers 31 and 32 are preferably made of a material having a second acoustic impedance $Z_2$ lower than an acoustic impedance $Z_1$ of the piezoelectric body 2. The support members 33 and 34 preferably have a third acoustic impedance $Z_3$ higher than the second acoustic impedance $Z_2$. Vibrations transferred from the piezoelectric body 2 are reflected from the boundaries between the reflective layers 31 and 32 and the support members 33 and 34. In other words, vibration leakages to the support members 33 and 34 are almost completely controlled. Even if the support members 33 and 34 are mechanically supported, the filter characteristics of the piezoelectric bulk wave filter 1 are not adversely affected.

Since the thickness T of the piezoelectric body 2 is preferably about 120 $\mu$m, the thickness D of the piezoelectric layer between adjacent excitation electrodes is preferably about 150 $\mu$m, and the width dimension W of the piezoelectric body 2 is preferably about 300 $\mu$m in the multi-mode piezoelectric bulk wave filter 1 of the first preferred embodiment, the 11th through 13th harmonic waves are efficiently excited as already discussed. The thickness T of the piezoelectric body 2 refers to the dimension of the height between the top surface 2c as the first side surface bearing the input electrode 16 and output electrode 17, and the bottom surface 2d as the second side surface having the ground electrode 18 disposed thereon.

The inventors of the present invention have discovered that the harmonic waves of different orders are effectively excited if the thickness T and width dimension W of the piezoelectric body 2 have a particular relationship with the thickness D of the piezoelectric layer sandwiched between two adjacent excitation electrodes. Specifically, if the ratio of T/D is about 0.9 or smaller, and more preferably, if the ratio of W/D is about 0.9 or smaller, harmonic waves having different orders are efficiently excited. This will be discussed more in detail with reference to FIGS. 4–12.

Figure 4:
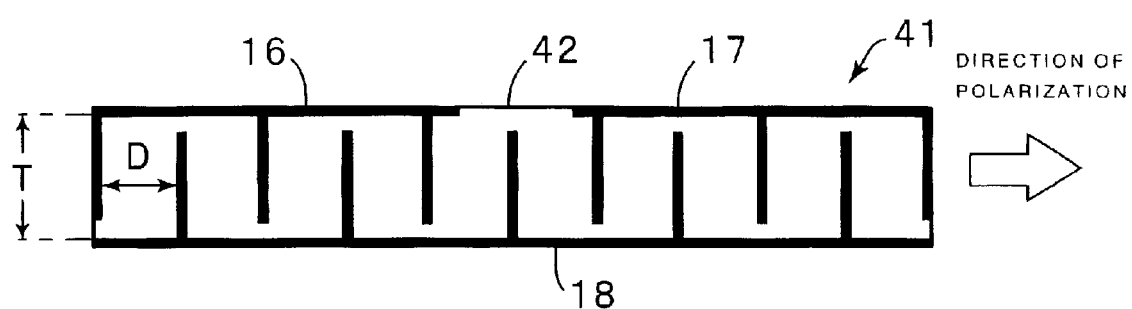
FIG. 4 is a cross-sectional view diagrammatically showing the multi-mode piezoelectric bulk wave filter having a thickness T with a piezoelectric layer having a thickness D.

A multi-mode piezoelectric bulk wave filter device 41 having 11 excitation electrodes and 10 piezoelectric layers is manufactured as diagrammatically shown in FIG. 4. The multi-mode piezoelectric bulk wave filter 41 is preferably identical in construction to the multi-mode piezoelectric bulk wave filter 1 except that the number of excitation electrodes and the number of piezoelectric layers are different. Let T represent the dimension of the distance between first and second side surfaces of a piezoelectric body 42 defining the multi-mode piezoelectric bulk wave filter 41, and D represent the thickness of a piezoelectric layer sandwiched between any adjacent excitation electrodes.

Figure 5:
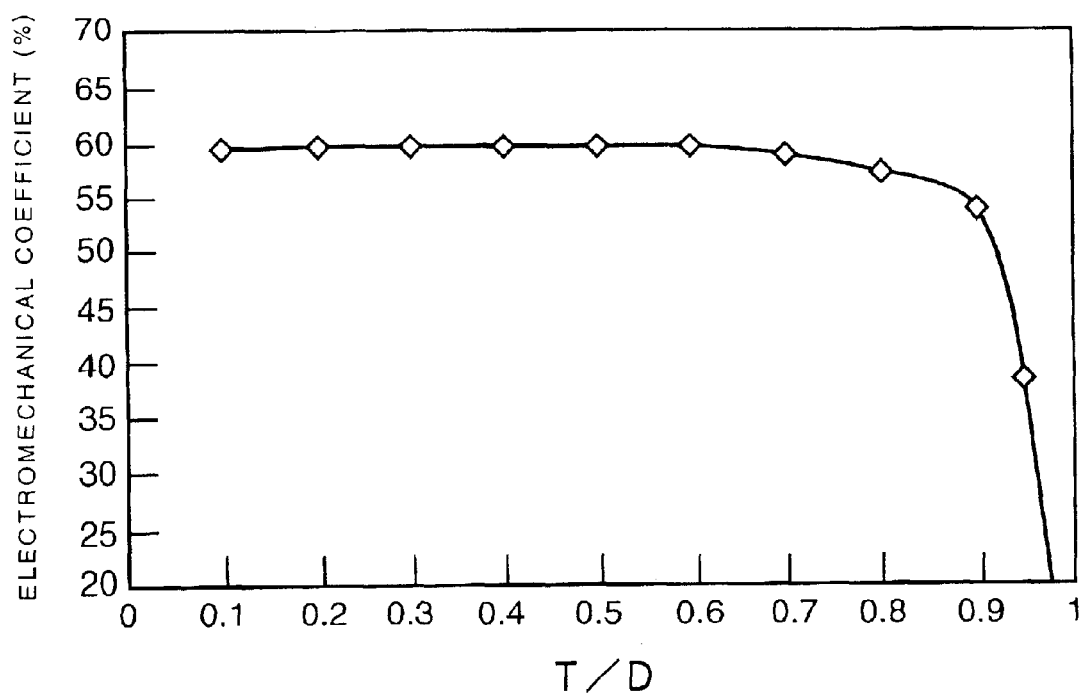
FIG. 5 plots variations in electromechanical coefficient with T/D varied.

An electromechanical coefficient K of the multi-mode piezoelectric bulk wave filter 41 is measured with T and D being different. The results of measurements are shown in FIG. 5.

As shown, the electromechanical coefficient K remains large with T/D smaller than about 0.9, and sharply drops with T/D increasing above about 0.9. A sufficiently wide bandwidth is thus assured if T/D is about 0.9 or larger.

Figure 6:
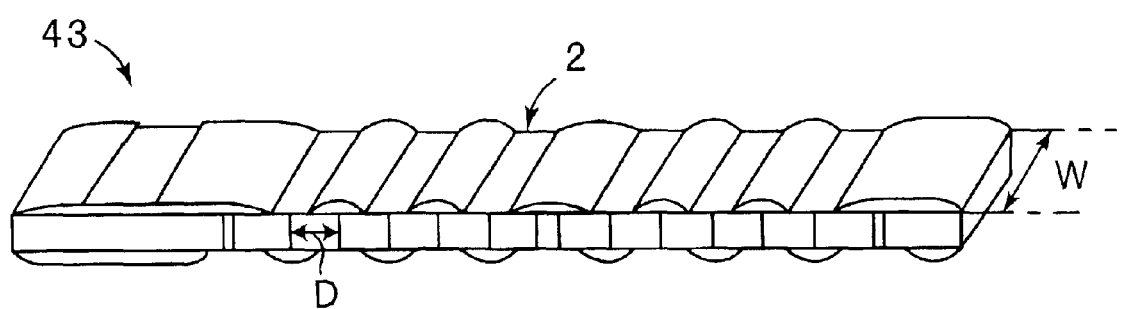
FIG. 6 is a perspective view of the multi-mode piezoelectric bulk wave filter in accordance with a second preferred embodiment of the present invention.
Figure 7:
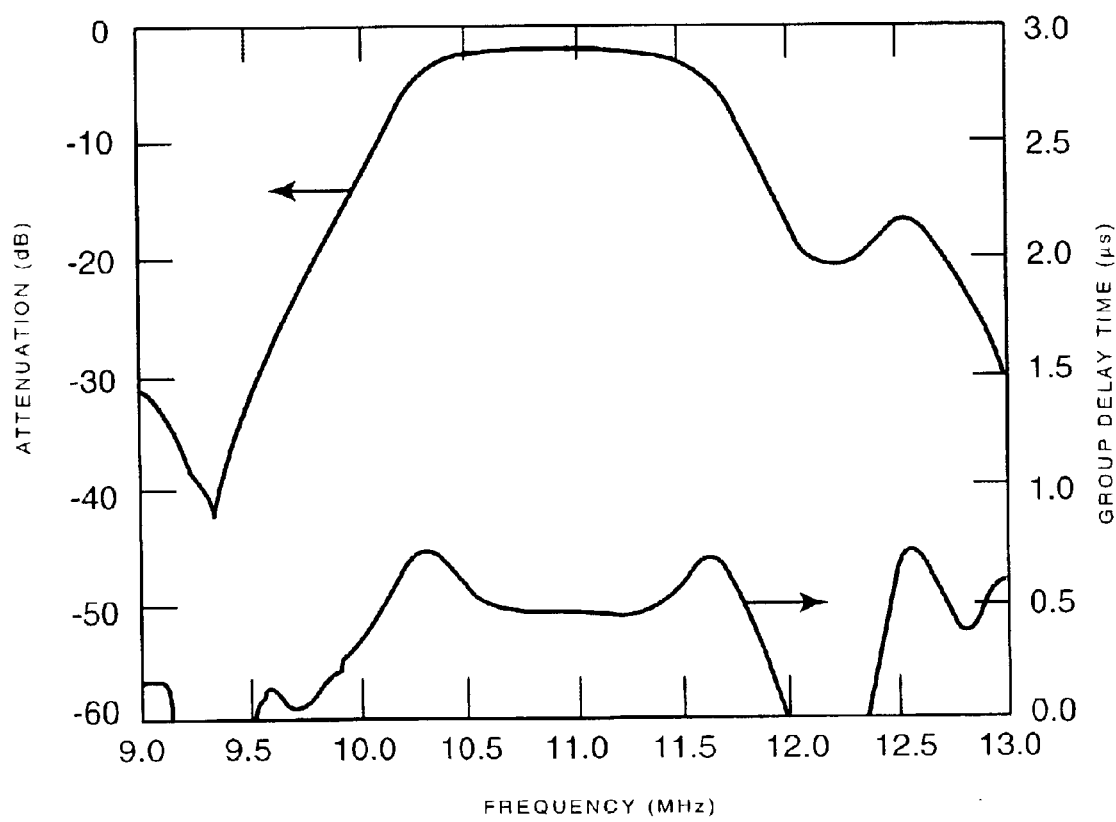
FIG. 7 shows attenuation versus frequency characteristics and group delay time versus frequency characteristics of the multi-mode piezoelectric bulk wave filter of the second preferred embodiment having a width dimension W of about 280 µm.
Figure 8:
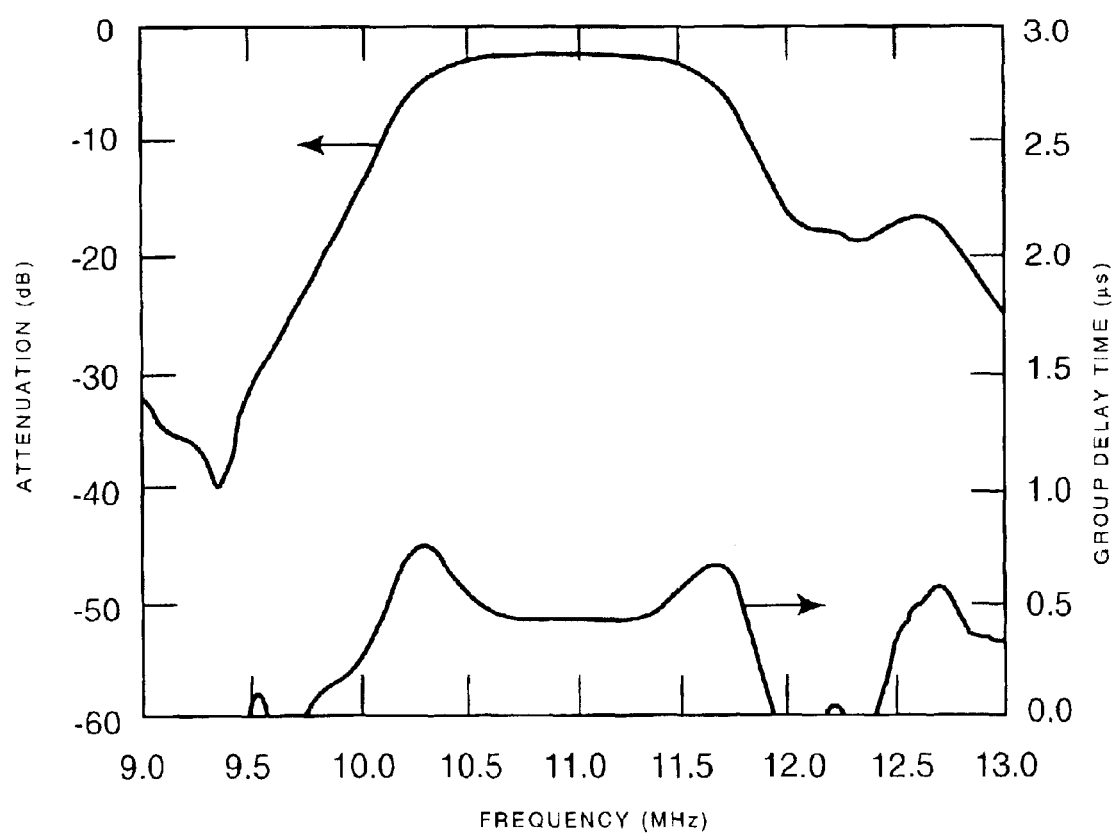
FIG. 8 shows attenuation versus frequency characteristics and group delay time versus frequency characteristics of the multi-mode piezoelectric bulk wave filter of the second preferred embodiment having a width dimension W of about 320 µm.
Figure 9:
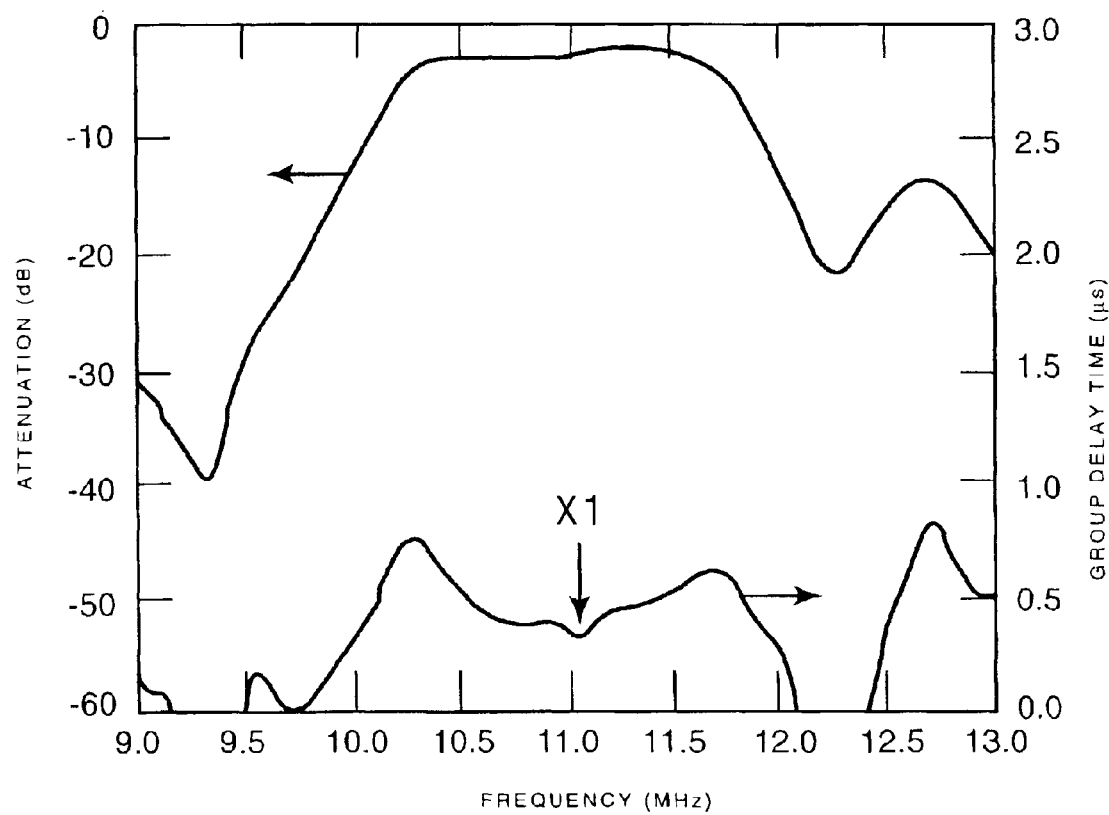
FIG. 9 shows attenuation versus frequency characteristics and group delay time versus frequency characteristics of the multi-mode piezoelectric bulk wave filter of the second preferred embodiment having a width dimension W of about 360 µm.
Figure 10:
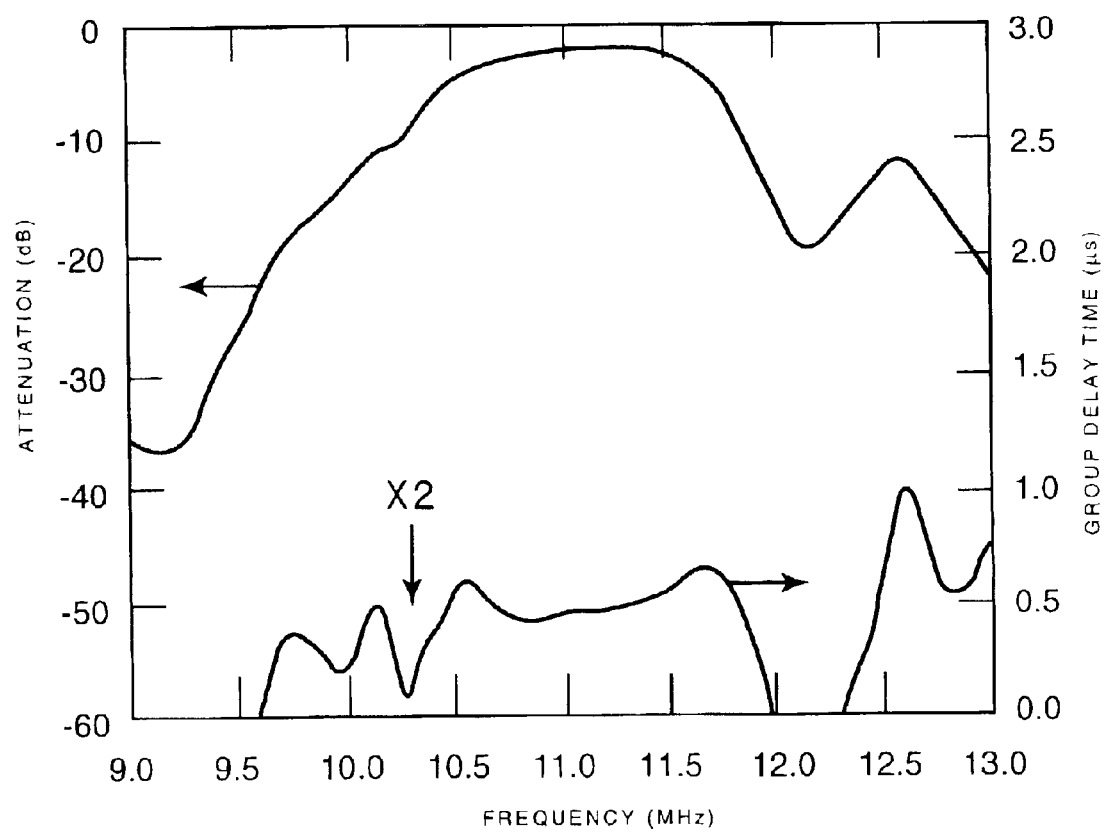
FIG. 10 shows attenuation versus frequency characteristics and group delay time versus frequency characteristics of the multi-mode piezoelectric bulk wave filter of the second preferred embodiment having a width dimension W of about 400 µm.
Figure 11:
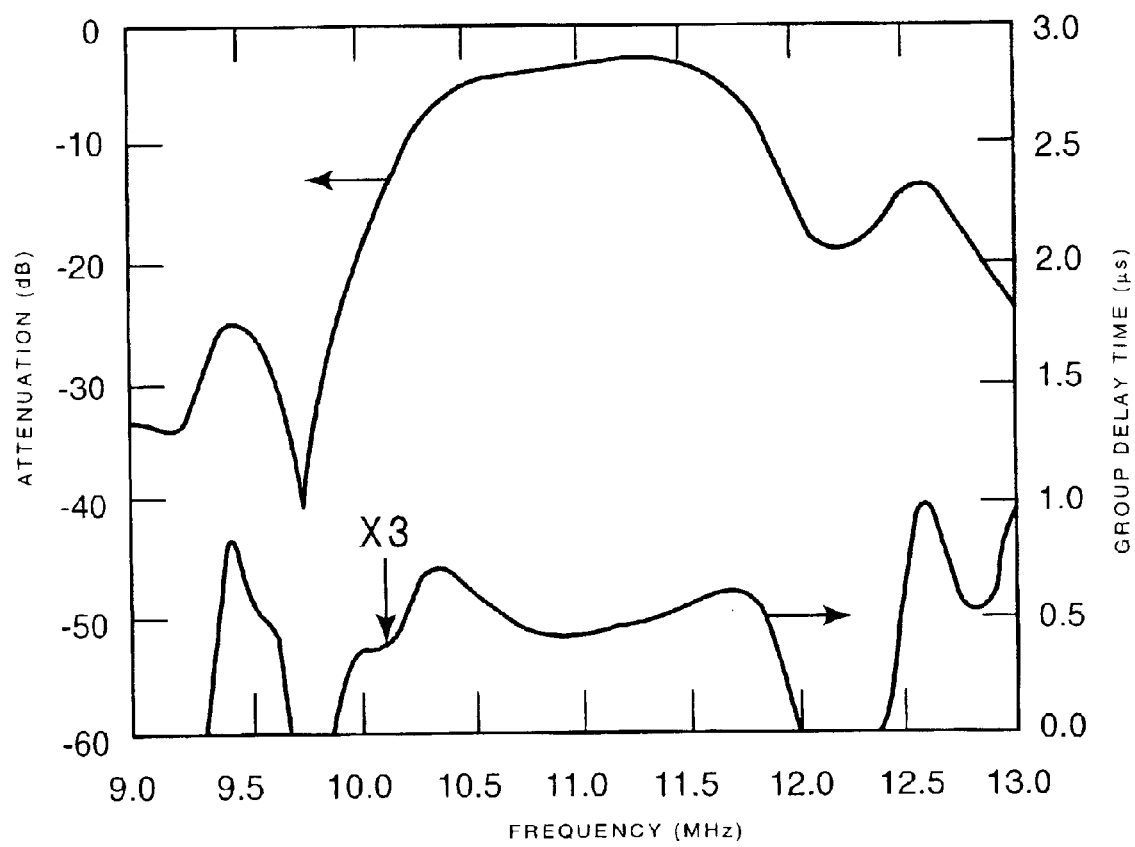
FIG. 11 shows attenuation versus frequency characteristics and group delay time versus frequency characteristics of the multi-mode piezoelectric bulk wave filter of the second preferred embodiment having a width dimension W of about 440 µm.

FIG. 6 shows a multi-mode piezoelectric filer 43 of a second preferred embodiment which preferably has substantially the same construction as the first preferred embodiment except that the multi-mode piezoelectric filer 43 has 12 piezoelectric layers. The thickness D of the piezoelectric layer sandwiched between adjacent excitation electrodes and the width dimension of the piezoelectric body 2 are set to be different to evaluate the filter characteristics of the multi-mode piezoelectric filer 43. FIGS. 7–11 show the results of the second preferred embodiment of the present invention.

The results shown in FIGS. 7–11 are obtained with the width dimension W set to be approximately 280, 320, 360, 400, and 440 $\mu$m and the thickness D remaining constant at approximately 150 $\mu$m.

As shown, the bandwidth and filter characteristics are changed by varying the width dimension W. Spurious components represented by arrows X1–X3 in FIGS. 7–11 are not negligible in group delay time characteristics.

The spurious components are considered as width spurious vibrations. The relationship of the ratio of W/D of the width dimension W and the thickness D of the piezoelectric layer, center frequency Fo, and frequency Fsp at which width spurious components take place is determined.

Figure 12:
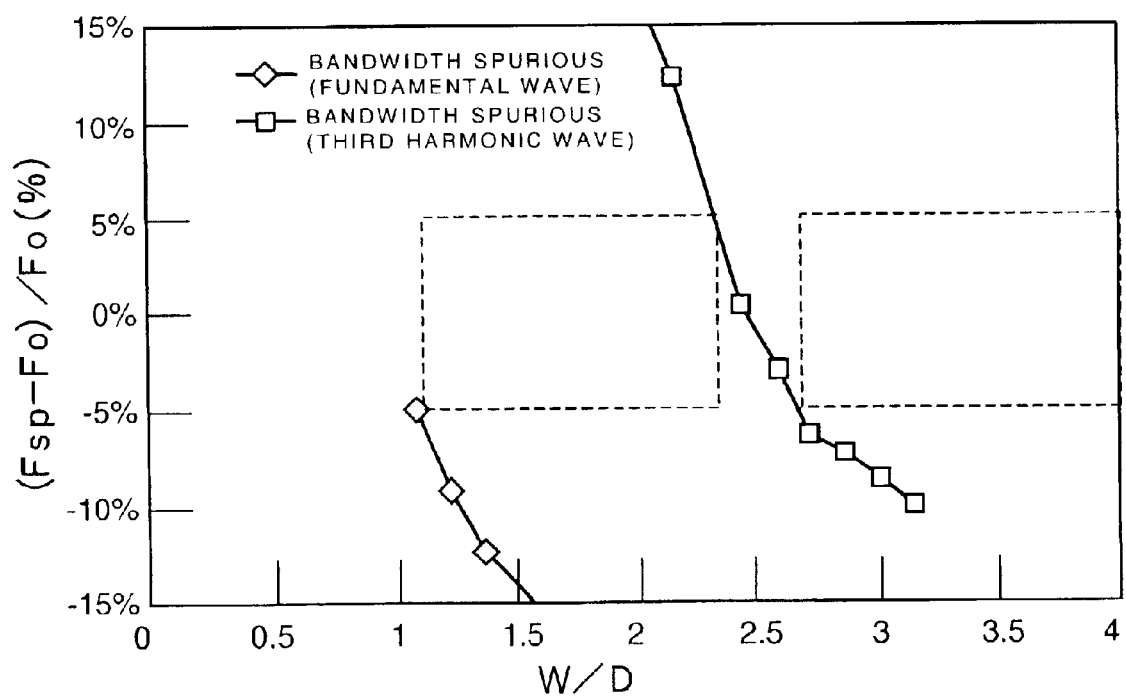
FIG. 12 shows the state in which a width spurious vibration occurs with a ratio W/D varied.

FIG. 12 shows the results of determination. As shown in FIG. 12, the abscissa represents the ratio W/D, and the ordinate represents (Fsp−Fo)/Fo (%). Diamond symbols plot fundamental waves of the width spurious components, and square symbols plot third harmonic waves of the width spurious components.

Since a 3 dB bandwidth is typically 10% in actual multi-mode piezoelectric bulk wave filters, it is a requirement that no spurious components are present within about ±5% of the center frequency Fo of the filter. Such conditions are represented by a broken line box in FIG. 12.

As seen FIG. 12, the effect of spurious components is negligible within the area enclosed by the broken line box. The range of the box is defined as approximately $1.0<W/D<2.4$ and $2.7<W/D<4.1$. Since the width spurious components periodically appear, the range to achieve filter characteristics enclosed by the broken line box is generally defined as approximately $1.7xn-0.7<W/D<1.7xn+0.7$ (n is a positive integer).

No spurious components appear within the passband by limiting the ratio W/D to within the above-described ranges. An excellent filter thus results.

Figure 13:
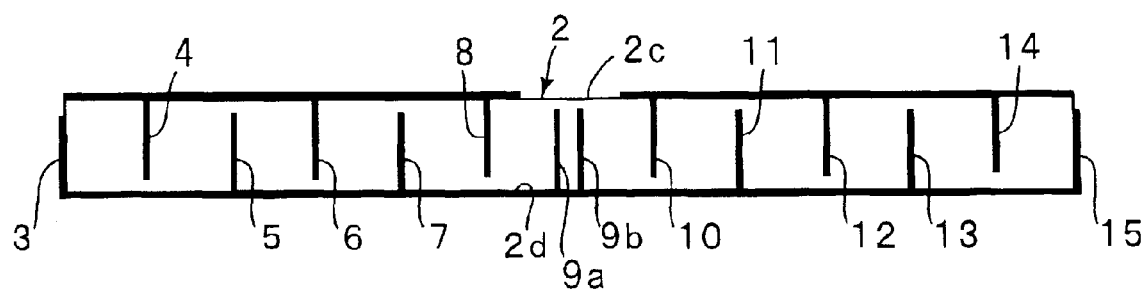
FIG. 13 is a front view of a modification of the multi-mode piezoelectric bulk wave filter of the second preferred embodiment of the present invention.

FIG. 13 is a front view of a modification of the multi-mode piezoelectric bulk wave filter 1 of the second preferred embodiment. The piezoelectric bulk wave filter 1 of the first preferred embodiment uses the insulating materials 20 to electrically insulate the excitation electrodes from electrodes that must remain electrically disconnected from the excitation electrodes. In contrast, the excitation electrodes 3–15 extend with the ends thereof not reaching the top surface 2c or the bottom surface 2d in the longitudinal cross section of the piezoelectric body 2 as shown in FIG. 13. In this way, the excitation electrodes 3–15 are electrically insulated from those that must remain electrically disconnected from the excitation electrodes 3–15.

In the modification of the piezoelectric bulk wave filter shown in FIG. 13, excitation electrodes 3, 5, 7, 9a, 9b, 11, 13, and 15 extend with the ends thereof not reaching the top surface 2c of the piezoelectric body 2. The excitation electrodes 3, 5, 7, 9a, 9b, 11, 13, and 15 in the third preferred embodiment are electrically insulated from the input electrode 16 and output electrode 17. Likewise, excitation electrodes 4, 6, 8, 10, 12, and 14 extend with the ends thereof not reaching the bottom surface 2d of the piezoelectric body 2. The excitation electrodes 4, 6, 8, 10, 12, and 14 are electrically insulated from the ground electrode 18.

The multi-mode piezoelectric bulk wave filters of preferred embodiments of the present invention may use vibration modes other than the length mode. For example, preferred embodiments of the present invention may use the thickness longitudinal vibration mode. Furthermore, preferred embodiments of the present invention are applicable to an energy trapped multi-mode piezoelectric bulk wave filter.

Figure 14:
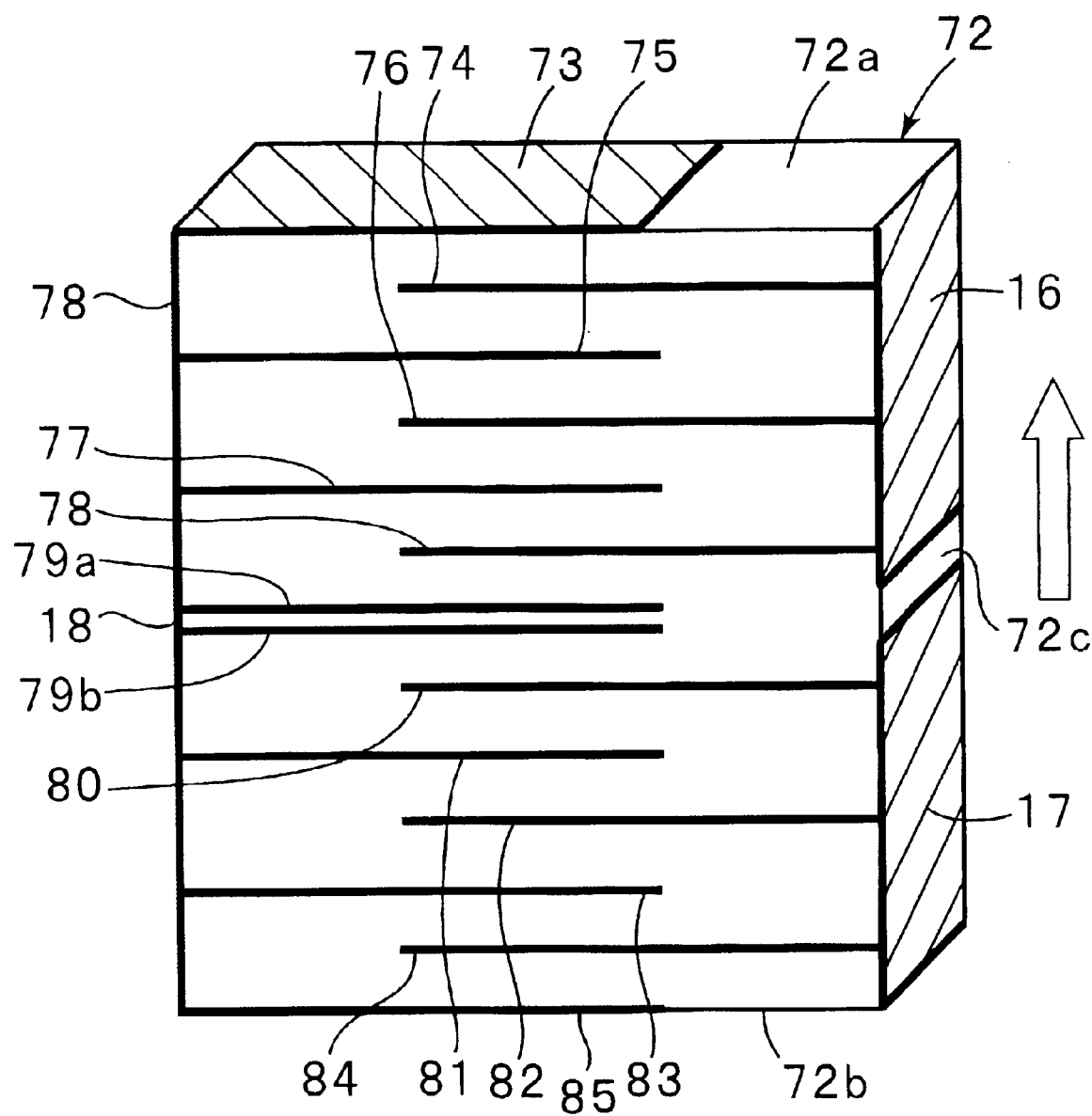
FIG. 14 is a perspective view of the multi-mode piezoelectric bulk wave filter of a third preferred embodiment of the present invention.

FIG. 14 is a perspective view of the multi-mode piezoelectric bulk wave filter 71 of a third preferred embodiment of the present invention.

The multi-mode piezoelectric bulk wave filter 71 includes a laminated piezoelectric body 72 into which piezoelectric layers are laminated with a plurality of excitation electrodes 73–85 sandwiched therebetween. As in the first preferred embodiment, the piezoelectric material forming the piezoelectric layer may be any appropriate piezoelectric material such as a lead-zirconate-titanate ceramic or other suitable material.

In the laminated piezoelectric body 72, the direction of lamination of the excitation electrodes 73–85, namely, the vertical direction in FIG. 14, is referred to as the direction of thickness. The excitation electrode 73 is disposed on the top end surface 72a of the laminated piezoelectric body 72. The excitation electrode 85 is disposed on the bottom end surface 72b. The remaining excitation electrodes 74–84 are internal electrodes.

In the third preferred embodiment, the end surfaces 72a and 72b face in directions that are substantially perpendicular to the excitation electrodes 73–85, and respectively constitute the first and second end surfaces in preferred embodiments of the present invention.

An input electrode 16 is disposed on a side surface 72c of the laminated piezoelectric body 72 closer to the first end surface 72a, and an output electrode 17 is disposed on the side surface 72c closer to the second end surface 72b. A ground electrode 18 is disposed on a side surface 72d opposed to the side surface 72c.

The multi-mode piezoelectric bulk wave filter 71 is strongly excited on the 11th, 12th, and 13th harmonic waves of the thickness longitudinal vibration when an input signal is applied between the input electrode 16 and ground electrode 18.

The 11th through 13th harmonic waves are coupled, forming a wide passband of the filter. The third preferred embodiment provides a longitudinally-coupled triple-mode piezoelectric bulk wave filter which uses the thickness longitudinal movement based on the piezoelectric longitudinal effect. The third preferred embodiment uses vibration modes different from those in the first and second preferred embodiment. However, as in the first and second preferred embodiments, the third preferred embodiment couples harmonic waves of different orders, thereby providing a wide bandwidth of the filter. In the third preferred embodiment as well, a desired bandwidth is easily achieved by making the harmonic waves used different. Specifically, a desired harmonic wave is efficiently excited by adjusting the number of piezoelectric layers to be laminated. Piezoelectric bulk wave filters with different bandwidths are thus provided.

A plurality of piezoelectric layers having different thicknesses may be used. A harmonic wave in use is efficiently excited, and the excitation efficiency of a harmonic wave of an order becoming a spurious component is reduced. An excellent filter thus results.

Two multi-mode piezoelectric bulk wave filters 1 of the first preferred embodiment may be serially connected to increase attenuation.

Figure 15:
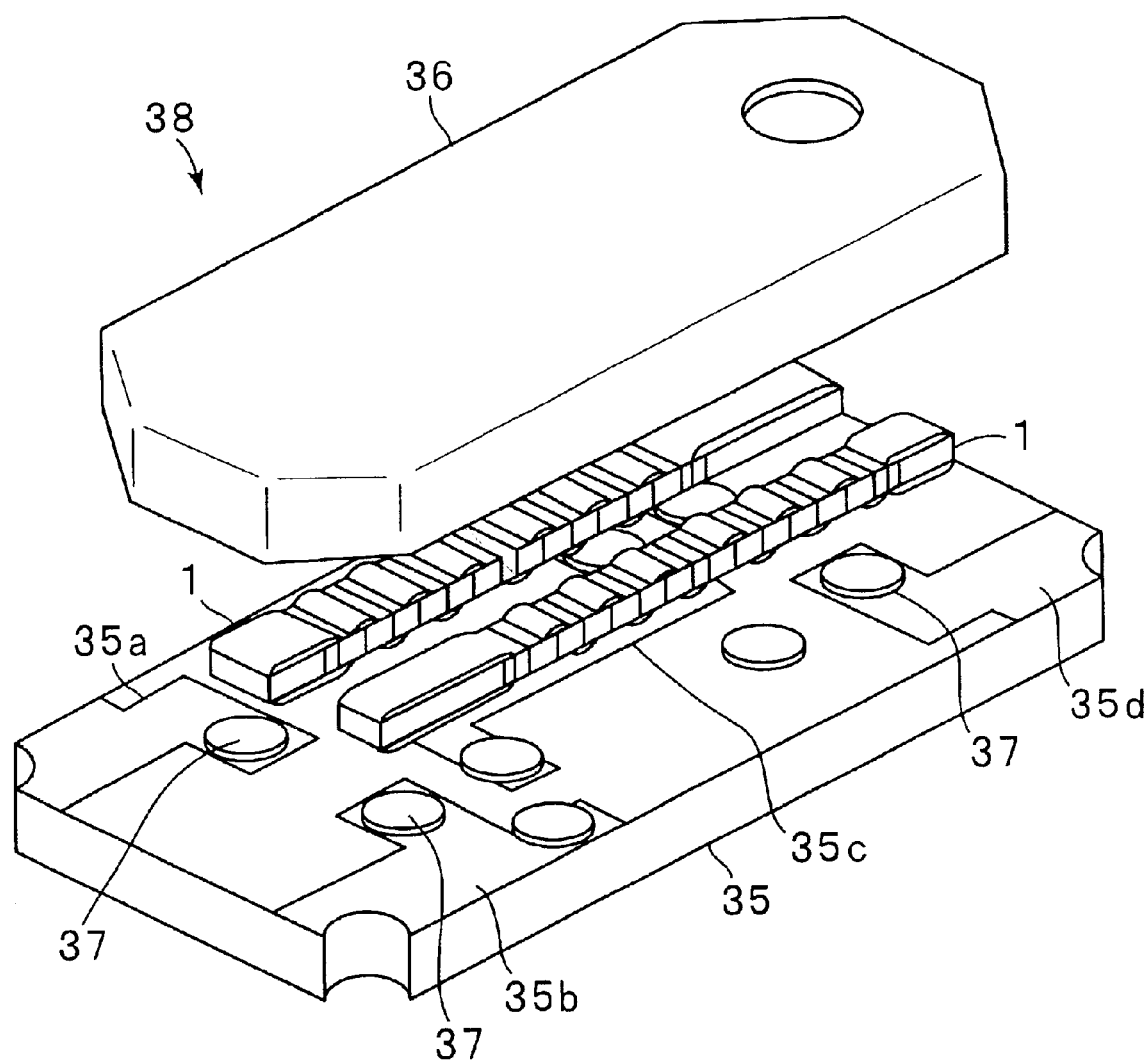
FIG. 15 is an exploded perspective view of a filter device including two multi-mode piezoelectric bulk wave filters of the first preferred embodiment of the present invention.

A piezoelectric resonator component 38 shown in FIG. 15 includes piezoelectric bulk wave filters 1 which are mounted and fixed on a casing substrate 35 using electrically conductive adhesive agents 37. A metal cap 36 is fixed onto the casing substrate 35 using insulating adhesive agents to cover the piezoelectric bulk wave filters 1. In this way, a piezoelectric bulk wave filter device with the piezoelectric bulk wave filters 1 encapsulated therein is produced. Electrodes 35a–35d are disposed on the casing substrate 35. The electrodes 35a–35d permit the piezoelectric bulk wave filters 1 to be electrically connected to each other while forming terminal electrodes to be routed out of the casing.

Referring to FIG. 15, two piezoelectric bulk wave filters 1 are preferably arranged side by side. Alternatively, the two piezoelectric bulk wave filters 1 may be mounted one on top of the other using an insulating adhesive agent.

Figure 16:
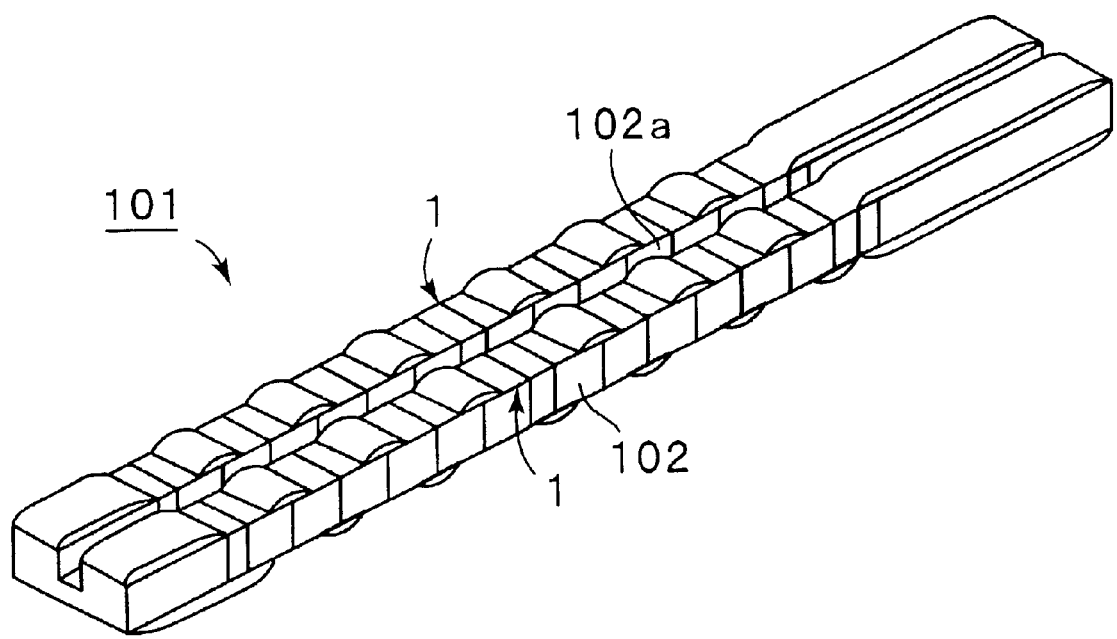
FIG. 16 is a perspective view of a multi-mode piezoelectric bulk wave filter with two filter elements being integrated.

In the example shown in FIG. 15, the two piezoelectric bulk wave filters 1 are prepared as separate units and then serially connected. Alternatively, the two piezoelectric bulk wave filters 1 may be integrated as shown in FIG. 16. As shown, a groove 102a is formed on the top of a single piezoelectric substrate 102 in a multi-mode piezoelectric bulk wave filter 101, and the same construction as the piezoelectric bulk wave filter 1 is formed on both sides of the groove 102a. The integration of the two multi-mode piezoelectric bulk wave filters 1 increases the selectivity of the filter. This is discussed more in detail with reference to FIGS. 17 and 18.

Figure 17:
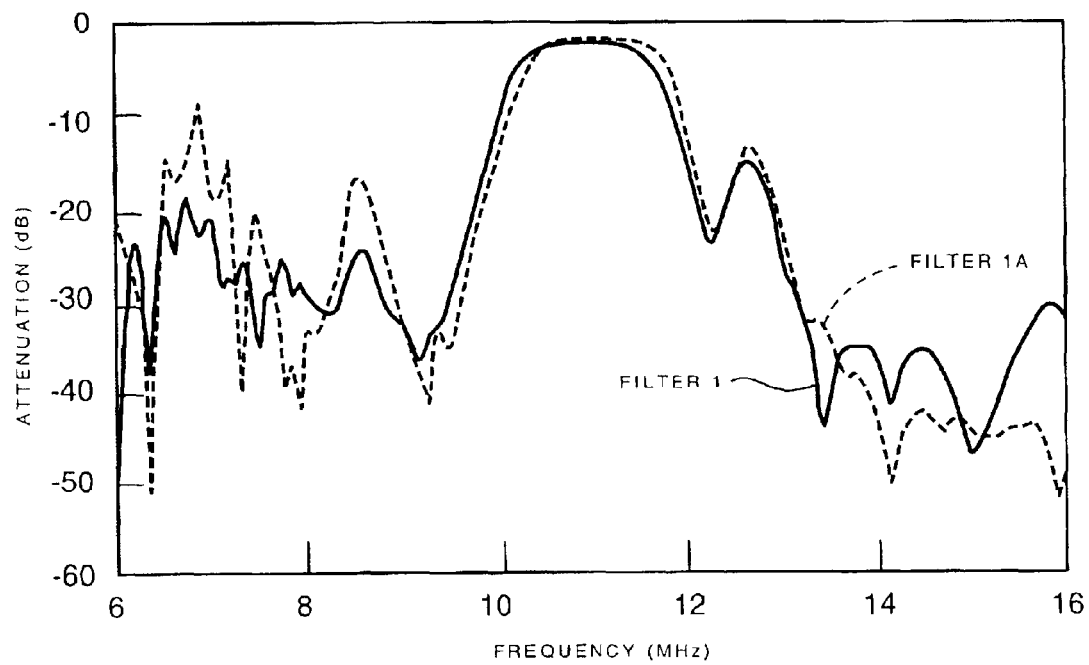
FIG. 17 shows attenuation versus frequency characteristics of a single-element multi-mode piezoelectric bulk wave filter.

FIG. 17 shows attenuation versus frequency characteristics of multi-mode piezoelectric bulk wave filters 1 and 1A in a solid line and broken line, respectively.

Figure 18:
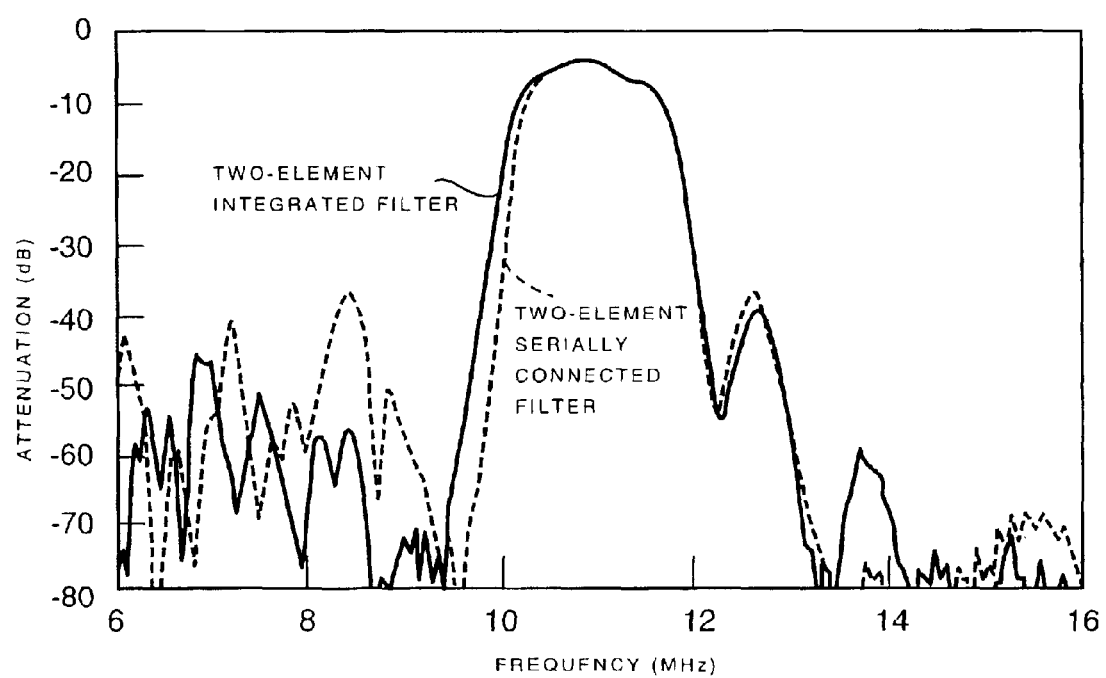
FIG. 18 shows attenuation versus frequency characteristics of serially connected two-element multi-mode piezoelectric bulk wave filters and integrated two-element multi-mode piezoelectric bulk wave filter.

FIG. 18 shows attenuation versus frequency characteristics of multi-mode piezoelectric bulk wave filters 1 and 1A connected in series in a broken line and attenuation versus frequency characteristics of multi-mode piezoelectric bulk wave filters 1 and 1A in an integrated form in a solid line.

As represented by the solid line in FIG. 18, the integration of multi-mode piezoelectric bulk wave filters 1 and 1A not only increases selectivity but also expands the bandwidth.

Figure 19:
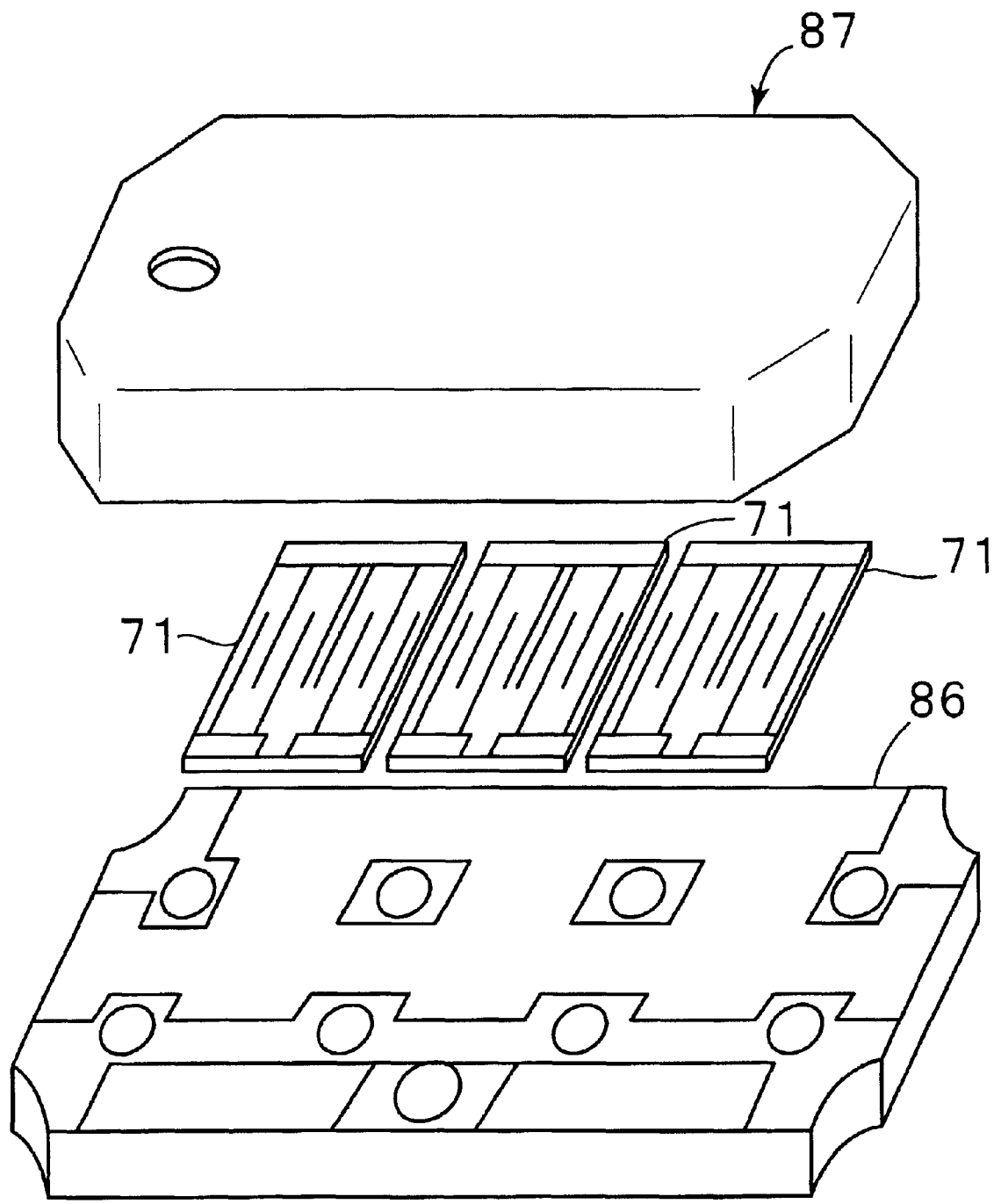
FIG. 19 is an exploded perspective view of a filter device including a plurality of filter elements of multi-mode piezoelectric bulk wave filter of the third preferred embodiment of the present invention.

As shown in FIG. 19, three multi-mode piezoelectric bulk wave filters 71 shown in FIG. 14 may be mounted on a casing substrate 86. Furthermore, a cap member 87 may be fixed to the casing substrate 86. The cap member 87 is fixed to the casing substrate 86 in such a manner that the cap member 87 covers the three multi-mode piezoelectric bulk wave filters 71.

Figure 22A:
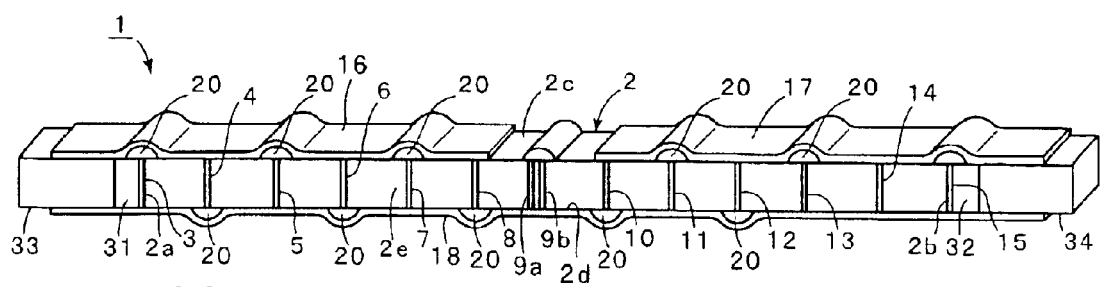
FIG. 22A is a perspective view of the multi-mode piezoelectric bulk wave filter of a fourth preferred embodiment of the present invention.
Figure 22B:
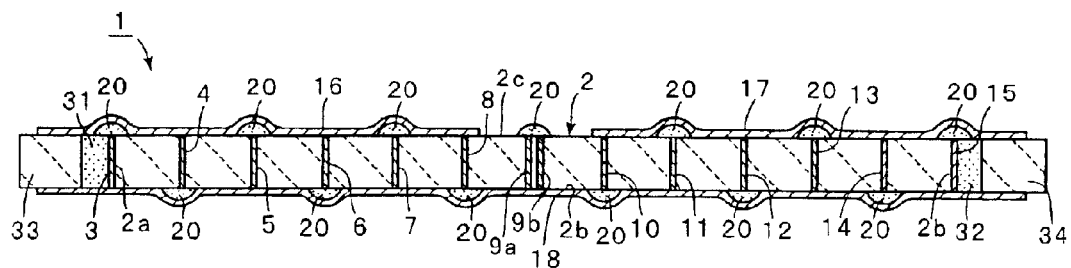
FIG. 22B is a longitudinal cross-sectional view of the multi-mode piezoelectric bulk wave filter of the fourth preferred embodiment of the present invention.

FIG. 22A is a perspective view of the triple-mode piezoelectric bulk wave filter 1 of a fourth preferred embodiment of the present invention, and FIG. 22B is a longitudinal cross-sectional view of the multi-mode piezoelectric bulk wave filter of the fourth preferred embodiment of the present invention.

The piezoelectric bulk wave filter 1 includes a bar-like piezoelectric body 2 having a substantially rectangular shape in cross section. The piezoelectric bulk wave filter 1 is a triple-mode piezoelectric bulk wave filter which uses harmonic waves of the length mode vibration based on the piezoelectric longitudinal effect propagating in the direction of length of the piezoelectric body 2.

The materials of the piezoelectric body 2 include, but are not limited to, a lead-zirconate-titanate ceramic in the present preferred embodiment of this invention. The acoustic impedance $Z_1$ of the piezoelectric body 2 is preferably approximately $3.40 \times 10^7$ kg/m²S.

The piezoelectric body 2 has first and second end surfaces 2a and 2b opposed to each other in the direction of length thereof. Reflective layers 31 and 32 are respectively attached to the end surfaces 2a and 2b, and support members 33 and 34 are then respectively attached to the reflective layers 31 and 32. The reflective layers 31 and 32 and support members 33 and 34 preferably have the same shape in cross section as the piezoelectric body 2. The reflective layers 31 and 32, preferably made of an epoxy resin, have an acoustic impedance $Z_2$ of, for example, approximately $1.87 \times 10^6$ (kg/m²S). The support members 33 and 34, preferably made of a ceramic, has an acoustic impedance $Z_3$ of, for example, approximately $3.40 \times 10^7$ (kg/m²S).

Excitation electrodes 3 and 15 are arranged to cover the end surfaces 2a and 2b. The piezoelectric body 2 is distributed in the direction of length thereof, and includes a plurality of excitation electrodes 4–14 extending in the direction of width of the piezoelectric body 2.

The excitation electrodes 3–15 are arranged substantially parallel to each other. Adjacent excitation electrodes are arranged opposed to each other with the piezoelectric layer sandwiched therebetween. The thicknesses of the piezoelectric layers between the adjacent excitation electrodes are preferably uniform in the fourth preferred embodiment. It is not a requirement that all piezoelectric layers have equal thicknesses.

Each piezoelectric layer between any two adjacent ones of the excitation electrodes 3–15 in the piezoelectric body 2 is polarized in a direction that is substantially perpendicular to the excitation electrodes 3–15.

The excitation electrodes 3–15 are preferably produced together with the piezoelectric ceramic forming the piezoelectric body 2 using a ceramic lamination and integral firing technique. Another technique may be used to produce the piezoelectric body 2 and excitation electrodes 3–15.

The excitation electrodes 3 and 15 may be formed on the end surfaces 2a and 2b, respectively, after the piezoelectric body 2 including the excitation electrodes 4–14 is produced using the ceramic lamination and integral firing technique.

The piezoelectric body 2 has a top surface 2c, bottom surface 2d, and side surfaces 2e (one side surface not shown) defining first through fourth side surfaces that connect the end surfaces 2a and 2b. An input electrode 16 is disposed on the top surface 2c defining the first side surface closer to the end surface 2a, and an output electrode 17 is disposed on the top surface 2c closer to the end surface 2b. A ground electrode 18 is disposed on the bottom surface 2d defining the second side surface. The input electrode 16 extends beyond the end surface 2a and reflective layer 31, reaching the support member 33. The output electrode 17 extends beyond the end surface 2b and reflective layer 32, reaching the support member 34.

The ground electrode 18 extends on the bottom surface 2d beyond the reflective layers 31 and 32 and reaches the surfaces of the support members 33 and 34.

The input electrode 16, output electrode 17, and ground electrode 18 may be fabricated of the same metal as the excitation electrode 3–15, for example, may be fabricated of copper, nickel, or silver, or other suitable material.

Insulating materials 20 are deposited on the top surface 2c to be in contact with the top ends of the excitation electrodes 3, 5, 7, 9a, 9b, 11, 13, and 15. The excitation electrodes 3, 5, 7, 9a, 9b, 11, 13, and 15 are electrically insulated from the input electrode 16 and output electrode 17. The excitation electrodes 3, 5, 7, 9a, 9b, 11, 13, and 15 are respectively electrically connected to the ground electrode 18 on the bottom surface 2d of the piezoelectric body 2.

Insulating materials 20 are also deposited on the bottom surface 2d of the piezoelectric body 2 to be in contact with the bottom ends of the excitation electrodes 4, 6, 8, 10, 12, and 14. The excitation electrodes 4, 6, 8, 10, 12, and 14 are electrically insulated from the ground electrode 18. The excitation electrodes 4, 6, and 8 are respectively electrically connected to the input electrode 16, and the excitation electrodes 10, 12, and 14 are respectively electrically connected to the output electrode 17.

The excitation electrodes 4, 6, and 8 arranged closer to the end surface 2a constitute a first group, and the excitation electrodes 10, 12, and 14 constitute a second group. The excitation electrodes 3, 5, 7, 9a, 9b, 11, 13, and 15 constitute a third group of the excitation electrodes in the present preferred embodiment of the present invention.

In the direction of length of the piezoelectric body 2, i.e., the direction of lamination of the piezoelectric layers, the excitation electrodes 4, 6, and 8 in the first group and the excitation electrodes 3, 5, 7, and 9a in the third group are arranged with the first group electrode alternating with the third group electrode. Likewise, the excitation electrodes 10, 12, and 14 in the second group and the excitation electrodes 11, 13, and 15 in the third group are arranged with the second group electrode alternating with the third group electrode.

In the fourth preferred embodiment, each of the excitation electrodes 3–15 extends over the full cross section of the piezoelectric body 2. It is also acceptable that each of the excitation electrodes 3–15 extends over a portion of the cross section of the piezoelectric body 2.

The insulating materials 20 are not limited to any particular material. The insulating materials 20 may be an insulating resin or an insulating adhesive agent as long as the insulating materials 20 electrically insulate the excitation electrodes from each of the input electrode 16, output electrode 17, and ground electrode 18.

The operation of the multi-mode piezoelectric bulk wave filter 1 of the fourth preferred embodiment will now be discussed.

Figure 23:
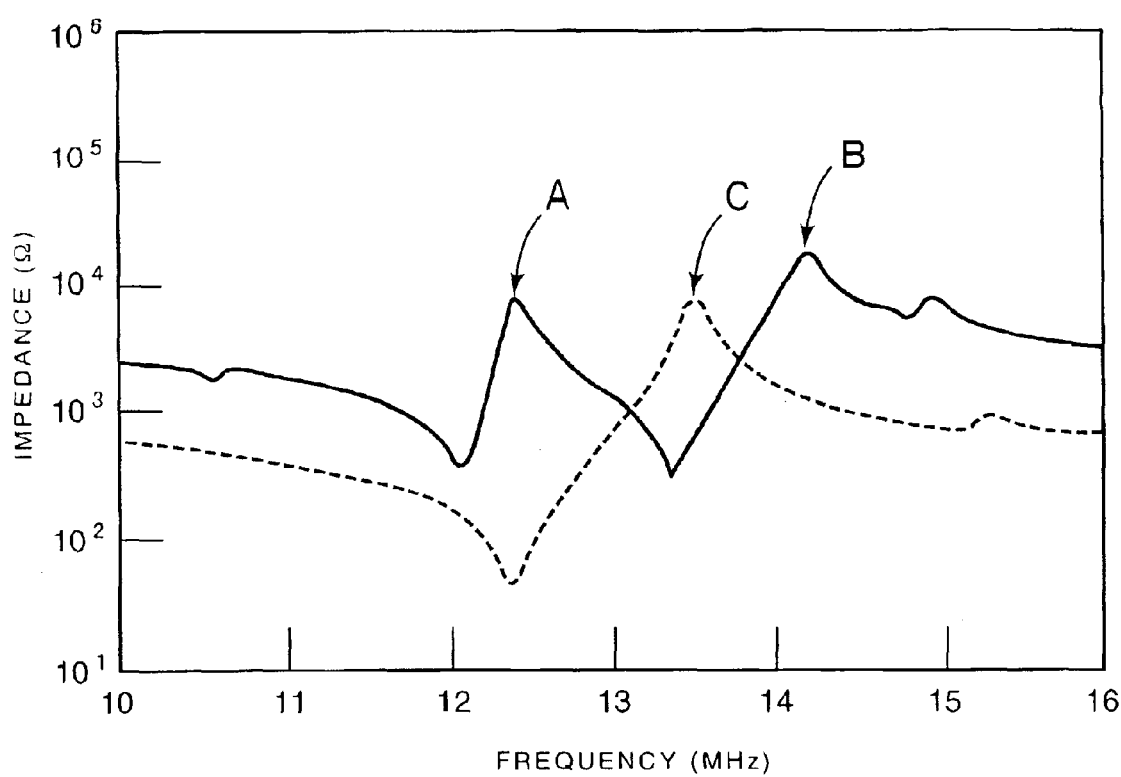
FIG. 23 shows a symmetrical mode and anti-symmetrical mode excited in the multi-mode piezoelectric bulk wave filter of the fourth preferred embodiment of the present invention.

The multi-mode piezoelectric bulk wave filter 1 of the fourth preferred embodiment is produced. The thickness of the piezoelectric body 2, i.e., the height between the top surface 2c and bottom surface 2d of the piezoelectric body 2, is preferably about 110 $\mu$m, the width dimension of the piezoelectric body 2 is preferably about 300 $\mu$m, and the thickness of the piezoelectric layer between adjacent excitation electrodes is preferably about 130 $\mu$m. When an AC voltage is applied between the input electrode 16 and ground electrode 18, vibration modes excited are shown in FIG. 23.

As shown, a broke line represents a symmetrical mode, and a solid line represents an anti-symmetrical mode. Arrows A and B respectively represent 11th and 13th harmonic waves, and an arrow C represents a 12th harmonic wave.

The multi-mode piezoelectric bulk wave filter 1 of the fourth preferred embodiment is efficiently excited on the 11th through 13th harmonic waves of the length vibration based on the piezoelectric longitudinal effect.

With the 11th through 13th harmonic waves coupled, the piezoelectric bulk wave filter 1 presents the filter characteristics thereof.

Figure 24:
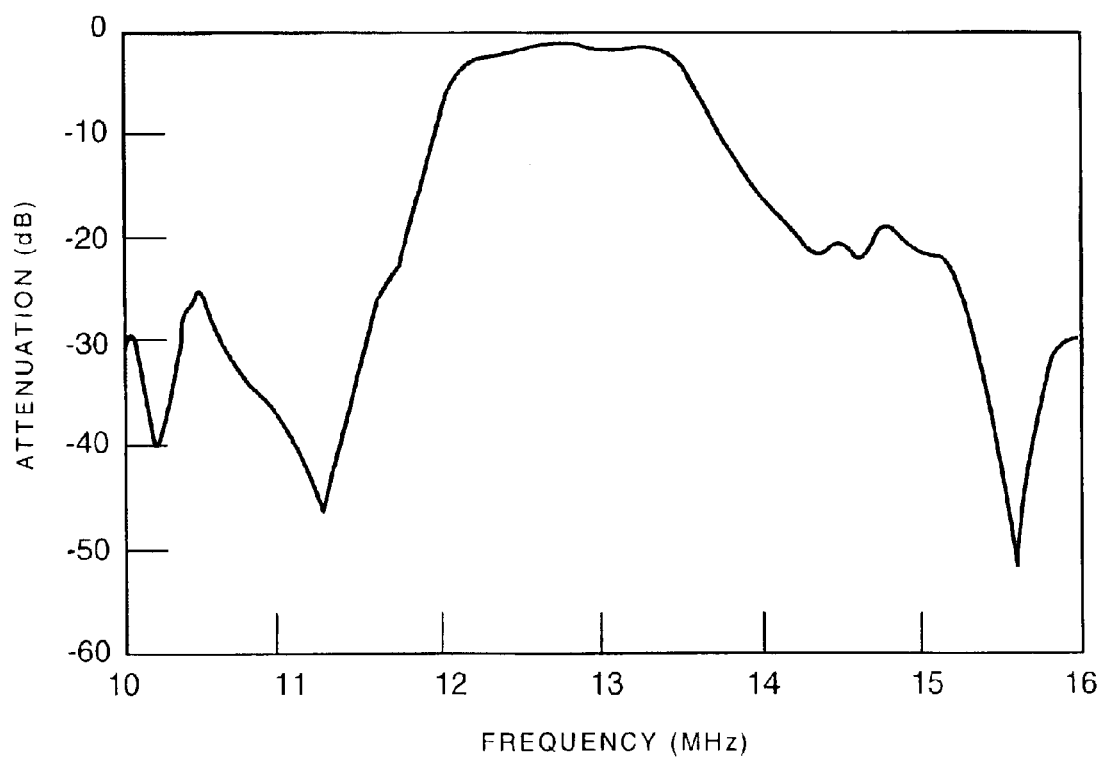
FIG. 24 shows attenuation versus frequency characteristics of the multi-mode piezoelectric bulk wave filter of the fourth preferred embodiment of the present invention.

FIG. 24 shows filter characteristics of the piezoelectric bulk wave filter 1 obtained in response to the input signal.

As shown, wide band filter characteristics having a center frequency of about 12.8 MHz are obtained.

The inventors of the present invention have studied what combination of modes results in excellent filter characteristics. The results of study are discussed with reference to FIGS. 25–28.

Figure 25:
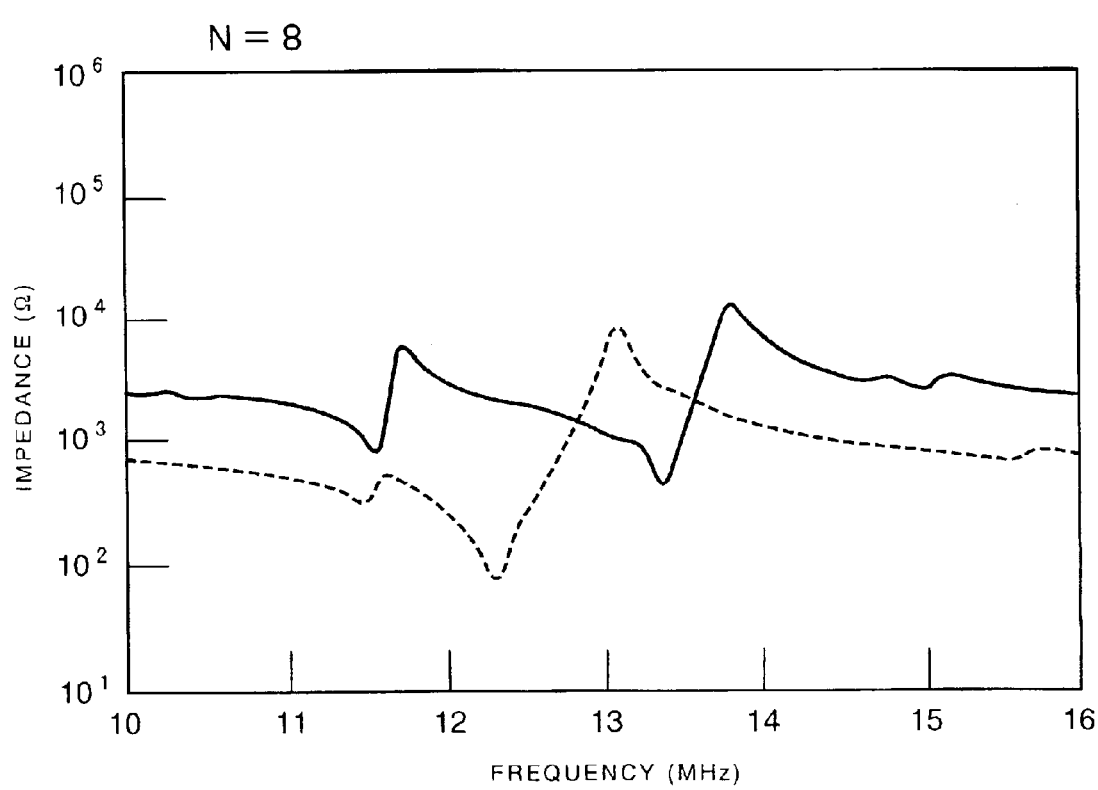
FIG. 25 shows a symmetrical mode and anti-symmetrical mode wherein the order N of harmonic waves satisfies the conditions of Fa(N−1)<Fr and Fa(N)<Fr(N+1) in the multi-mode piezoelectric bulk wave filter.
Figure 26:
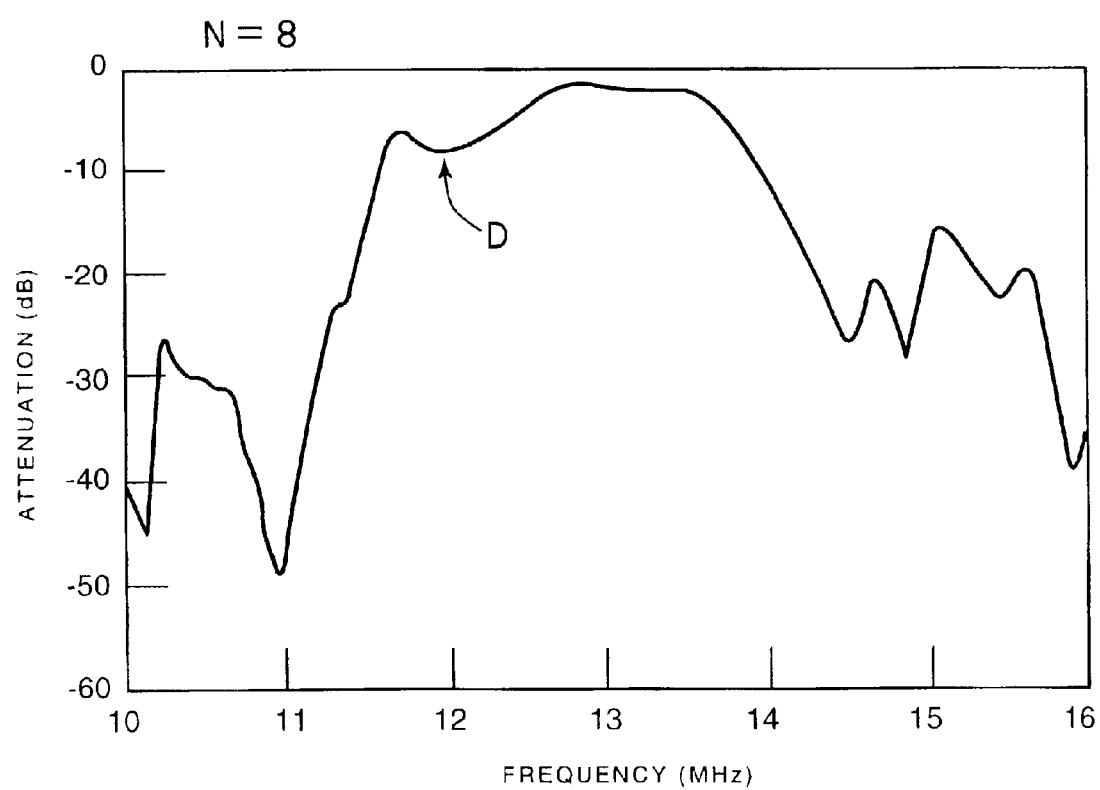
FIG. 26 shows attenuation versus frequency characteristics of the multi-mode piezoelectric bulk wave filter which uses an (N−1)-th harmonic wave, N-th harmonic wave, and (N+1)-th harmonic wave shown in FIG. 25.

FIGS. 25–28 show filter characteristics with the orders of harmonic waves of the length vibration modes in use varied. Referring to FIG. 25, a broken line represents the filter response of an 8th harmonic waves (i.e., N=8) of the piezoelectric bulk wave filter 1 in the symmetrical mode, and a solid line represents the filter response of 7th and 9th harmonic waves in the anti-symmetrical mode. FIG. 26 shows filter characteristics with the 7th through 9th harmonic waves with the order N=8 coupled. As shown, a ripple represented by an arrow D appears in the passband of the filter.

Figure 27:
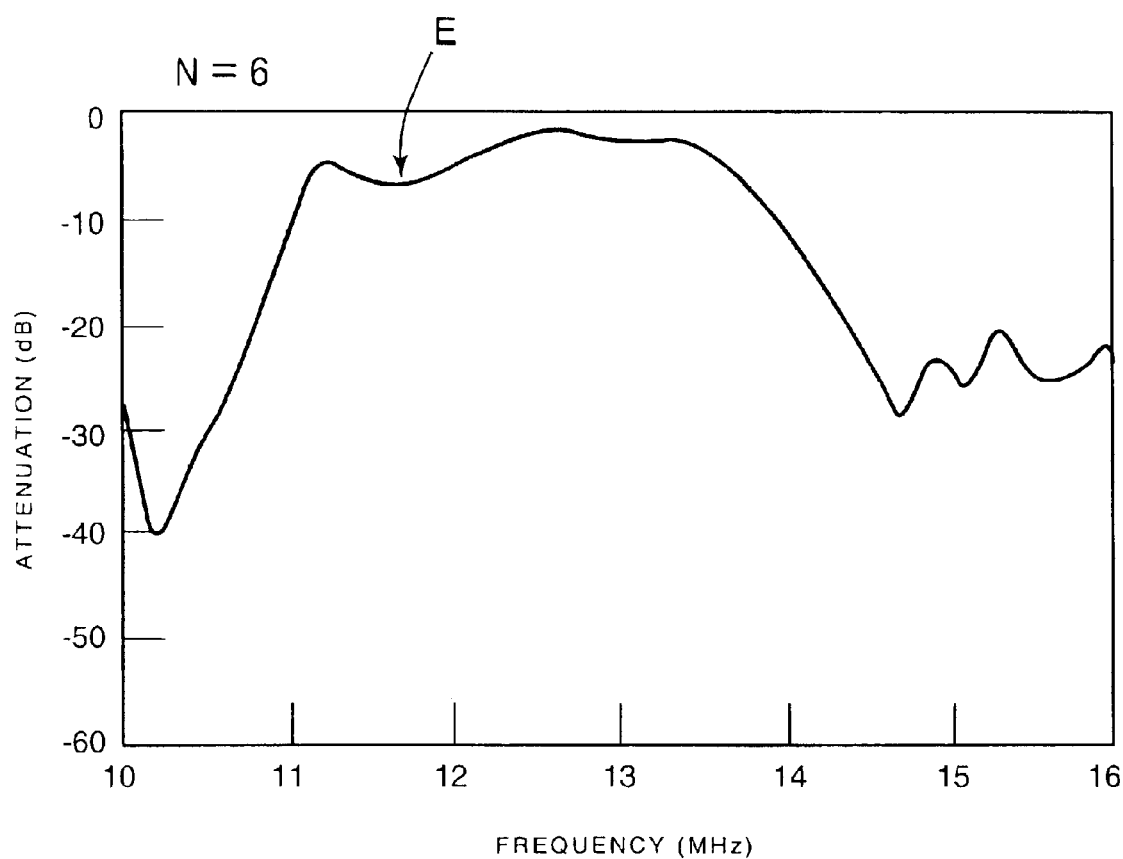
FIG. 27 shows attenuation versus frequency characteristics of the multi-mode piezoelectric bulk wave filter having the order N=6.
Figure 28:
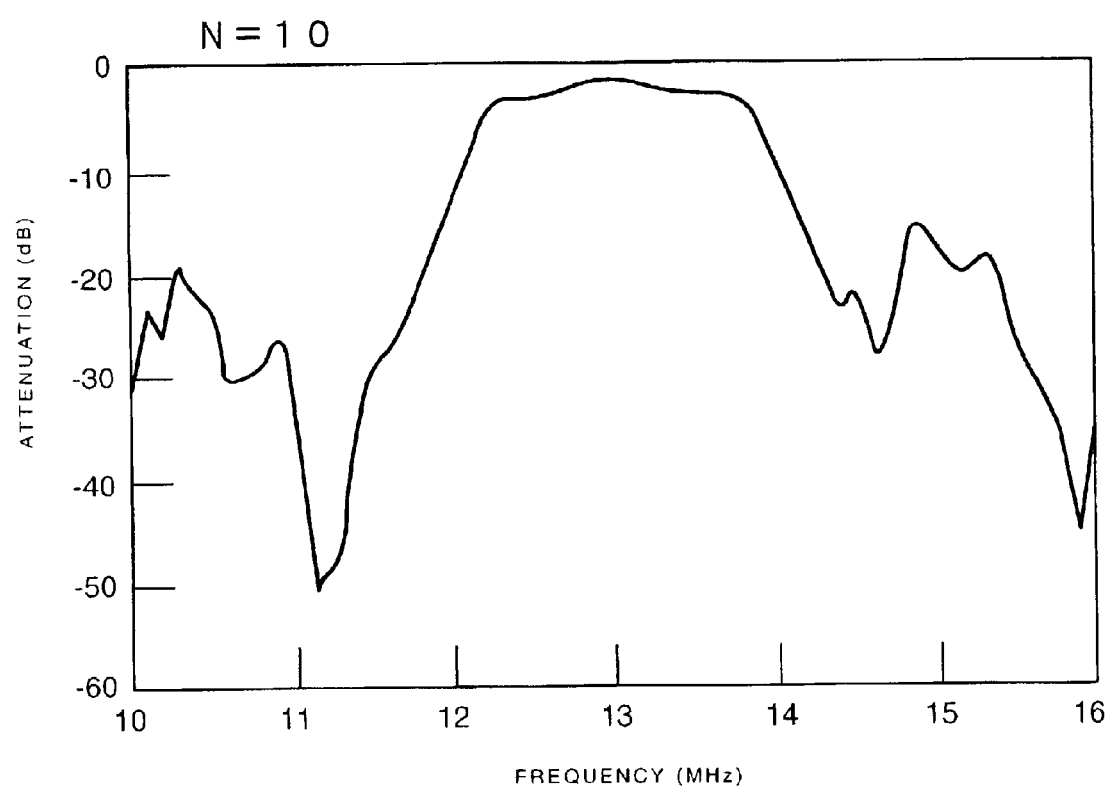
FIG. 28 shows attenuation versus frequency characteristics of the multi-mode piezoelectric bulk wave filter having the order N=10.

FIGS. 27 and 28 show filter characteristics with the order N=6 and N=10, respectively. As shown in FIG. 27, a large ripple represented by an arrow E appears in the passband even with the order N=6. As shown in FIG. 28, no large ripples appear in the passband with the order N=10.

As understood from the results shown in FIGS. 24, and 26–28, the higher the order N, the more the ripple within the passband is reduced. When filter characteristics are obtained by coupling three consecutive harmonic waves of an (N−1)-th harmonic wave, N-th harmonic wave, and (N+1)-th harmonic wave, excellent filer characteristics result if conditions Fa(N−1)≧Fr(N) and Fa(N)≧Fr(N+1) are satisfied.

Here, Fa represents an anti-resonance frequency, and Fr represents a resonance frequency.

Since conditions Fa(11)>Fr(12) and Fa(12)>Fr(13) are satisfied with N=12 as shown in FIG. 23, excellent filter characteristics are obtained as shown in FIG. 24.

With the order N getting smaller, the 7th harmonic wave is spaced away from the 8th harmonic wave as clearly shown in FIG. 25, and Fa(7)<Fr(8) and Fa(8)<Fr(9) are satisfied. The above-mentioned ripple D appears.

If the order N is selected to satisfy the conditions Fa(N−1)≧Fr(N) and Fa(N)≧Fr(N+1) in the piezoelectric bulk wave filter 1, the first through third modes are reliably coupled, and excellent filter characteristics are obtained.

The frequencies of the first through third modes are separated in accordance with the ratio of orders of harmonic waves in use in the multi-mode piezoelectric bulk wave filter 1. The frequency of each mode is independent of the spacing between the excitation electrodes. In conventional transverse-coupled multi-mode piezoelectric bulk wave filters, the frequency of each mode depends on the spacing between excitation electrodes. To achieve a desired bandwidth, the order of harmonic corresponding to the bandwidth is simply selected. Filter characteristics of wide band are easily achieved. In an attempt to achieve a wideband, the formation of segmented excitation electrodes is difficult in the conventional transversely-coupled multi-mode filter. In contrast, the wide bandwidth is easily achieved in the piezoelectric bulk wave filter 1 of the fourth preferred embodiment of the present invention.

The conventional transverse-coupled multi-mode filter has the drawback that the attenuation of the filter cannot be sufficiently large. The attenuation in the piezoelectric bulk wave filter depends on a ratio of a capacitance $C_{I-G}$ between the input electrode and ground electrode to a capacitance $C_{I-O}$ between the input electrode and output electrode. The smaller the capacitance between the input and output electrode to the capacitance between the input electrode and the ground electrode, the greater the attenuation becomes. Since the excitation electrodes connected to the ground electrode 18 are present between the excitation electrodes connected to the input electrode 16 and output electrode 17, the capacitance between the input electrode 16 and output electrode 17 becomes extremely small. The piezoelectric bulk wave filter 1 of the fourth preferred embodiment becomes large in attenuation compared with the conventional multi-mode filter.

Figure 29:
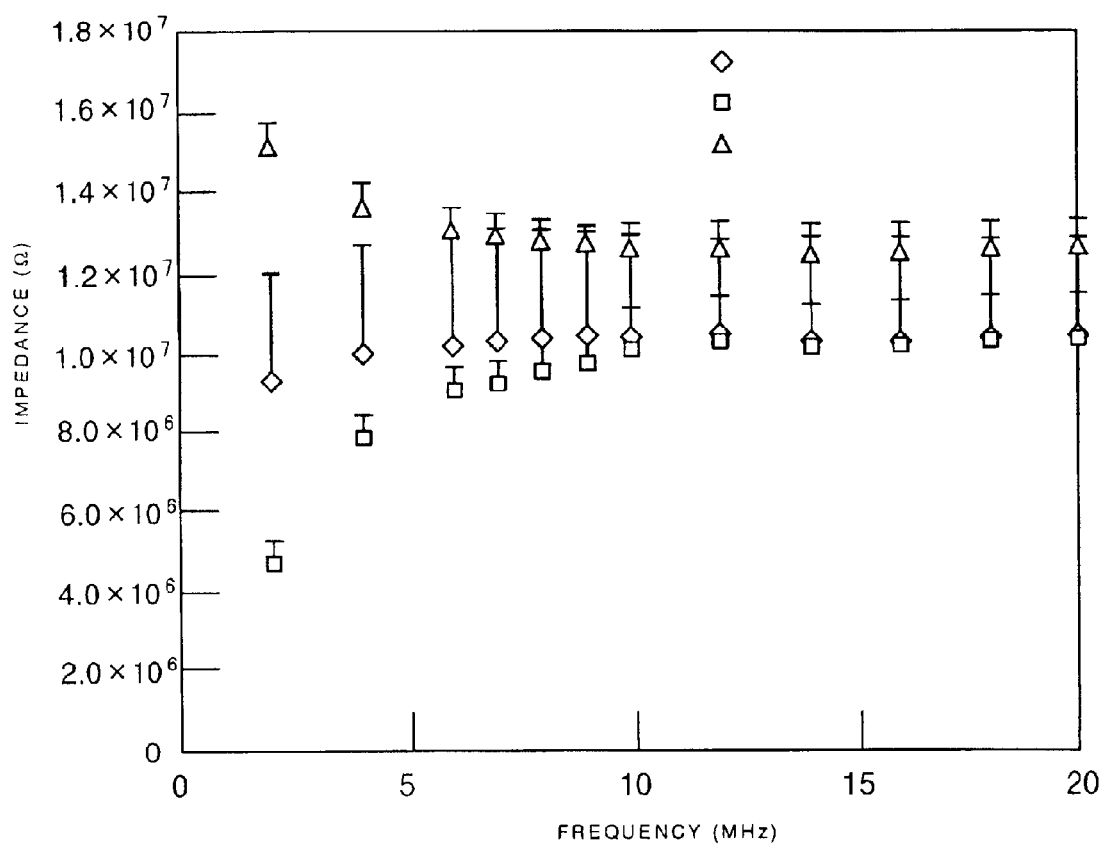
FIG. 29 shows the order N and variations in positions of resonance frequency and anti-resonance frequency at the N-th harmonic wave, (N−1)-th harmonic wave, and (N+1)-th harmonic wave in the multi-mode piezoelectric bulk wave filter of the fourth preferred embodiment of the present invention.

As already discussed, the larger the order N, the more the conditions Fa(N−1)≧Fr(N) and Fa(N)≧Fr(N+1) are satisfied in the multi-mode piezoelectric bulk wave filter 1. The inventors of this invention have determined the resonance frequency Fr and anti-resonance frequency Fa of the (N−1)-th harmonic wave, N-th harmonic wave, and (N+1)-th harmonic wave with respect to various orders N in the multi-mode piezoelectric bulk wave filter 1. FIG. 29 shows the results of determination. As shown, diamond symbols represent N-th harmonic resonance frequencies, square symbols represent (N−1)-th harmonic resonance frequencies, and triangle symbols represent (N+1)-th harmonic resonance frequencies. The anti-resonance frequencies of the N-th harmonic waves, (N−1)-th harmonic waves, and (N+1)-th harmonic waves are represented by ends of error bars.

As shown in FIG. 29, the conditions Fa(N−1)≧Fr(N) and Fa(N)≧Fr(N+1) are satisfied with the order N equal to or greater than 9. The order N is preferably equal to or greater than 9.

The inventors of this invention have studied how the electromechanical coefficient and elastic compliance $S_{33}^E$ of the piezoelectric body 2 are set with respect to the order to satisfy the conditions $Fa(N-1) \geq Fr(N)$ and $Fa(N) \geq Fr(N+1)$.

Figure 30:
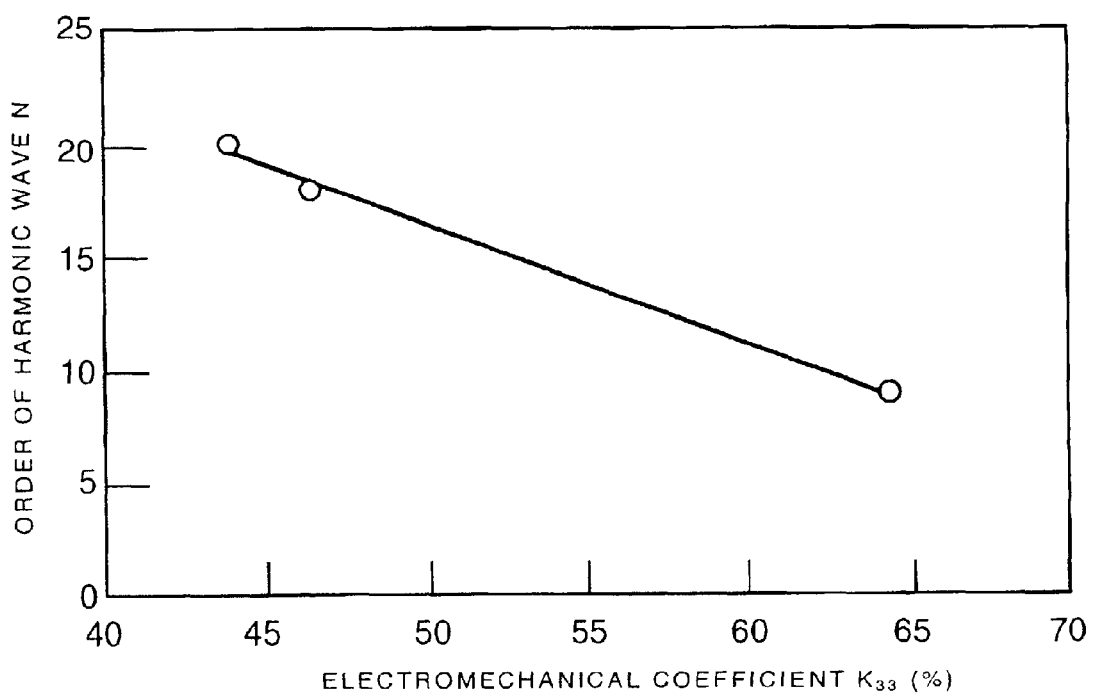
FIG. 30 shows the relationship between the electromechanical coefficient $K_{33}$ of a piezoelectric body and the minimum order N of harmonic wave satisfying the conditions of Fa(N−1)≧Fr(N) and Fa(N)≧Fr(N+1)

FIG. 30 shows the results of determination of the order N satisfying the conditions of $Fa(N-1) \geq Fr(N)$ and $Fa(N) \geq Fr(N+1)$ with the materials forming the piezoelectric body 2 changed. Referring to FIG. 30, the abscissa represents the electromechanical coefficient $K_{33}$, and the ordinate represents the order N satisfying the conditions. In an area above the straight line of FIG. 30, the conditions of $Fa(N-1) \geq Fr(N)$ and $Fa(N) \geq Fr(N+1)$ are satisfied.

If the order N is determined in response to the electromechanical coefficient $K_{33}$ to satisfy the relationship of $N \geq -0.524K_{33}+42.7$ in FIG. 30, the conditions of $Fa(N-1) \geq Fr(N)$ and $Fa(N) \geq Fr(N+1)$ are reliably satisfied. A minimum order N resulting in excellent filter characteristics in accordance with the electromechanical coefficient of the piezoelectric body 2 is determined referring to FIG. 30.

Figure 31:
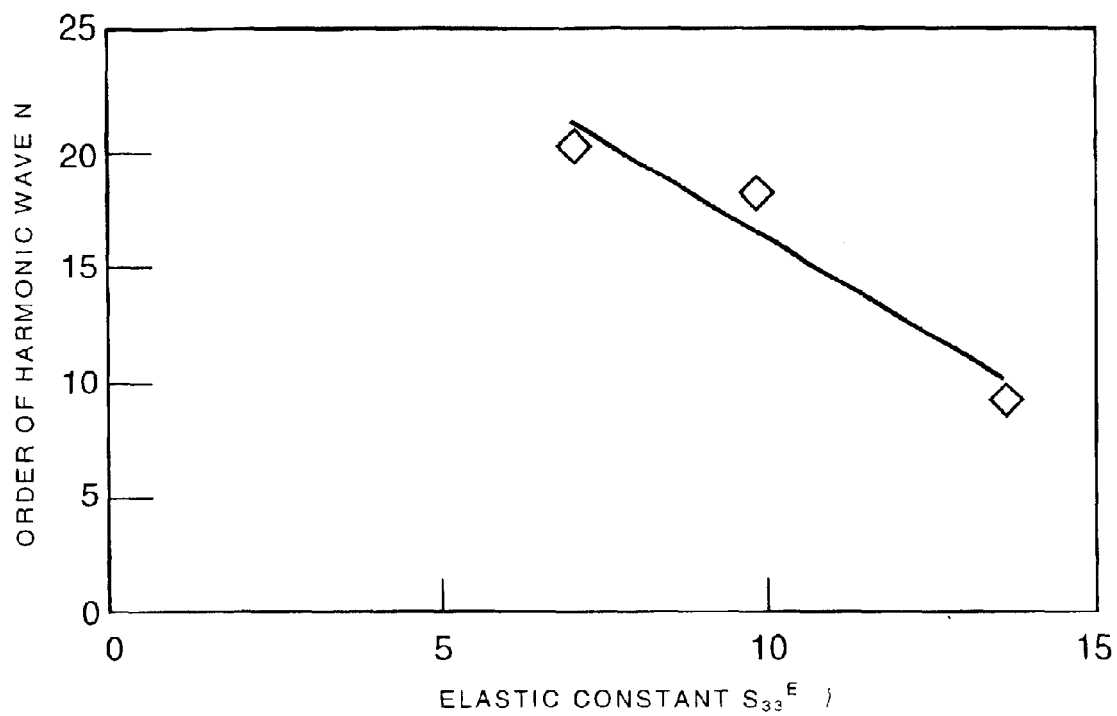
FIG. 31 shows the relationship between an elastic compliance $S_{33}^{E}$ of the piezoelectric body and the minimum order N of harmonic wave satisfying the conditions of Fa(N−1)≧Fr(N) and Fa(N)≧Fr(N+1)

FIG. 31 shows the relationship between an elastic compliance $S_{33}^E$ of the piezoelectric body 2 and the minimum order N of harmonic wave satisfying the conditions of $Fa(N-1) \geq Fr(N)$ and $Fa(N) \geq Fr(N+1)$.

The straight line in FIG. 31 represents $N = -1.73 S_{33}^E + 33.3$. The order N is easily determined in response to $S_{33}^E$ to satisfy the relationship $N = -1.73 S_{33}^E + 33.3$.

The whole piezoelectric body 2 is vibrated in the multi-mode piezoelectric bulk wave filter 1 of the fourth preferred embodiment. If the reflective layers 31 and 32 and support members 33 and 34 are not arranged, the piezoelectric body 2 must be mechanically supported by a spring, or other suitable element.

With the reflective layers 31 and 32 and support members 33 and 34 arranged, the piezoelectric bulk wave filter 1 is mechanically supported at the support members 33 and 34 thereof without any adverse effect on the filter characteristics thereof.

Since the acoustic impedance $Z_2$ of the reflective layers 31 and 32 is lower than each of the acoustic impedances $Z_1$ and $Z_2$ of the piezoelectric body 2 and support members 33 and 34 as already discussed, vibrations traveling from the piezoelectric body 2 are reflected from the boundaries of the reflective layers 31 and 32 and support members 33 and 34. In other words, vibration leakages to the support members 33 and 34 are almost completely controlled. Even if the support members 33 and 34 are mechanically supported, the filter characteristics of the piezoelectric bulk wave filter 1 are not adversely affected.

Figure 32:
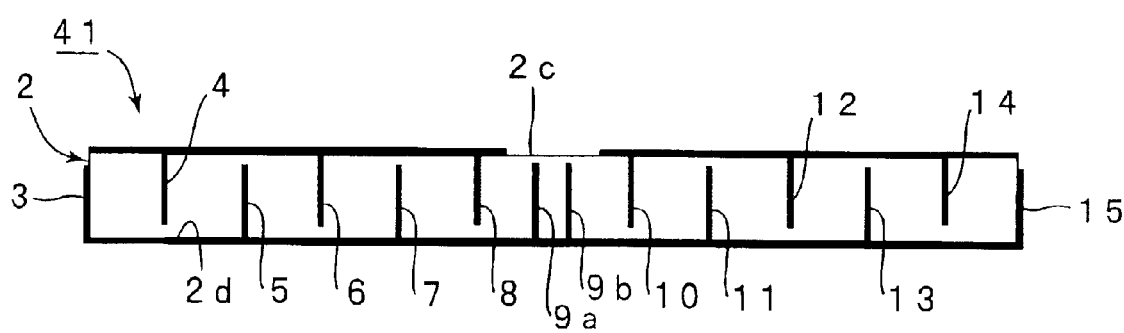
FIG. 32 shows a modification of the multi-mode piezoelectric bulk wave filter of the fourth preferred embodiment of the present invention.

FIG. 32 is a side view of a modification of the multi-mode piezoelectric bulk wave filter 1 of the fourth preferred embodiment. In the piezoelectric bulk wave filter 1, the insulating materials 20 are deposited on the top surface and bottom surfaces of the piezoelectric body 2 to electrically insulate the excitation electrodes 3, 5, 7, 9a, 9b, 11, 13, and 15 from the input electrode 16 or output electrode 17, and to electrically insulate the excitation electrodes 4, 6, 8, 10, 12, and 14 from the ground electrode 18. In the modification shown in FIG. 32, excitation electrodes 3–15 extend with the ends thereof not reaching alternately the top surface 2c or bottom surface 2d of the piezoelectric body 2. For example, the excitation electrode 4 extends with the end thereof not reaching the bottom surface 2d of the piezoelectric body 2, and the excitation electrode 5 extends with the end thereof not reaching the top surface 2c of the piezoelectric body 2. In this way, each of the excitation electrodes 3–15 has a gap to one of the top surface 2c and bottom surface 2d of the piezoelectric body 2. This arrangement eliminates the need for the deposition of the insulating materials 20 on the top surface 2c and bottom surface 2d of the piezoelectric body 2.

The reflective layers 31 and 32 and support members 33 and 34 are not shown in the multi-mode piezoelectric bulk wave filter 41 in FIG. 32. The reflective layers and support members are not necessarily installed in the piezoelectric bulk wave filters of preferred embodiments of the present invention.

The fourth preferred embodiment has been discussed in connection with the longitudinally-coupled multi-mode piezoelectric bulk wave filter using the length vibration mode. The present invention is not limited to the length vibration mode. Alternatively, harmonic waves of other vibration modes may be used.

Figure 33:
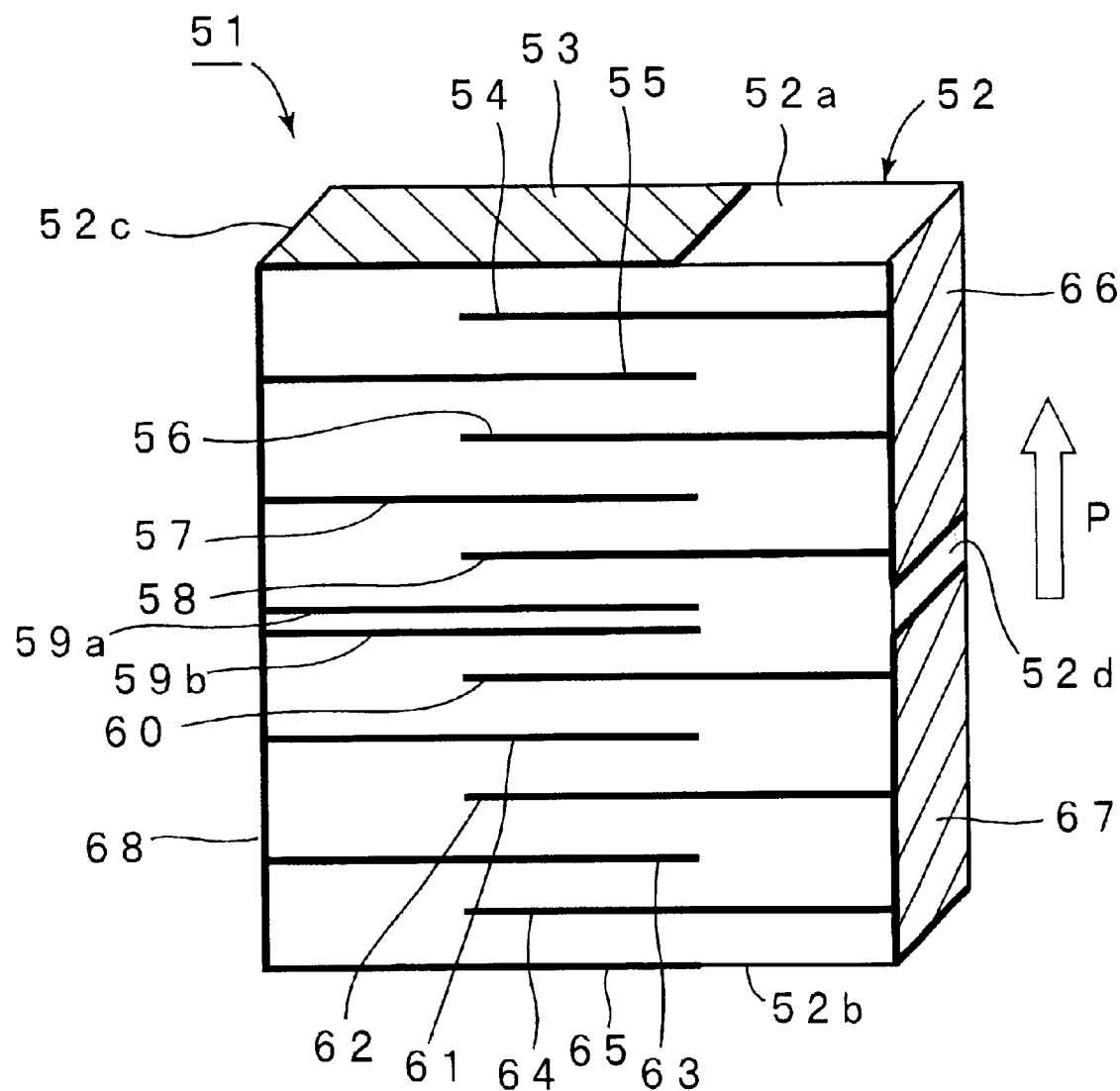
FIG. 33 is a perspective view of the multi-mode piezoelectric bulk wave filter in accordance with a fifth preferred embodiment of the present invention.

FIG. 33 is a perspective view of the energy-trapped triple-mode piezoelectric bulk wave filter 51 using harmonic waves of the thickness longitudinal vibration. The piezoelectric bulk wave filter 51 includes a laminated piezoelectric body 52. The laminated piezoelectric body 52 is uniformly polarized in the direction of thickness in FIG. 33, i.e., in the direction represented by an arrow P. The direction of thickness is aligned from a second end surface 52b to a first end surface 52a of the laminated piezoelectric body 52. Excitation electrodes 53 and 65 are disposed on the end surfaces 52a and 52b, respectively. A plurality of internal electrodes 54–64 are arranged in the piezoelectric body 52. The excitation electrodes 53–65 coextend with each other with piezoelectric layers sandwiched therebetween if viewed in the direction of thickness. The excitation electrodes 53–65 are routed out to side surfaces 52c and 52d, alternately.

The excitation electrodes 53, 55, 57, 59a, 59b, 61, 63, and 65 are electrically connected to a ground electrode 68 disposed on the side surface 52c. An input electrode 66 is disposed on the side surface 52d on the upper portion thereof, and an output electrode 67 is disposed on the side surface 52d on the lower portion thereof in FIG. 33. The excitation electrodes 54, 56, and 58 are electrically connected to the input electrode 66, and the excitation electrodes 60, 62, and 64 are electrically connected to the output electrode 67.

An energy trapped multi-mode piezoelectric bulk wave filter may be constructed using the laminated piezoelectric body 52 polarized in the direction of thickness. The harmonic waves of the thickness longitudinal vibration are then generated. An energy trapped multi-mode piezoelectric bulk wave filter thus is produced.

The piezoelectric bulk wave filter 51 has neither reflective layers nor support members. The excitation electrodes 53–65 partially coextend with each other with the piezoelectric layers sandwiched therebetween, and vibration energy is trapped in regions where the excitation electrodes 53–65 are opposed to each other. In other words, an energy trapped piezoelectric vibrating region is provided. Even if the piezoelectric bulk wave filter 51 is mechanically supported at the side surfaces 52c and 52d, the filter characteristics are not significantly adversely affected.

Figure 34:
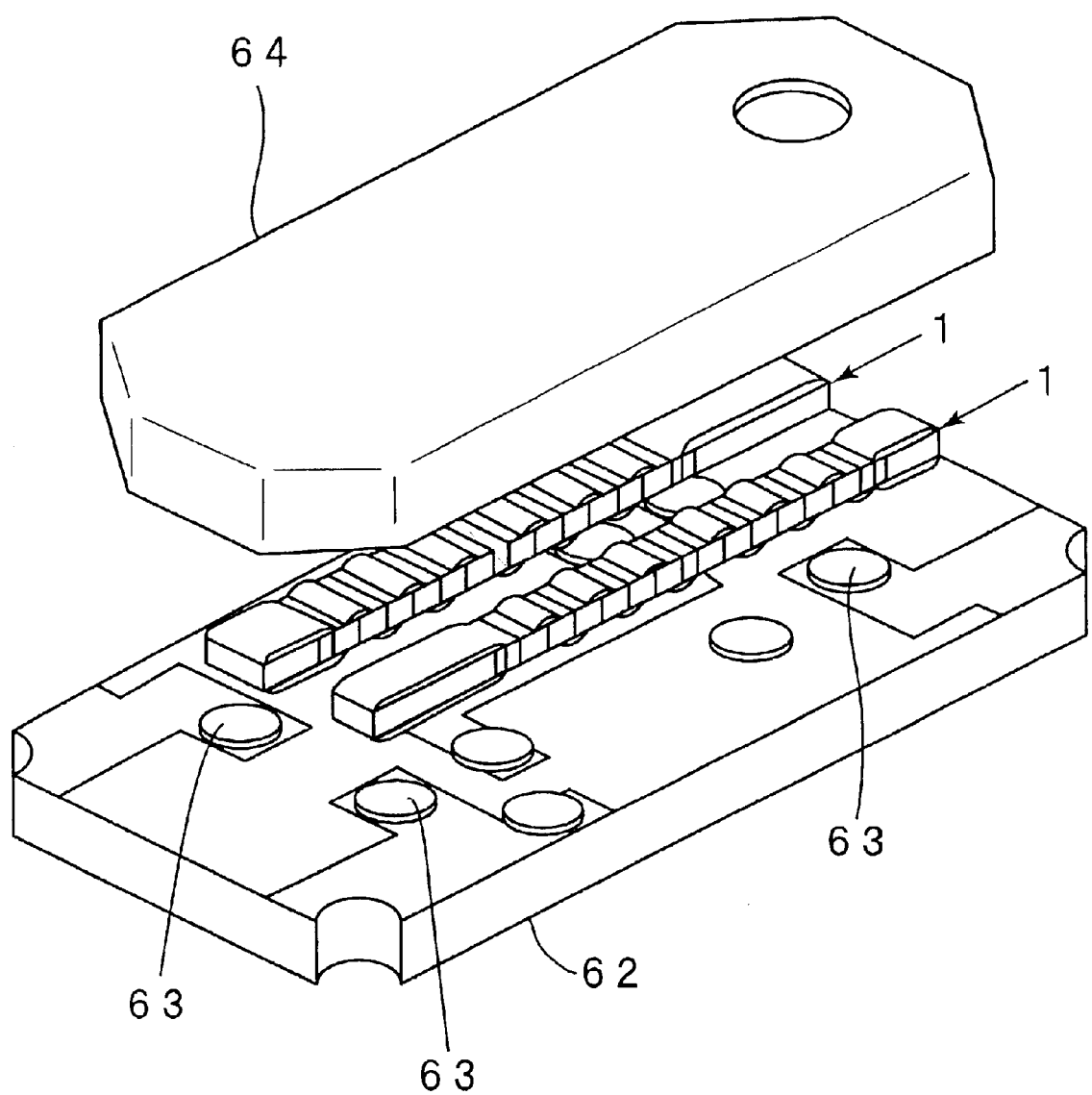
FIG. 34 is an exploded perspective view of a piezoelectric resonator as an electronic component including the multi-mode piezoelectric bulk wave filter of the fourth preferred embodiment of the present invention.
Figure 35:
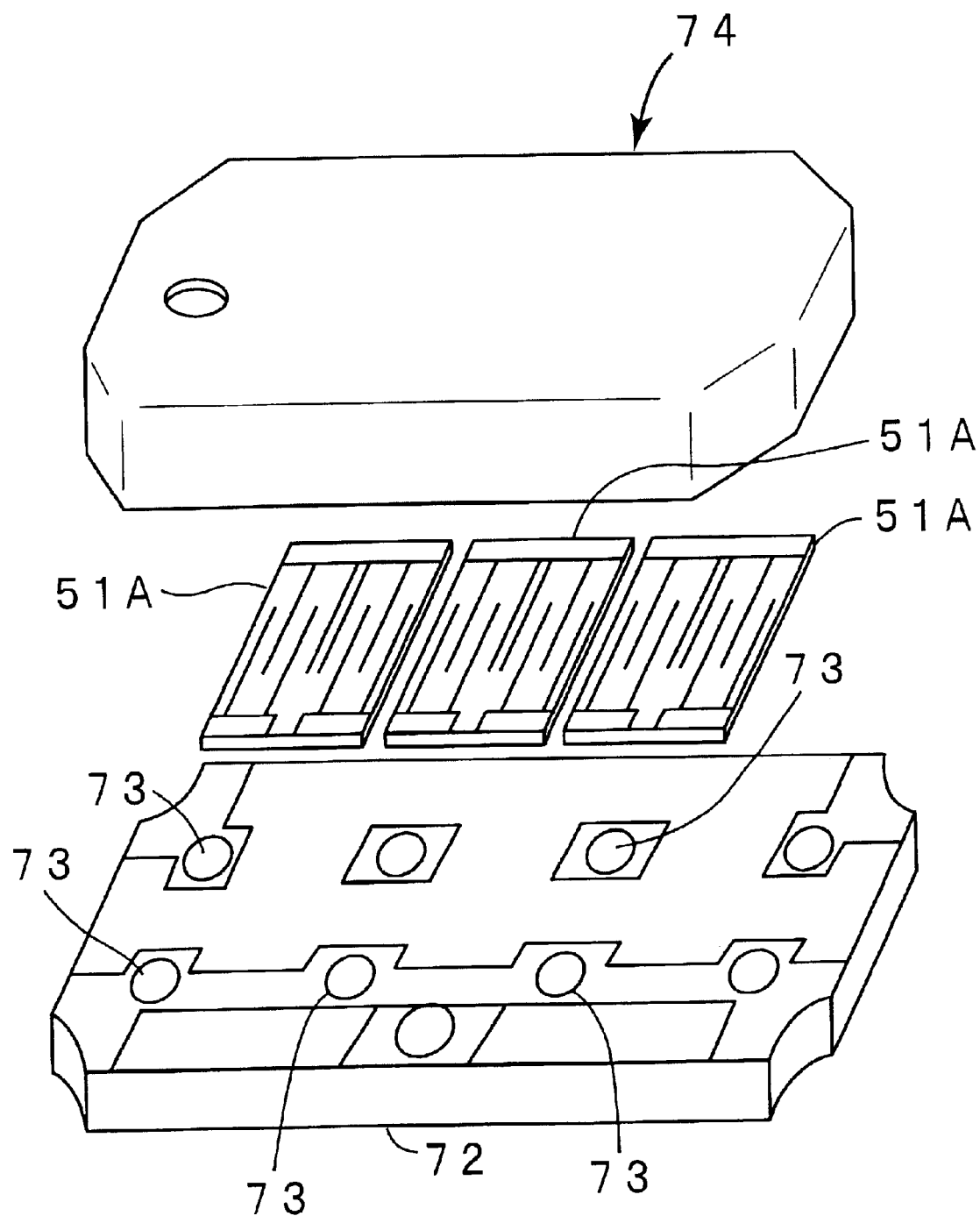
FIG. 35 is an exploded perspective view of a piezoelectric resonator as an electronic component including the multi-mode piezoelectric bulk wave filter of the fifth preferred embodiment of the present invention.

FIGS. 34 and 35 are exploded perspective views of a piezoelectric resonator as an electronic component including the multi-mode piezoelectric bulk wave filter of various preferred embodiments of the present invention.

As discussed above, the multi-mode piezoelectric bulk wave filter 1 of the fourth preferred embodiment includes the reflective layers 31 and 32 and support members 33 and 34. The piezoelectric bulk wave filter 1 is mechanically supported at the support members 33 and 34 thereof.

The piezoelectric resonator component 61 shown in FIG. 34 includes two piezoelectric bulk wave filters 1 of the fourth preferred embodiment mounted on a casing substrate 62. Specifically, the piezoelectric bulk wave filters 1 are connected together using an electrically conductive adhesive agent on the casing substrate 62.

A cap member 64 having a downward looking opening is bonded to the casing substrate 62, covering the piezoelectric bulk wave filters 1. The piezoelectric resonator component 61 including the piezoelectric bulk wave filters 1 is thus provided.

FIG. 35 is an exploded perspective view of a piezoelectric resonator as an electronic component including three multi-mode piezoelectric bulk wave filters 51A, each preferably being identical to the piezoelectric bulk wave filter 51 shown FIG. 33 except external dimensions. A piezoelectric resonator component 71 includes a casing substrate 72. The three piezoelectric bulk wave filters 51A are mounted and fixed on the casing substrate 72 using an electrically conductive adhesive agent 73. The electrically conductive adhesive agent 73 is deposited to a thickness that provides a gap between the casing substrate 72 and each of the three piezoelectric bulk wave filters 51A to allow a piezoelectric vibrating portion of each piezoelectric bulk wave filter 51A to vibrate.

A cap member 74 is fixed to the casing substrate 72, covering the three piezoelectric bulk wave filters 51A.

The cap members 64 and 74 are preferably fabricated of an electrically conductive material to electromagnetically shield the piezoelectric bulk wave filters 1 and piezoelectric bulk wave filters 51. If the cap members 64 and 74 are made of an electrically conductive material, the cap members 64 and 74 are bonded to the casing substrates 62 and 72 ensuring that the cap members 64 and 74 are electrically insulated from the electrodes on the casing substrates 62 and 72.

Figure 36:
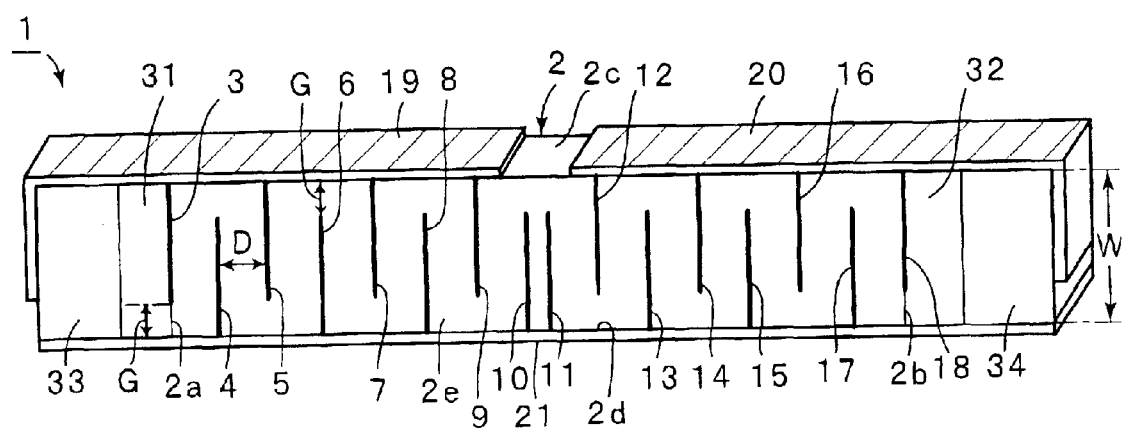
FIG. 36 is a perspective view of the multi-mode piezoelectric bulk wave filter in accordance with a sixth preferred embodiment of the present invention.

FIG. 36 is a perspective view of the triple-mode piezoelectric bulk wave filter 1 in accordance with a sixth preferred embodiment of the present invention.

The piezoelectric bulk wave filter 1 includes a bar-like piezoelectric body 2 having a substantially rectangular shape in cross section. The piezoelectric bulk wave filter 1 is a triple-mode piezoelectric bulk wave filter using the length vibration mode based on the piezoelectric longitudinal effect traveling in the direction of length of the piezoelectric body 2.

The materials of the piezoelectric body 2 include, but are not limited to, a lead-zirconate-titanate ceramic in the present preferred embodiment of this invention. The acoustic impedance $Z_1$ of the piezoelectric body 2 is, for example, approximately $3.40 \times 10^7$ kg/m²S.

The piezoelectric body 2 has first and second end surfaces 2a and 2b opposed to each other in the direction of length thereof. Reflective layers 31 and 32 are respectively attached to the end surfaces 2a and 2b, and support members 33 and 34 are then respectively attached to the reflective layers 31 and 32. The reflective layers 31 and 32 and support members 33 and 34 preferably have the same shape in cross section as the piezoelectric body 2.

The construction and operation of the reflective layers 31 and 32 and support members 33 and 34 will be discussed later.

Excitation electrodes 3 and 18 are arranged to cover the end surfaces 2a and 2b in the piezoelectric body 2, respectively. The piezoelectric body 2 is distributed in the direction of length thereof, and includes a plurality of excitation electrodes 4–17 extending in the direction of width of the piezoelectric body 2.

The excitation electrodes 3–18 are arranged substantially parallel to each other. The thicknesses of the piezoelectric layers between the adjacent excitation electrodes 3–9 and the thicknesses of the piezoelectric layers between the adjacent excitation electrodes 11–18 are preferably substantially uniform.

Each piezoelectric layer between any two adjacent ones of the excitation electrodes 3–10 and the excitation electrodes 11–18 in the piezoelectric body 2 is polarized in a direction that is substantially perpendicular to the excitation electrodes 3–18.

The excitation electrodes 3–18 are preferably produced together with the piezoelectric ceramic forming the piezoelectric body 2 using a ceramic lamination and integral firing technique. Another technique may be used to produce the piezoelectric body 2 and excitation electrodes 3–18. The excitation electrodes 3 and 18 may be formed on the end surfaces 2a and 2b, respectively, after the piezoelectric body 2 is produced using the ceramic lamination and integral firing technique.

The piezoelectric body 2 has four side surfaces connecting the end surfaces 2a and 2b. Specifically, the piezoelectric body 2 has a top surface 2c defining a first side surface, a bottom surface 2d defining a second side surface, and two opposed side surfaces 2e defining third and fourth side surfaces (the fourth side surface not shown).

An input electrode 19 is disposed on the top surface 2c closer to the end surface 2a, and an output electrode 20 is disposed on the top surface 2c closer to the end surface 2b. A ground electrode 21 is disposed on the bottom surface 2d.

The input electrode 19 extends beyond the end surface 2a and reflective layer 31, reaching the support member 33. The output electrode 20 extends beyond the end surface 2b and reflective layer 32, reaching the support member 34.

The input electrode 19, output electrode 20, and ground electrode 21 may be made of the same metal as the excitation electrode 3–18, for example, may be fabricated of copper, nickel, or silver, or other suitable material.

The excitation electrodes 3, 5, 7, and 9 extend from the top surface 2c of the piezoelectric body 2 downward with the lower ends thereof without reaching the bottom surface 2d. Likewise, the excitation electrodes 12, 14, 16, and 18 extend from the top surface 2c of the piezoelectric body 2 downward with the lower ends thereof without reaching the bottom surface 2d. The excitation electrodes 3, 5, 7, and 9, defining a first group, are electrically connected to the input electrode 19. The excitation electrodes 12, 14, 16, and 18, defining a second group, are electrically connected to the output electrode 20.

The excitation electrodes 4, 6, 8, 10, 11, 13, 15, and 17 extend from the bottom surface 2d of the piezoelectric body 2 upward with the upper ends thereof not reaching the top surface 2c. The excitation electrodes 4, 6, 8, 10, 11, 13, 15, and 17, defining a third group, are electrically connected to the ground electrode 21.

As shown in FIG. 36, the excitation electrodes 3, 5, 7, and 9 in the first group and the excitation electrodes 4, 6, 8, and 10 in the third group are alternately arranged in a direction aligned between the first and second end surfaces 2a and 2b, i.e., in the direction of length of the piezoelectric body 2. Likewise, the excitation electrodes 12, 14, 16, and 18 and the excitation electrodes 11, 13, 15, and 17 are alternately arranged in the direction of length of the piezoelectric body 2 on the side of the end surface 2b.

The reflective layers 31 and 32, preferably made of an epoxy resin, has an acoustic impedance $Z_2$ of, for example, about $1.87 \times 10^6$ (kg/m$^2$S). The support members 33 and 34, preferably made of a ceramic, has an acoustic impedance $Z_3$ of, for example, approximately $3.4 \times 10^7$ (kg/m$^2$S).

The materials of the reflective layers 31 and 32 and support members 33 and 34 are not limited to any particular materials as long as the acoustic impedance $Z_2$ is lower than each of the acoustic impedances $Z_1$ and $Z_3$.

The operation of the multi-mode piezoelectric bulk wave filter 1 of the sixth preferred embodiment will now be discussed.

Figure 37:
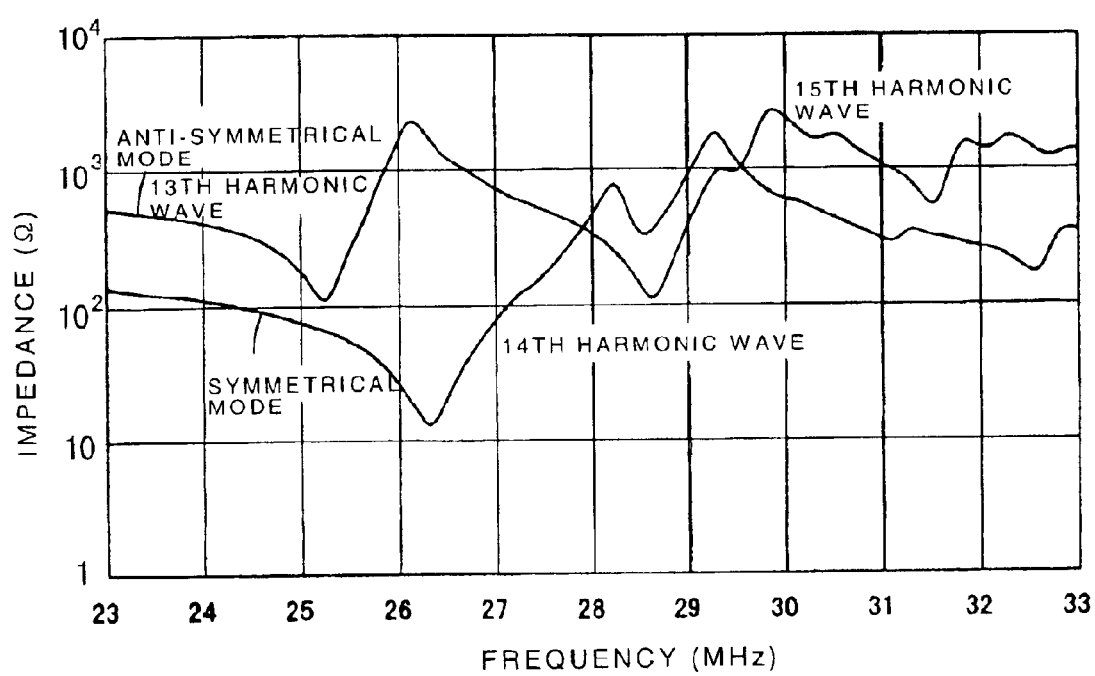
FIG. 37 shows a symmetrical mode and symmetrical mode of the multi-mode piezoelectric bulk wave filter of the sixth preferred embodiment of the present invention.

In the piezoelectric bulk wave filter 1, the thickness of the piezoelectric body between the side surfaces 2e as the third and fourth side surfaces of the piezoelectric body 2 is about 50 µm, the thickness D of the piezoelectric layer between the excitation electrodes connected to different potentials is about 60 µm, the length of the piezoelectric body 2 is about 880 µm, the coextending width of the excitation electrodes is about 260 µm, the height W of the piezoelectric body 2 between the top surface 2c and bottom surface 2d is about 620 µm, and the distance G between the end of each excitation electrode and one of the top surface 2c and bottom surface 2d is about 180 µm. Here, G/D=about 3.0, and G/W=about 0.29. FIG. 37 shows a symmetrical mode and a symmetrical mode of the multi-mode piezoelectric bulk wave filter 1 thus constructed. A 14th harmonic wave is strongly excited in the symmetrical mode, and 13th and 15th harmonic waves are strongly excited in the anti-symmetrical mode.

When the multi-mode piezoelectric bulk wave filter 1 in the first preferred embodiment is actually operated, the symmetrical mode and anti-symmetrical mode are coupled, thereby resulting filter characteristics of the multi-mode piezoelectric bulk wave filter 1. The filter characteristics of the multi-mode piezoelectric bulk wave filter 1 are shown in FIG. 42.

Referring to FIG. 37, responses on the 11th through 13th harmonic waves are close to each other. Filter characteristics having the 13th harmonic resonance frequency and 15th harmonic anti-resonance frequency as attenuation poles are thus obtained as shown in FIG. 42.

Figure 42:
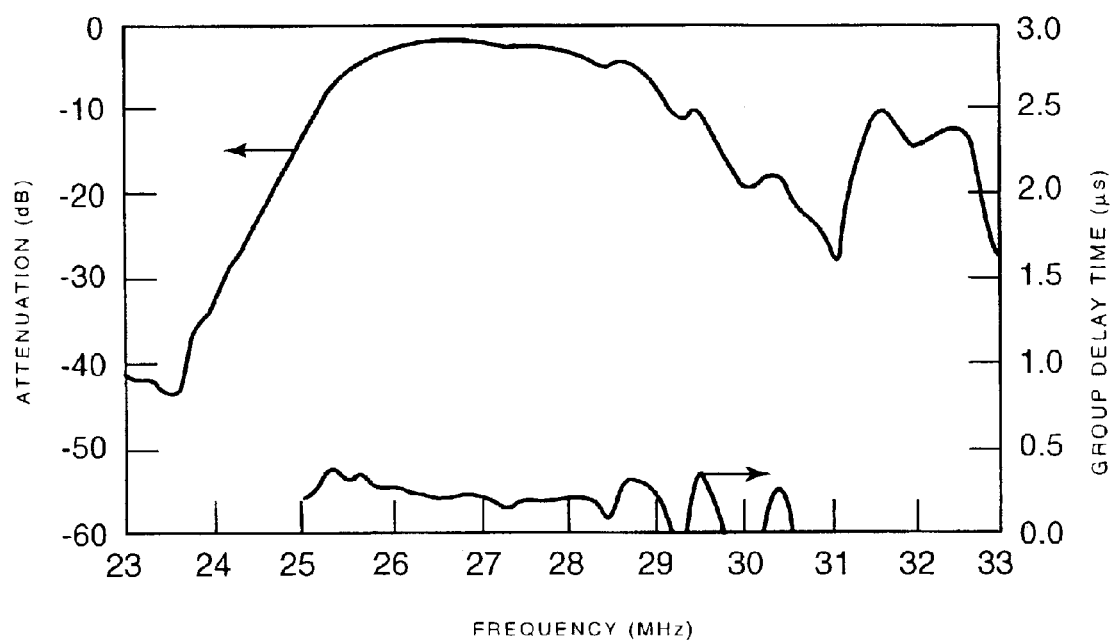
FIG. 42 shows filter characteristics of the multi-mode piezoelectric bulk wave filter with G/D=3.0.

As shown in FIG. 42, the sixth preferred embodiment results in filter characteristics having a bandwidth of about 4 MHz with the center frequency thereof at about 26.5 MHz.

In a conventional dual-mode piezoelectric bulk wave filter 201 (see FIG. 14), a frequency difference between a symmetrical mode and anti-symmetrical mode depends on the spacing between excitation electrodes 203 and 204 disposed on one surface of a piezoelectric substrate 202. In contrast, in the sixth preferred embodiment, the frequency difference between the 13th harmonic wave and 14th harmonic wave and the frequency difference between the 14th harmonic wave and 15th harmonic wave respectively depend on the ratios of orders of harmonic waves, and are independent of the spacing between the excitation electrodes. To achieve a desired bandwidth, the orders of harmonic corresponding to the bandwidth are simply selected. The desired bandwidth is thus easily achieved.

In the sixth preferred embodiment, 14 piezoelectric layers, each sandwiched between excitation electrodes connected to different potentials, are provided, and the 13th through 15th harmonic waves are efficiently excited. By changing the number of piezoelectric layers, three different orders of harmonic waves are excited. The triple-mode piezoelectric bulk wave filter is thus constructed.

Generally speaking, a triple-mode piezoelectric bulk wave filter is constructed using an N-th harmonic wave (N is an integer equal to or greater than 3), (N−1)-th harmonic wave, and (N+1)-th harmonic wave. A piezoelectric bulk wave filter with various bandwidths may be provided by selecting N.

In conventional dual-mode piezoelectric bulk wave filters, the precision of the excitation electrodes 203 and 204 must be increased to achieve a wide band. In the sixth preferred embodiment, a desired bandwidth or a wide bandwidth is easily achieved without implementing unnecessarily high precision in the excitation electrodes 3–18.

Attenuation in the piezoelectric bulk wave filter 1 depends on a ratio of a capacitance $C_{I-G}$ between the input electrode 19 and ground electrode 21 to a capacitance $C_{I-O}$ between the input electrode 19 and output electrode 20. The larger the ratio $C_{I-G}/C_{I-O}$, i.e., the smaller the capacitance $C_{I-O}$, the attenuation becomes greater. Since the excitation electrodes 10 and 11 connected to the ground electrode 21 are present between the excitation electrodes 3, 5, 7, and 9 connected to the input electrode 19, and the excitation electrodes 12, 14, 16, and 18 connected to the output electrode 20 in the sixth preferred embodiment, the capacitance $C_{I-O}$ is small. The out-of-band attenuation is thus increased. The attenuation is large compared with the conventional piezoelectric bulk wave filter 201.

The piezoelectric layers, each sandwiched between excitation electrodes connected to different potentials, preferably have the same thickness. However, it is not a requirement that the thicknesses of the piezoelectric are uniform in the filter. By making the thicknesses different, the excitation efficiency of the orders of the modes in use is increased, and the excitation efficiency of the orders of the modes becoming spurious is decreased.

Since the reflective layers 31 and 32 are respectively attached to the two end surfaces of the piezoelectric body 2 and the support members 33 and 34 are respectively attached to the reflective layers 31 and 32 in the piezoelectric bulk wave filter 1 of the sixth preferred embodiment, the piezoelectric bulk wave filter 1 is mechanically supported at the support members 33 and 34 thereof.

The reflective layers 31 and 32 are preferably made of a material having a second acoustic impedance $Z_2$ lower than an acoustic impedance $Z_1$ of the piezoelectric body 2. The support members 33 and 34 have a third acoustic impedance $Z_3$ higher than the second acoustic impedance $Z_2$. Vibrations transferred from the piezoelectric body 2 are reflected from the boundaries between the reflective layers 31 and 32 and the support members 33 and 34. In other words, vibration leakages to the support members 33 and 34 are almost completely controlled. Even if the support members 33 and 34 are mechanically supported, the filter characteristics of the piezoelectric bulk wave filter 1 are not adversely affected.

In the piezoelectric bulk wave filter 1 of the sixth preferred embodiment, the ratio G/D is equal to or greater than about 2.0 where G represents the distance between each of the ends of the excitation electrodes in the first and second group and the bottom surface 2d defining the second side surface, and the distance between each of the ends of the excitation electrodes in the third group and the top surface 2c defining the first side surface, and D represents the thickness of the piezoelectric layer between the excitation electrodes connected to different potentials. Excellent filter characteristics thus result.

The inventors of this invention have measured the filter characteristics with the dimensions G and D varied in the piezoelectric bulk wave filter 1, and have discovered that a large spurious component appears in the passband depending on the ratio of G/D. For example, the inventors have discovered that the spurious components are controlled when the ratio G/D is equal to or greater than about 2.

FIGS. 38–41 show filter characteristics obtained from the piezoelectric bulk wave filter 1 of the sixth preferred embodiment with the ratio G/D set to be approximately 1.0, 1.5, 2.0, and 2.5, respectively. FIG. 42 shows filter characteristics obtained from the piezoelectric bulk wave filter 1 of the sixth preferred embodiment with the ratio G/D set to be about 3.0.

Figure 38:
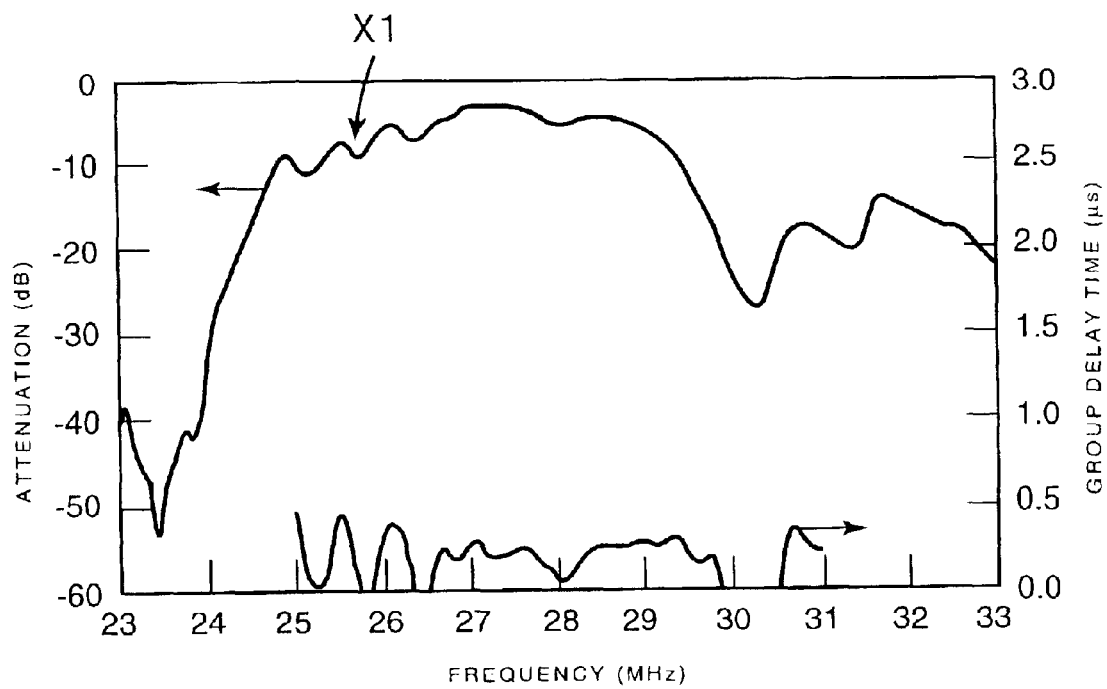
FIG. 38 shows filter characteristics of the multi-mode piezoelectric bulk wave filter with G/D=1.0.
Figure 39:
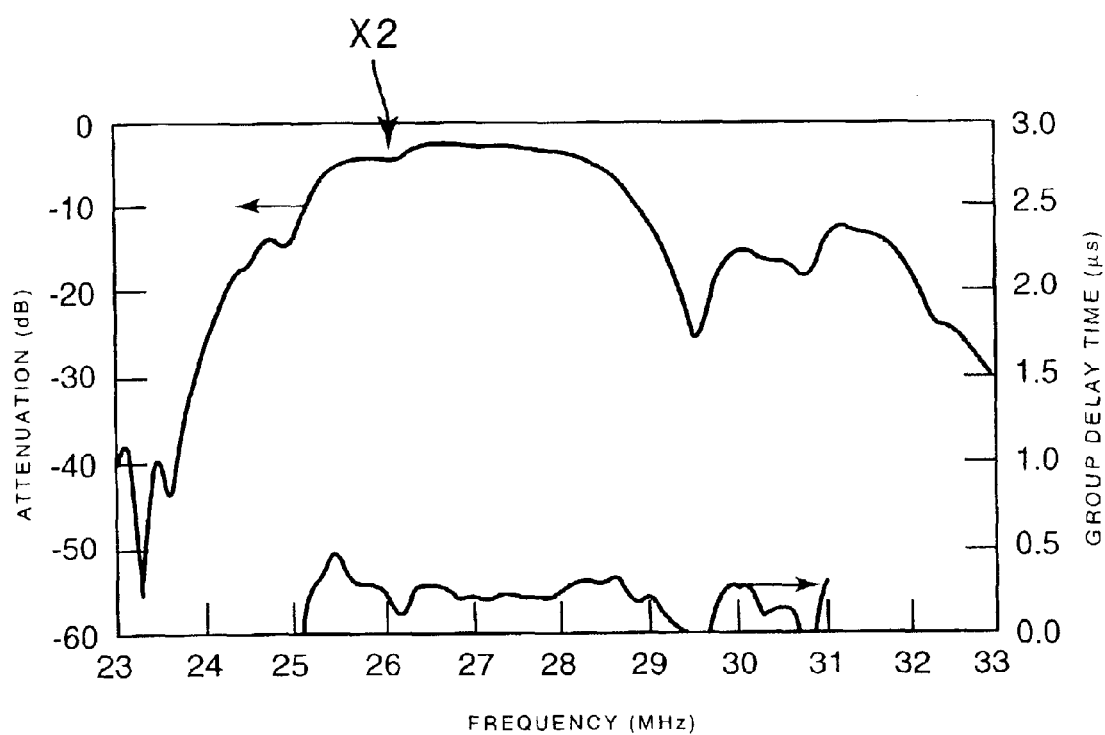
FIG. 39 shows filter characteristics of the multi-mode piezoelectric bulk wave filter with G/D=1.5.
Figure 40:
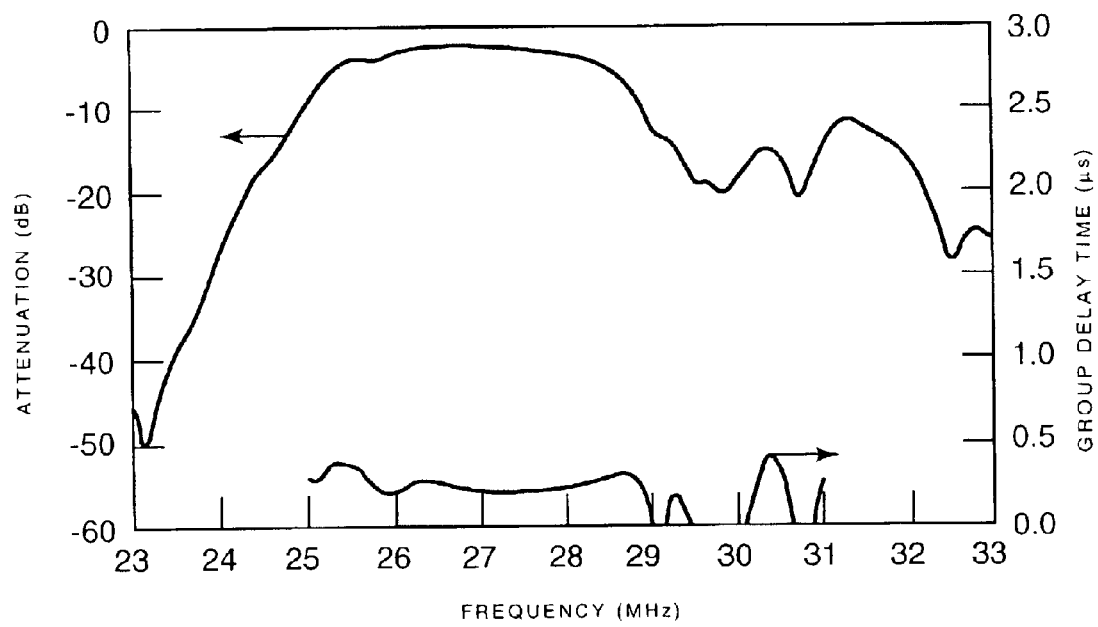
FIG. 40 shows filter characteristics of the multi-mode piezoelectric bulk wave filter with G/D=2.0.
Figure 41:
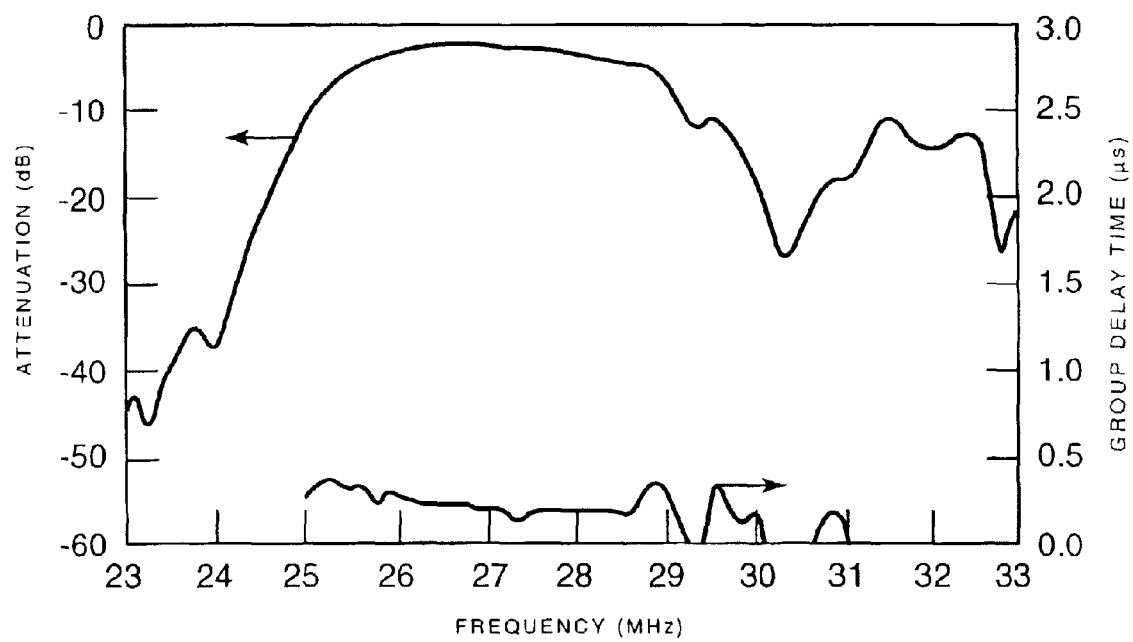
FIG. 41 shows filter characteristics of the multi-mode piezoelectric bulk wave filter with G/D=2.5.
Figure 43A:
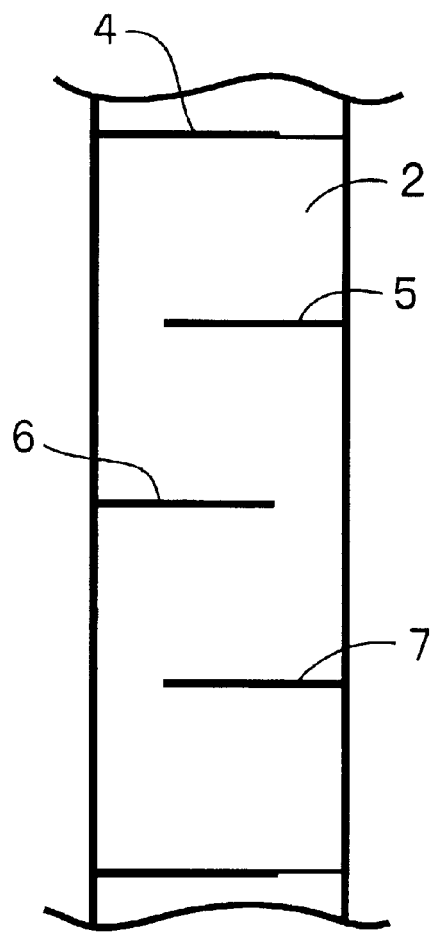
FIG. 43A is a cross-sectional view diagrammatically explaining a vibration configuration, namely, a harmonic wave of a flexing vibration mode which can be a problem in the multi-mode piezoelectric bulk wave filter of the sixth preferred embodiment.
Figure 43B:
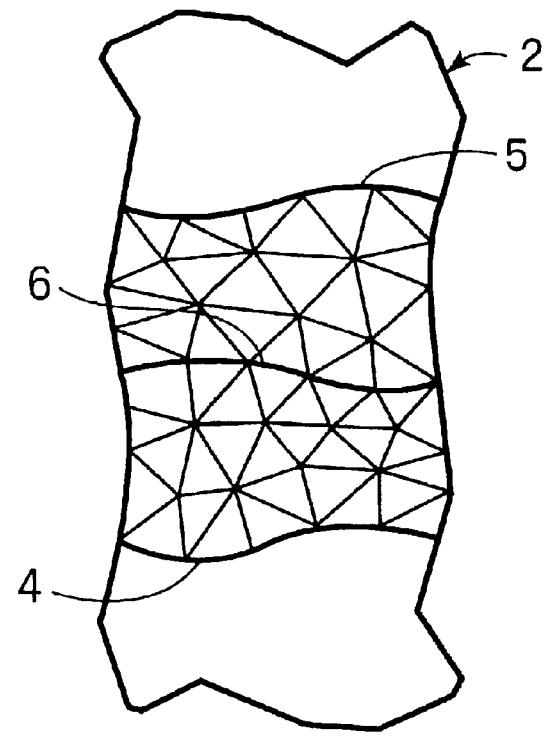
FIG. 43B shows a vibration configuration of a harmonic wave of the flexing vibration mode analyzed using the finite element method.

Large spurious components represented by arrows X1 and X2 appear in the passband in the filter characteristics of FIGS. 38 and 39. No such large spurious components appear in the passband in the filter characteristics shown in FIGS. 40–42 with the ratio G/D equal to about 2.0 or larger. The inventors of the invention have examined the results using the finite element method, and have discovered that harmonic waves of the flexing vibration mode are generated with the ratio G/D set to be about 1.0 as shown in FIGS. 43A and 43B with a large spurious component appearing in the passband. FIG. 43A diagrammatically shows a portion of the piezoelectric bulk wave filter 1. With the ratio G/D set to be about 1.0 or smaller, the piezoelectric body 2 is vibrated on a harmonic wave of the flexing vibration mode as shown in FIG. 43B, thereby suffering from spurious vibrations.

Figure 44:
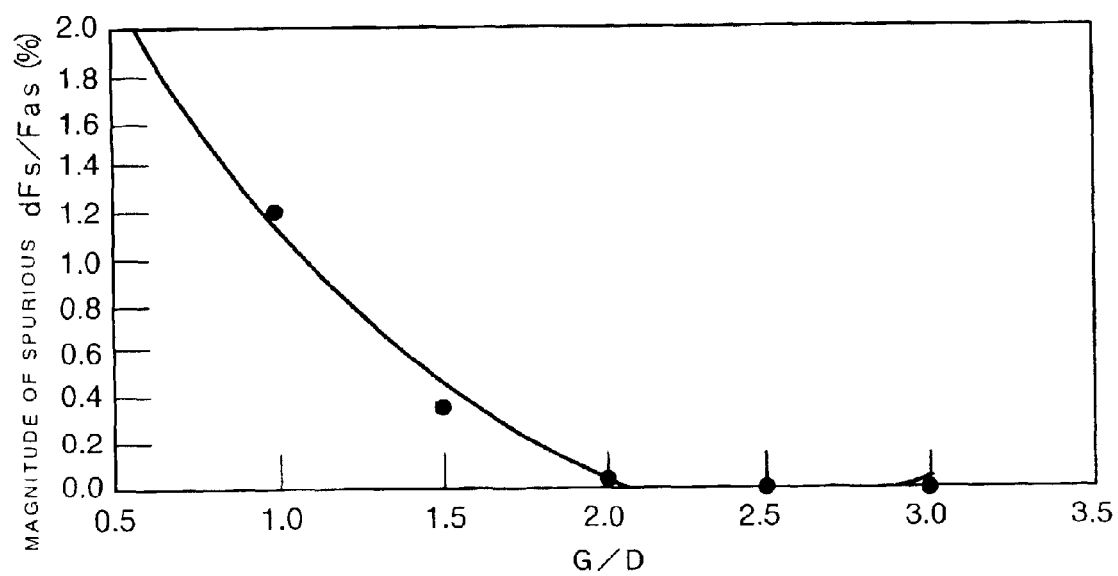
FIG. 44 shows a change in the magnitude of the spurious components appearing in the passband of the filter with G/D varied.

FIG. 44 shows the results of FIGS. 38–41 in a different plot. As shown, the abscissa represents the ratio G/D, and the ordinate represents the magnitude of spurious components dFs/Fas (%) appearing in the passband. Here, dFs represents a different between the resonance frequency and anti-resonance frequency of the spurious component, and Fas represents the anti-resonance frequency of the spurious component. As shown, the spurious component within the passband is effectively controlled with the ratio G/D set to be about 2.0 or greater.

Specifically, the spurious component is generated due to the harmonic waves of the flexing vibration because electric fields are generated between the excitation electrodes 3–18, ends of the excitation electrodes 3–18, input electrode 19, output electrode 20, and ground electrode 21. With the ratio G/D set to be about 2.0 or greater, the spurious component is effectively controlled.

Figure 45:
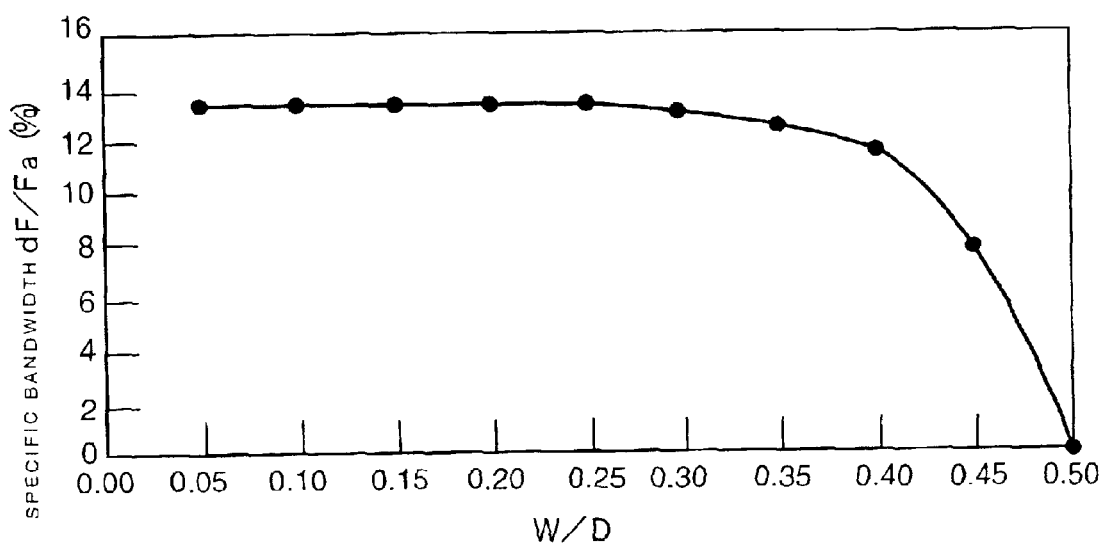
FIG. 45 shows variations in specific bandwidth with G/W varied.

The inventors of this invention have produced the piezoelectric bulk wave filter 1 with the dimension W between the top surface 2c and bottom surface 2d of the piezoelectric body 2 being varied. A specific bandwidth dF/Fa (%) is measured for a plurality of piezoelectric bulk wave filters 1. Here, dF represents a different between the anti-resonance frequency and resonance frequency of a 14th harmonic wave of the piezoelectric bulk wave filter 1, and Fa represents the anti-resonance frequency. FIG. 45 shows the results of measurements. As shown, the specific bandwidth is sharply narrowed when a ratio G/W rises above approximately 0.4. In preferred embodiments of the present invention, the ratio G/W is preferably equal to or smaller than about 0.4.

Stray capacitances occur between the excitation electrodes 3–18, and the input electrode 19, output electrode 20, and ground electrode 21, each having a different potential in the piezoelectric bulk wave filter 1, and reduces the specific bandwidth. The reduction in the specific bandwidth is controlled by reducing the ratio G/W below approximately 0.4.

If the ratio G/D is set to be equal to or greater than about 2.0, and if the ratio G/W is set to be equal to or smaller than about 0.4, a piezoelectric bulk wave filter with the spurious component within the passband controlled and with a sufficient specific bandwidth is thus provided.

The multi-mode piezoelectric bulk wave filter of preferred embodiments of the present invention may use a harmonic wave of a vibration mode other than the length vibration. For example, a harmonic wave of the thickness longitudinal vibration mode may be used. The present invention is applicable to an energy trapped multi-mode piezoelectric bulk wave filter.

Figure 46:
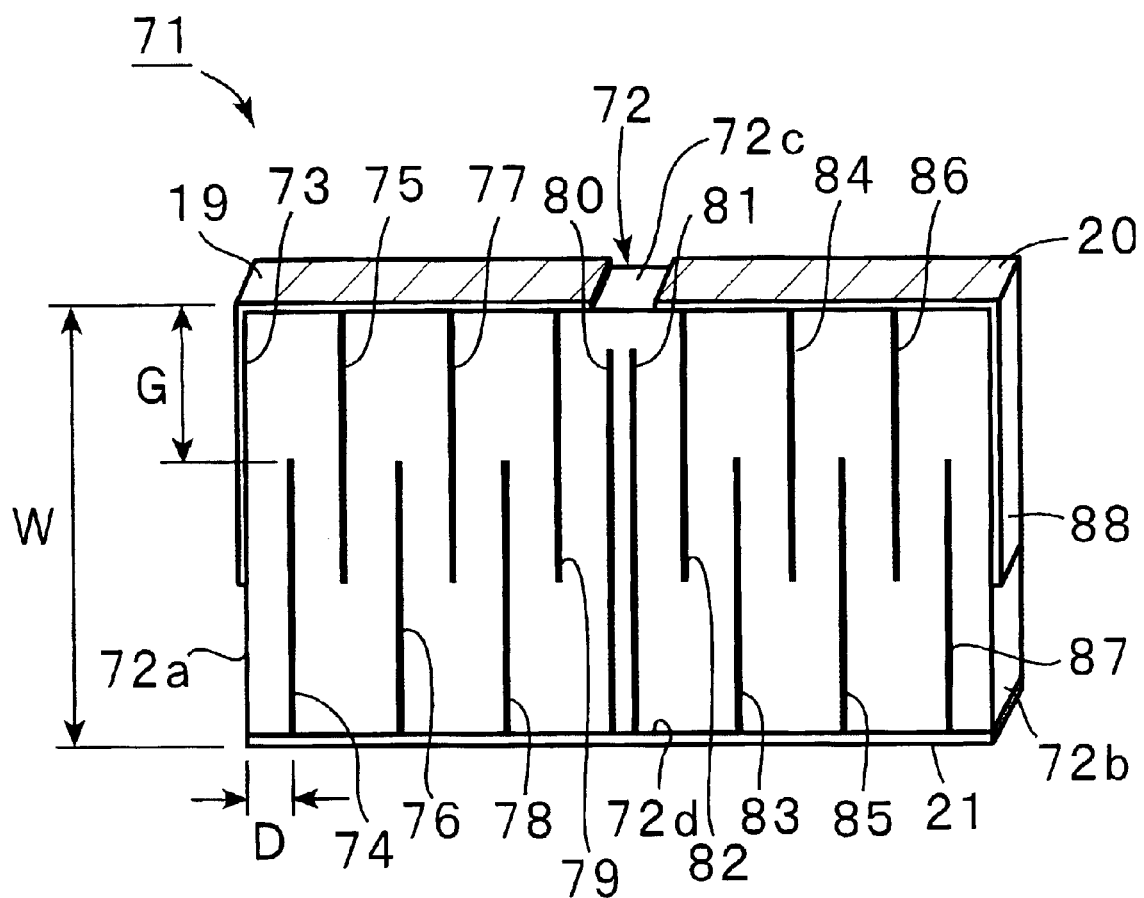
FIG. 46 is a perspective view of the multi-mode piezoelectric bulk wave filter in accordance with a seventh preferred embodiment of the present invention.

FIG. 46 is a perspective view of the energy trapped multi-mode piezoelectric bulk wave filter 71 in accordance with a seventh preferred embodiment.

The piezoelectric bulk wave filter 71 includes a laminated piezoelectric body 72 into which a plurality of excitation electrodes 73–88 are laminated with piezoelectric layers sandwiched therebetween. As in the sixth preferred embodiment, the piezoelectric body is preferably made of a piezoelectric ceramic such as a lead-zirconate-titanate ceramic, or other suitable material.

Figure 47:
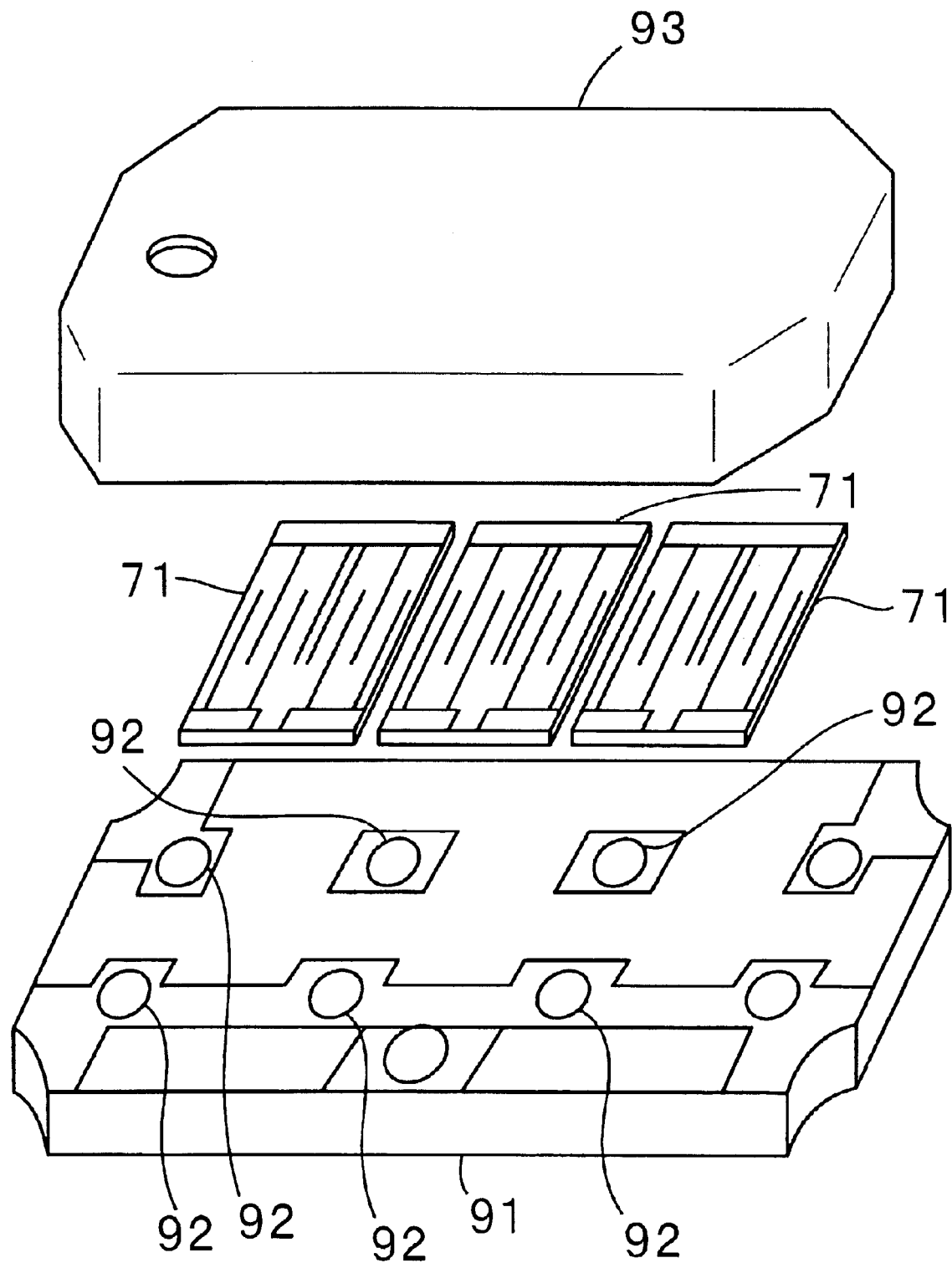
FIG. 47 is an exploded perspective view of an electronic component including the multi-mode piezoelectric bulk wave filter of the seventh preferred embodiment mounted on a casing substrate.

In the laminated piezoelectric body 72, the direction of lamination of the excitation electrodes 73–88, namely, the horizontal direction in FIG. 47, is the direction of length. The excitation electrode 73 is disposed on one end surface of 72a of the laminated piezoelectric body 72, and the excitation electrode 88 is disposed on the other end surface 72b. The remaining excitation electrodes 74–87 are internally arranged.

In the seventh preferred embodiment, the end surfaces 72a and 72b face in directions that are substantially perpendicular to the excitation electrodes 73–88, and respectively constitute the first and second end surfaces in the present preferred embodiment of the present invention.

An input electrode 19 is disposed on the top surface 72c closer to the first end surface 72a, and an output electrode 20 is disposed on the top surface 72c closer to the second end surface 72b. A ground electrode 21 is disposed on the bottom surface 72d.

Each piezoelectric layer sandwiched between the excitation electrodes connected to different potentials in the piezoelectric body 2 is polarized in a direction that is substantially perpendicular to the excitation electrode.

When an input signal is applied between the input electrode 19 and the ground electrode 21 in the seventh preferred embodiment, the piezoelectric bulk wave filter 71 is strongly excited on 13th, 14th, and 15th harmonic waves of the thickness longitudinal vibration.

The 13th, 14th, and 15th harmonic waves are coupled, thus forming a wide passband.

The seventh preferred embodiment provides a longitudinally-coupled triple-mode piezoelectric bulk wave filter which uses the thickness longitudinal movement based on the piezoelectric longitudinal effect. The seventh preferred embodiment uses vibration modes different from those in the first and second preferred embodiments. However, as in the sixth preferred embodiment, the seventh preferred embodiment couples harmonic waves of different orders, thereby providing a wide bandwidth of the filter. In the seventh preferred embodiment as well, a desired bandwidth is easily achieved by making the harmonic waves in use different. Specifically, a desired harmonic wave is efficiently excited by adjusting the number of piezoelectric layers to be laminated. Piezoelectric bulk wave filters with different bandwidths are thus provided.

If the ratio G/D is set to be equal to or greater than about 2.0, spurious components within the passband are effectively controlled. If the ratio G/W is set to be equal to or smaller than about 0.4, a sufficient specific bandwidth is obtained.

A plurality of piezoelectric layers having different thicknesses from one to another is preferably used. A harmonic wave in use is efficiently excited, and the excitation efficiency of a harmonic wave of an order becoming a spurious component is reduced. An excellent filter thus results.

Two multi-mode piezoelectric bulk wave filters 1 of the first preferred embodiment may be serially connected to increase a high attenuation.

The piezoelectric bulk wave filter 71 is mechanically supported preferably without using the reflective layers and support members with the filter characteristics free from degradation. As shown in FIG. 47, the piezoelectric bulk wave filter 71 is mounted on a casing substrate 91 using an electrically conductive adhesive agent 92.

A cap member 93 is fixed to the casing substrate 91 with three piezoelectric bulk wave filters 71 mounted on the casing substrate 91 as shown in FIG. 47. The cap member 93 thus covers the three piezoelectric bulk wave filters 71.

The piezoelectric bulk wave filter 1 of the sixth preferred embodiment may also be encapsulated in the package including a casing substrate and cap member identical to those shown in FIG. 47. In this case, the piezoelectric bulk wave filter 1 is mechanically supported on the casing substrate using the support members 33 and 34.

When the input signal is applied to the longitudinally-coupled multi-mode piezoelectric bulk wave filter of preferred embodiments of the present invention, vibrations of different orders are excited and coupled on the laminated piezoelectric body, creating a filter passband. By adjusting the number of piezoelectric layers, various modes of different orders may be used. The filter characteristics with a wide bandwidth are easily obtained.

In the conventional dual-mode piezoelectric bulk wave filter, the frequency difference between the modes is determined by the spacing between the excitation electrodes disposed on one side of the piezoelectric substrate. To attain a wide bandwidth, the formation precision of the excitation electrodes must be significantly increased in conventional devices. In accordance with preferred embodiments of the present invention, a wideband feature is easily attained by simply selecting the modes in use.

If the spacing between the excitation electrodes disposed on the piezoelectric substrate is narrowed to attain a wideband in the conventional dual-mode piezoelectric bulk wave filter, the capacitance between the input and output electrode increases, and attenuation is decreased. The multi-mode piezoelectric bulk wave filter of preferred embodiments of the present invention eliminates the need to narrow the spacing between the excitation electrodes even when a wide band design is intended. A large attenuation is easily achieved.

Since the ratio T/D is preferably about 0.9 or smaller in preferred embodiments of the present invention, the modes of different orders are easily excited. The filter characteristics with an even wider bandwidth and with excellent selectivity are thus provided.

In accordance with preferred embodiments of the present invention, a multi-mode piezoelectric bulk wave filter with wide bandwidth and large attenuation is provided.

When the input is applied in the longitudinally-coupled multi-mode piezoelectric bulk wave filter of preferred embodiments of the present invention, the vibrations of the first through third modes are excited and coupled in the laminated piezoelectric body, thereby resulting in a passband. Since the order N of the mode is selected to satisfy the conditions $Fa(N-1) \geq Fr(N)$ and $Fa(N) \geq Fr(N+1)$, excellent filter characteristics having a wide bandwidth and free from unwanted ripples are provided.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A longitudinally-coupled multi-mode piezoelectric bulk wave filter comprising:
   at least four excitation electrodes extending substantially parallel to each other;
   a laminated piezoelectric body including a plurality of piezoelectric layers arranged between the excitation electrodes and polarized in a direction that is substantially perpendicular to or substantially parallel to the excitation electrodes, the laminated piezoelectric body having first and second end surfaces facing in a direction that is substantially perpendicular to the plurality of the piezoelectric layers and first through fourth side surfaces connecting the first and second end surfaces;
   an input electrode disposed on the first side surface of the laminated piezoelectric body closer to the first end surface;
   an output electrode disposed on the first side surface of the laminated piezoelectric body closer to the second end surface; and
   a ground electrode disposed on the second side surface of the laminated piezoelectric body opposite from the first side surface, wherein the plurality of excitation electrodes include a first group which is electrically connected to the input electrode, a second group which is electrically connected to the output electrode, and a third group which is electrically connected to the ground electrode;
   wherein when an input signal is input between the input electrode and the ground electrode, vibration modes of different orders are excited and coupled so that an output signal is output between the output terminal and the ground terminal; and
   wherein T/D is equal to or smaller than about 0.9 where T represents the dimension of the width between the opposed first and second side surfaces of the laminated piezoelectric body and D represents the distance between the adjacent excitation electrodes.

2. A longitudinally-coupled multi-mode piezoelectric bulk wave filter according to claim 1, wherein W/D is equal to or smaller than about 0.9 where W represents the dimension of the width between the third and fourth side surfaces of the laminated piezoelectric body.

3. A longitudinally-coupled multi-made piezoelectric bulk wave filter according to claim 2, wherein the dimension W falls within a range of about $1.7n-0.7 < W/D < $ about $1.7n+0.7$ where n is a positive integer.

4. A longitudinally-coupled multi-mode piezoelectric bulk wave filter according to claim 1, wherein the vibration modes of different orders are harmonic waves of a length vibration mode based on the piezoelectric longitudinal effect.

5. A longitudinally-coupled multi-mode piezoelectric bulk wave filter according to claim 1, wherein the vibration modes of different orders are harmonic waves of a thickness longitudinal vibration mode based on the piezoelectric longitudinal effect.

6. A longitudinally-coupled multi-mode piezoelectric bulk wave filter according to claim 1, further comprising:
reflective layers respectively attached to the first and second end surfaces of the laminated piezoelectric body, and made of a material having a second acoustic impedance $Z_2$ lower than an acoustic impedance $Z_1$ of a piezoelectric material used to form the laminated piezoelectric body; and
support members respectively attached to the surfaces of the reflective layers opposite from the surfaces thereof attached to the first and second end surfaces of the laminated piezoelectric body, and made of a material having a third acoustic impedance $Z_3$ higher than the second acoustic impedance $Z_2$.

7. An electronic component comprising:
a casing substrate;
a longitudinally-coupled multi-mode piezoelectric bulk wave filter according to claim 1 mounted on the casing substrate; and
a cap member secured to the casing substrate such that the cap covers the piezoelectric bulk wave filter.

8. A longitudinally-coupled multi-mode piezoelectric bulk wave filter comprising:
a piezoelectric body having opposed first and second end surfaces, and four side surfaces connecting the first and second end surfaces;
a plurality of excitation electrodes arranged in the piezoelectric body and being laminated with each other with piezoelectric layers interposed therebetween;
an input electrode disposed on an external surface of the laminated piezoelectric body closer to the first end surface;
an output electrode disposed on the external surface of the laminated piezoelectric body closer to the second end surface; and
a ground electrode disposed on the external surface of the laminated piezoelectric body;
wherein the plurality of excitation electrodes include a first group which is electrically connected to the input electrode, a second group which is electrically connected to the output electrode, and a third group which is electrically connected to the ground electrode;
wherein each first group excitation electrode and each third group excitation electrode are alternately arranged in the direction of lamination of the laminated piezoelectric body, and each second excitation electrode and each third excitation electrode are alternately arranged in the direction of lamination of the laminated piezoelectric body;
wherein when an input signal is applied between the input electrode and the ground electrode, first through third vibration modes of N-th order, (N−1)-th order, and (N+1)-th order (N is an integer equal to 3 or larger) are excited and coupled, and an output signal is output between the output electrode and the ground electrode; and
wherein relationships of Fa(N−1)≧Fr(N) and Fa(N)≧Fr(N+1) hold where Fa(N−1) represents an anti-resonance frequency of the first mode, Fr(N) and Fa(N) respectively represent a resonance frequency and an anti-resonance frequency of the second mode, and Fr(N+1) represents a resonance frequency of the third mode.

9. A longitudinally-coupled multi-mode piezoelectric bulk wave filter according to claim 8, wherein N of the N-th order satisfies the condition of N≧about −0.524$k_{33}$+42.7 where $k_{33}$ represents an electromechanical coefficient of the piezoelectric longitudinal effect.

10. A longitudinally-coupled multi-mode piezoelectric bulk wave filter according to claim 8, wherein N of the N-th order satisfies the condition of N≧about −1.73$S_{33}^{E}$+33.3 where $S_{33}^{E}$ represents an elastic compliance of the laminated piezoelectric body in the direction of polarization thereof.

11. A longitudinally-coupled multi-mode piezoelectric bulk wave filter according to claim 8, further comprising reflective layers which are respectively attached to the first and second end surfaces, and support members which are respectively attached to the reflective layers, wherein the reflective layers have an acoustic impedance $Z_2$ lower than each of an acoustic impedance $Z_1$ of the laminated piezoelectric body and an acoustic impedance $Z_3$ of the support members.

12. A longitudinally-coupled multi-mode piezoelectric bulk wave filter according to claim 8, wherein the vibration modes of different orders are harmonic waves of a length vibration mode based on the piezoelectric longitudinal effect.

13. A longitudinally-coupled multi-mode piezoelectric bulk wave filter according to claim 8, wherein the vibration modes of different orders are harmonic waves of a thickness longitudinal vibration mode based on the piezoelectric longitudinal effect.

14. An electronic component comprising:
a casing substrate;
a longitudinally-coupled multi-mode piezoelectric bulk wave falter according to claim 8 mounted on the casing substrate; and
a cap member secured to the casing substrate such that the cap covers the piezoelectric bulk wave filter.

15. A longitudinally-coupled multi-mode piezoelectric bulk wave filter comprising:
a piezoelectric body having opposed first and second end surfaces, and four side surfaces connecting the first and second end surfaces;
a plurality of excitation electrodes arranged in the piezoelectric body and being laminated with each other with piezoelectric layers interposed therebetween; and
an input electrode disposed on the first side surface of the laminated piezoelectric body closer to the first end surface, an output electrode disposed on the first side surface of the laminated piezoelectric body closer to the second end surface, and a ground electrode disposed on the second side surface of the laminated piezoelectric body opposed to the first side surface;
wherein the plurality of excitation electrodes include a first group which is electrically connected to the input electrode, a second group which is electrically connected to the output electrode, and a third group which is electrically connected to the ground electrode;
wherein each first group excitation electrode and each third group excitation electrode are alternately arranged in a direction extending between the first and second end surfaces, and each second excitation electrode and each third excitation electrode are alternately arranged in a direction extending between the first and second end surfaces;
wherein when an input signal is input between the input electrode and the ground electrode, vibration modes of different orders of harmonic waves are excited and coupled so that an output signal is output between the output terminal and the ground terminal; and wherein G/D is not smaller than about 2 where G represents the distance between each of the ends of the first and second group excitation electrodes and the first side surface and the distance between each of the ends of the third group excitation electrodes and the first side surface, and D represents the thickness of the piezoelectric layer between adjacent excitation electrodes.

16. A longitudinally-coupled multi-mode piezoelectric bulk wave filter according to claim 15, wherein G/W is equal to or smaller than about 0.4 wherein W represents the dimension of the width between the first and second side surfaces of the laminated piezoelectric body.

17. A longitudinally-coupled multi-mode piezoelectric bulk wave filter according to claim 15, wherein the vibration modes of different orders are harmonic waves of a length vibration mode based on the piezoelectric longitudinal effect.

18. A longitudinally-coupled multi-mode piezoelectric bulk wave filter according to claim 15, further comprising reflective layers which are respectively attached to the first and second end surfaces, and support members which are respectively attached to the reflective layers, wherein the reflective layers have an acoustic impedance $Z_2$ lower than each of an acoustic impedance $Z_1$ of the laminated piezoelectric body and an acoustic impedance $Z_3$ of the support members.

19. A longitudinally-coupled multi-mode piezoelectric bulk wave filter according to claim 15, wherein the vibration modes of different orders are harmonic waves of a thickness longitudinal vibration mode based on the piezoelectric longitudinal effect.

20. An electronic component comprising:

a casing substrate;

a longitudinally-coupled multi-mode piezoelectric bulk wave filter according to claim 15 mounted on the casing substrate; and a cap member secured to the casing substrate such that the cap covers the piezoelectric bulk wave filter.

* * * * *